United States Patent
Han et al.

(10) Patent No.: US 9,559,295 B2
(45) Date of Patent: Jan. 31, 2017

(54) NANO MULTILAYER FILM, FIELD EFFECT TUBE, SENSOR, RANDOM ACCESSORY MEMORY AND PREPARATION METHOD

(71) Applicant: INSTITUTE OF PHYSICS, CHINESE ACADEMY OF SCIENCES, Beijing (CN)

(72) Inventors: Xiu-Feng Han, Beijing (CN); Hou-Fang Liu, Beijing (CN); Syed Rizwan, Beijing (CN); Da-Lai Li, Beijing (CN); Peng Guo, Beijing (CN); Guo-Qiang Yu, Beijing (CN); Dong-Ping Liu, Beijing (CN); Yi-Ran Chen, Beijing (CN)

(73) Assignee: INSTITUTE OF PHYSICS, CHINESE ACADEMY OF SCIENCES, Beijing (CN)

( * ) Notice: Subject to any disclaimer, the term of this patent is extended or adjusted under 35 U.S.C. 154(b) by 65 days.

(21) Appl. No.: 14/345,655

(22) PCT Filed: Sep. 19, 2012

(86) PCT No.: PCT/CN2012/001283
§ 371 (c)(1),
(2) Date: Jul. 1, 2014

(87) PCT Pub. No.: WO2013/040859
PCT Pub. Date: Mar. 28, 2013

(65) Prior Publication Data
US 2014/0321199 A1 Oct. 30, 2014

(30) Foreign Application Priority Data

Sep. 19, 2011 (CN) .......................... 2011 1 0278414
Sep. 21, 2011 (CN) .......................... 2011 1 0290063
(Continued)

(51) Int. Cl.
*G11C 11/02* (2006.01)
*H01L 43/10* (2006.01)
(Continued)

(52) U.S. Cl.
CPC .............. *H01L 43/10* (2013.01); *G11C 11/161* (2013.01); *G11C 11/1675* (2013.01);
(Continued)

(58) Field of Classification Search
CPC ............... G11C 11/161; G11C 11/1675; G11C 13/0002; G11C 13/003; G11C 2213/53; H01L 43/00; H01L 43/10; H01L 43/08; H01L 27/22; H01L 27/224; H01F 10/32
(Continued)

(56) References Cited

U.S. PATENT DOCUMENTS 6,929,956 B2 *  8/2005  Kim .................. H01L 21/02197
                                           257/E21.01
8,189,370 B2 *  5/2012  Hayakawa .............. G11C 11/15
                                           365/145
(Continued)

FOREIGN PATENT DOCUMENTS

CN      1964074 A      5/2007
CN      102129863 A    7/2011
(Continued)

OTHER PUBLICATIONS

Resistive RAM: A Novel Generation Memory Technology (Yuan Wang et al., Acta Scientiarum Naturalium Universitatis Pekinensis, vol. 47, No. 3 (May 2011)).
(Continued)

*Primary Examiner* — Han Yang
*Assistant Examiner* — Xiaochun L Chen
(74) *Attorney, Agent, or Firm* — CKC & Partners Co., Ltd.

(57) ABSTRACT

A nano multilayer film of electrical field modulation type, a field effect transistor of electrical field modulation type, an
(Continued)

electrical field sensor of switch type, and a random access memory of electrical field drive type can obtain an electro-resistance effect in an electrical field modulation multilayer film at room temperature. The nano multilayer film includes in succession from bottom to top a bottom layer, a substrate, a bottom layer, a functional layer, a buffer layer, an insulation layer, a conductive layer, and a cap layer. The buffer layer and the insulation layer can be selectively added as required when the conductive layer is made of a magnetic metal. The effect of influencing and changing the conductivity of the metal layer and thus adjusting the change in the resistance of the devices can obtain different resistance states corresponding to different electrical fields and achieving an electro-resistance effect.

13 Claims, 41 Drawing Sheets

(30) Foreign Application Priority Data

Sep. 26, 2011 (CN) .......................... 2011 1 0304805
Sep. 26, 2011 (CN) .......................... 2011 1 0304812
Sep. 30, 2011 (CN) .......................... 2011 1 0305257

(51) Int. Cl.
*H01L 43/08* (2006.01)
*G11C 13/00* (2006.01)
*G11C 11/16* (2006.01)
*H01L 27/22* (2006.01)
*H01L 43/02* (2006.01)
*H01F 10/32* (2006.01)
*H01F 10/193* (2006.01)

(52) U.S. Cl.
CPC ........ *G11C 13/0002* (2013.01); *G11C 13/003* (2013.01); *G11C 13/0069* (2013.01); *H01F 10/3218* (2013.01); *H01L 27/22* (2013.01); *H01L 27/224* (2013.01); *H01L 43/02* (2013.01); *H01L 43/08* (2013.01); *G11C 2213/51* (2013.01); *G11C 2213/52* (2013.01); *G11C 2213/53* (2013.01); *G11C 2213/55* (2013.01); *H01F 10/193* (2013.01); *H01F 10/1936* (2013.01); *H01F 10/3272* (2013.01); *H01L 27/228* (2013.01)

(58) Field of Classification Search
USPC .......................................... 365/158
See application file for complete search history.

(56) References Cited

U.S. PATENT DOCUMENTS

| | | | |
|---|---|---|---|
| 9,007,820 B2* | 4/2015 | Bibes | H01L 43/08 365/158 |
| 2007/0240995 A1 | 10/2007 | Odagawa et al. | |
| 2010/0080048 A1* | 4/2010 | Liu | G11C 11/16 365/157 |
| 2010/0208515 A1* | 8/2010 | Aoki | B82Y 25/00 365/171 |
| 2011/0134689 A1* | 6/2011 | Hayakawa | G11C 11/15 365/171 |
| 2014/0043895 A1* | 2/2014 | Bibes | H01L 43/08 365/171 |

FOREIGN PATENT DOCUMENTS

| | | |
|---|---|---|
| CN | 102487124 A | 6/2012 |
| CN | 102593129 A | 7/2012 |
| CN | 102593141 A | 7/2012 |
| CN | 102709470 A | 10/2012 |
| WO | 2008111274 A1 | 9/2008 |

OTHER PUBLICATIONS

Reversible and Reproducible Giant Universal Electroresistance Effect (Syed Rizwan et al, Chin. Phys. Lett. vol. 28, No. 10 (2011) 107504).

* cited by examiner

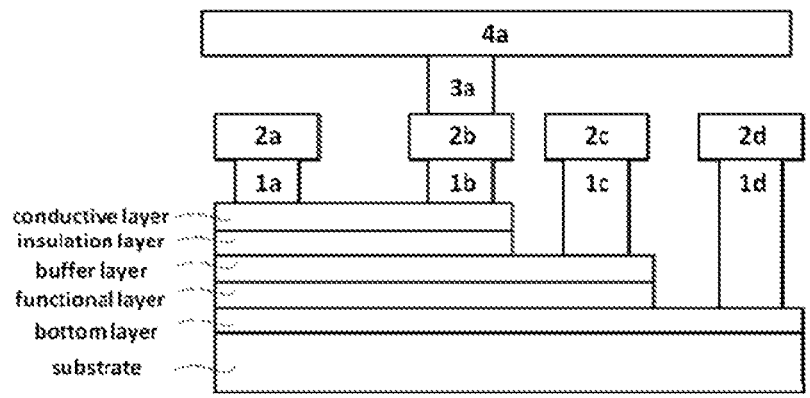
Figure 5A1
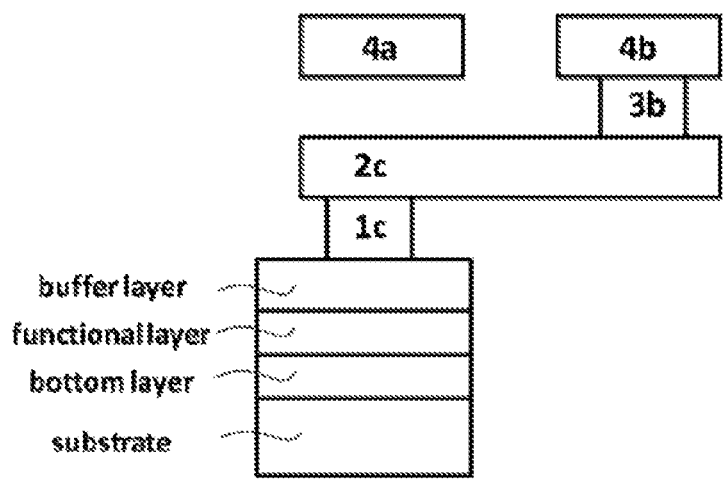
Figure 5A2
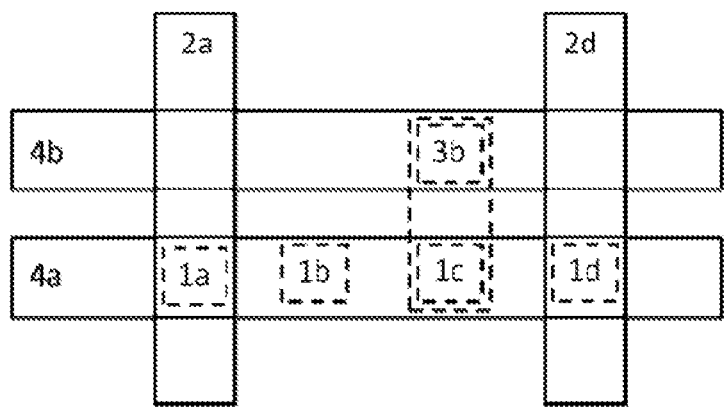
Figure 5A3

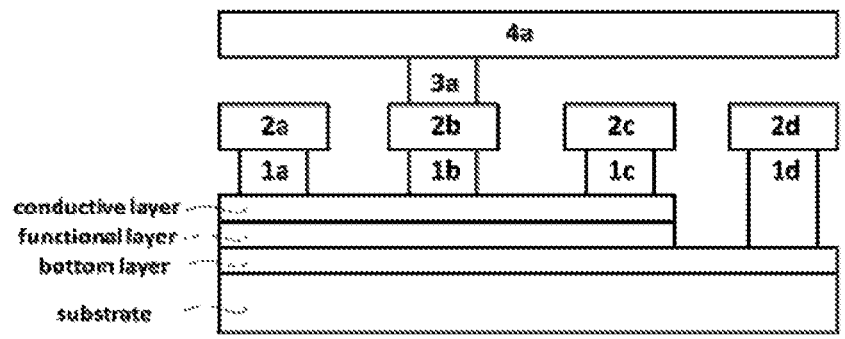
Figure 5B1
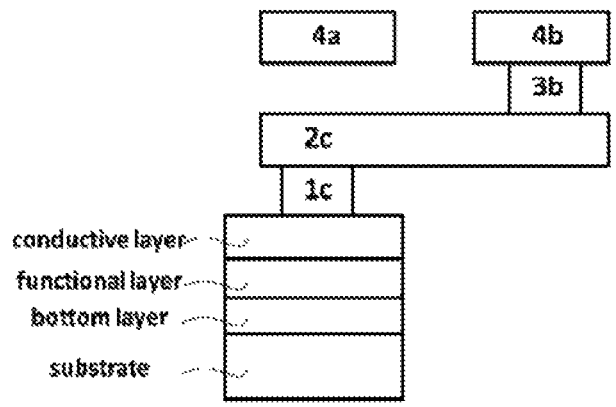
Figure 5B2
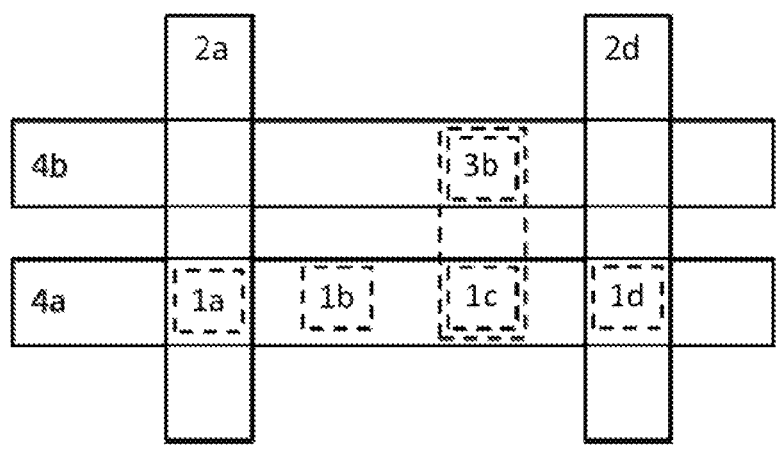
Figure 5B3

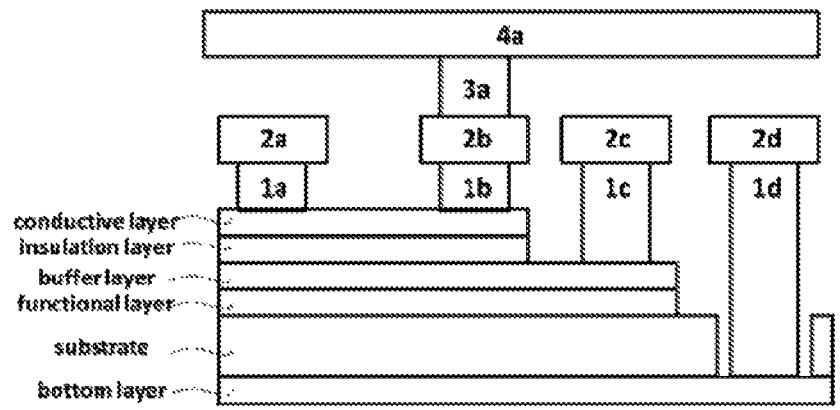
Figure 5C1
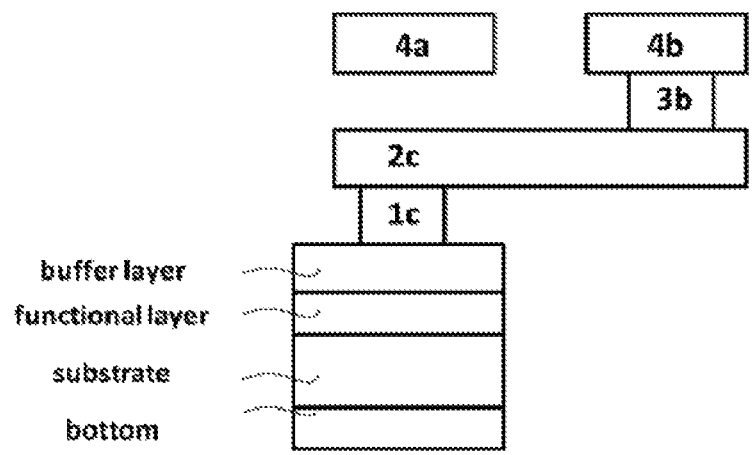
Figure 5C2
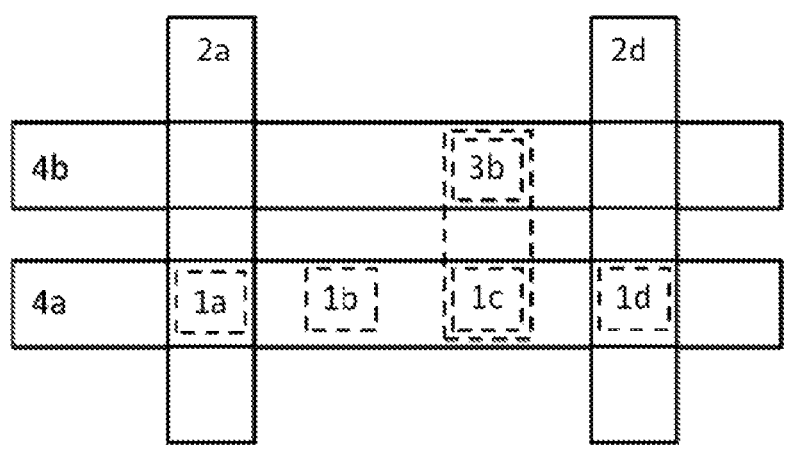
Figure 5C3

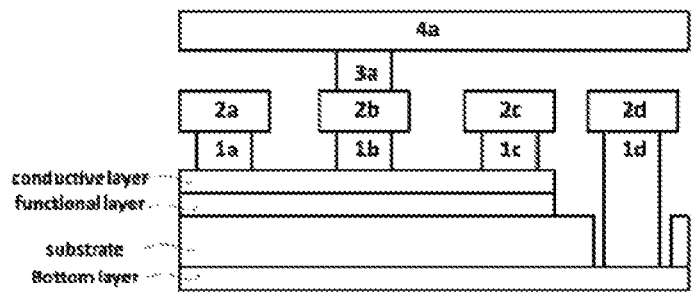
Figure 5D1
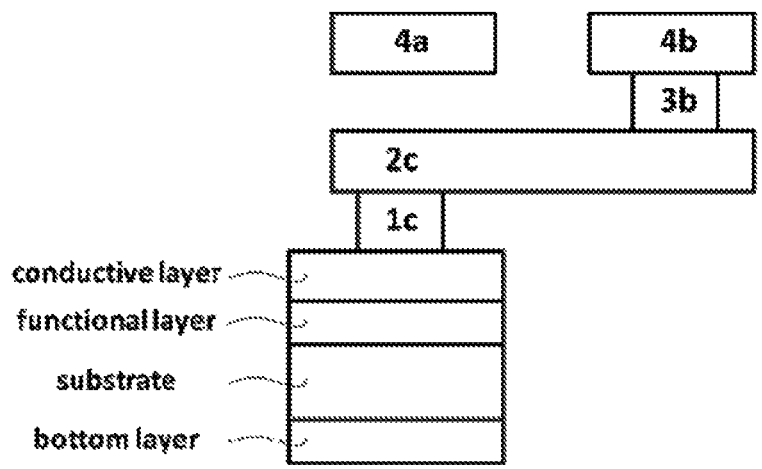
Figure 5D2
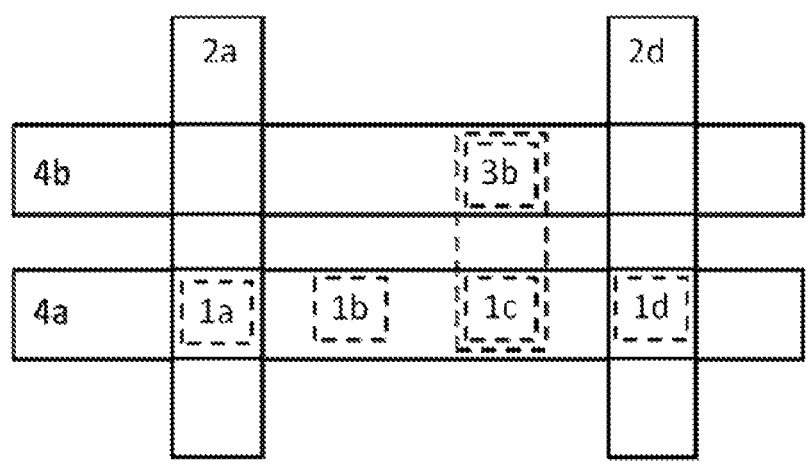
Figure 5D3

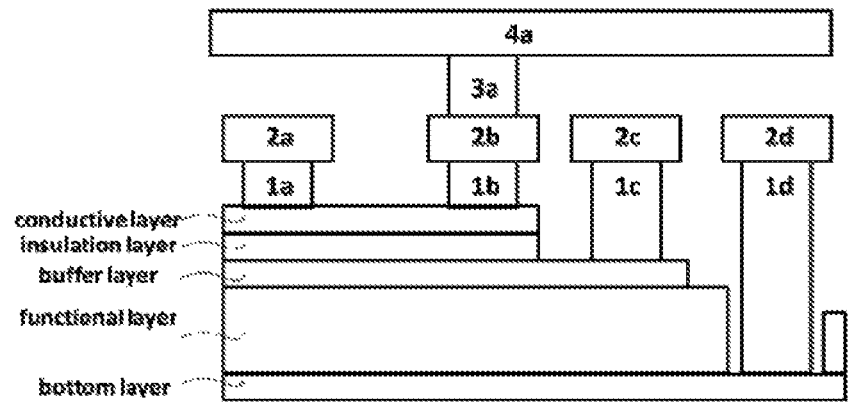
Figure 5E1
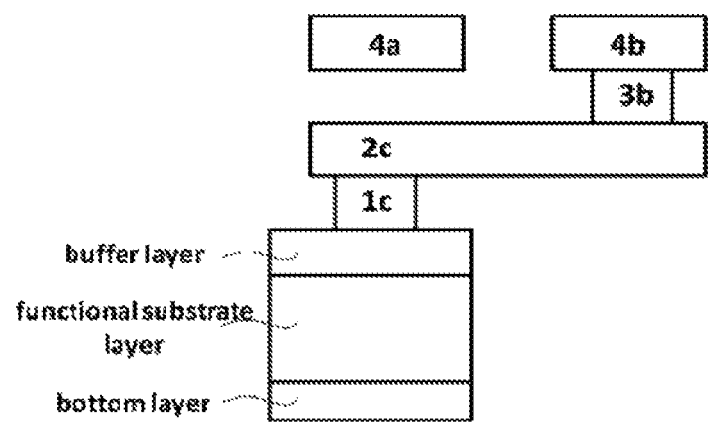
Figure 5E2
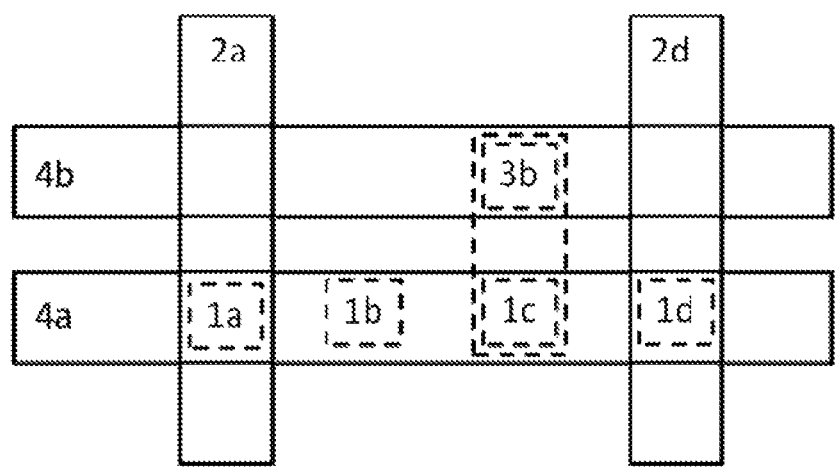
Figure 5E3

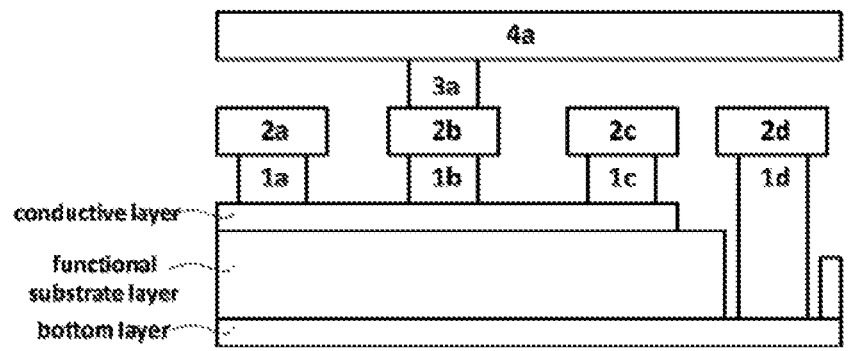
Figure 5F1
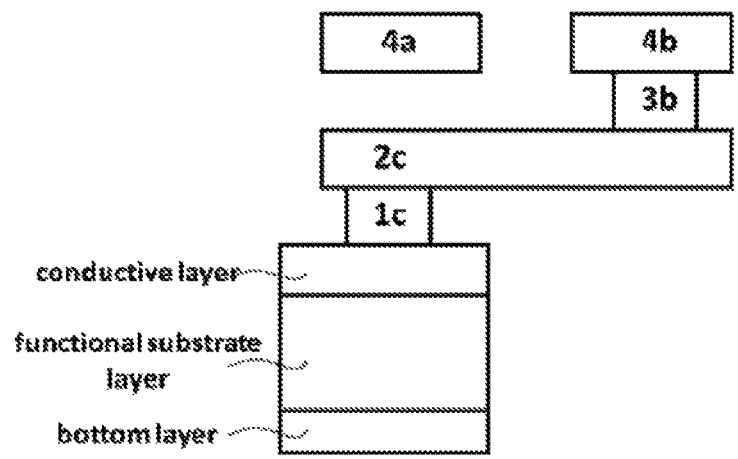
Figure 5F2
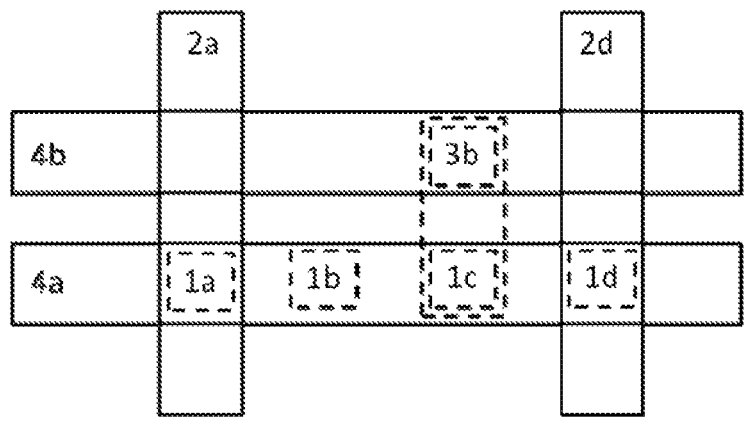
Figure 5F3

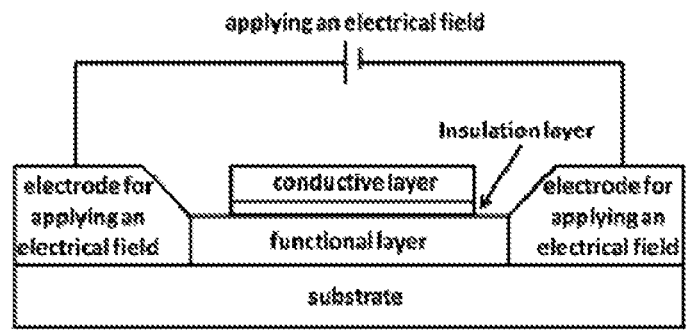
Figure 5G1
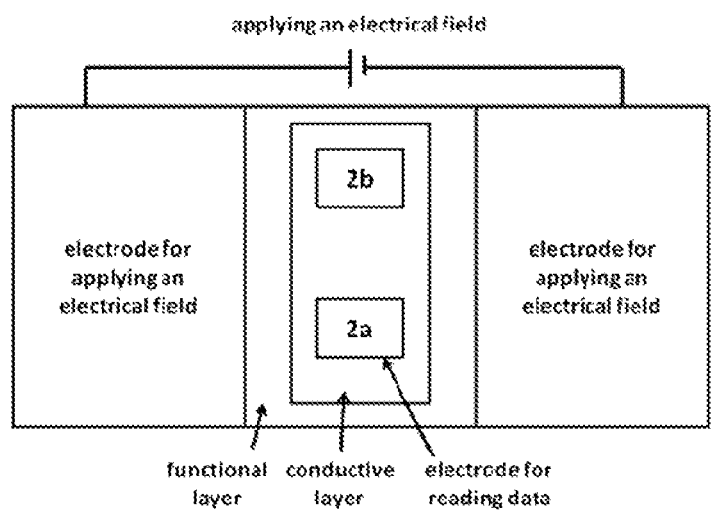
Figure 5G2
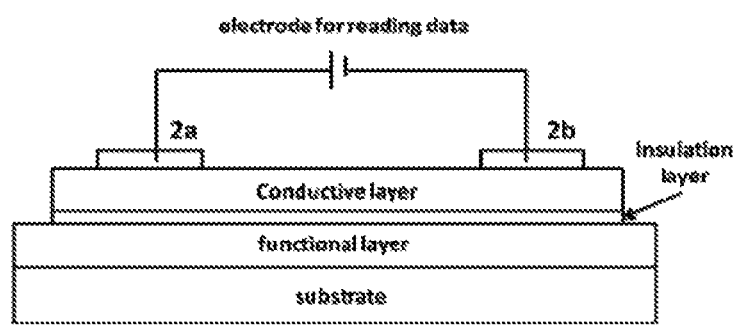
Figure 5G3

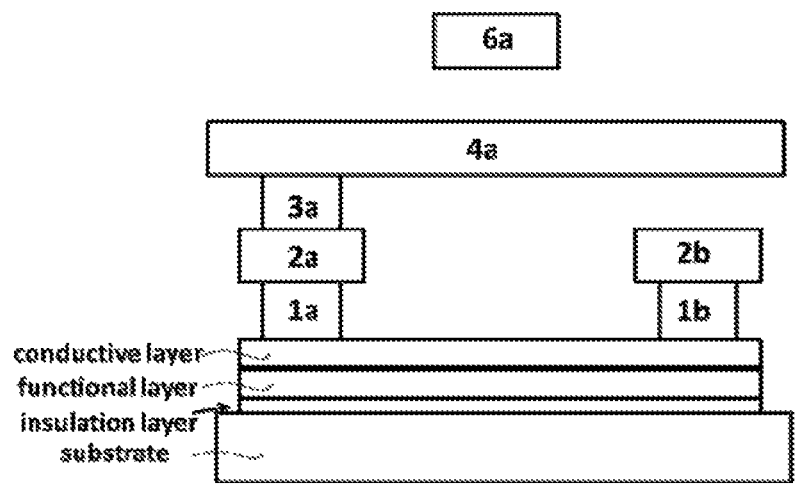
Figure 5G4
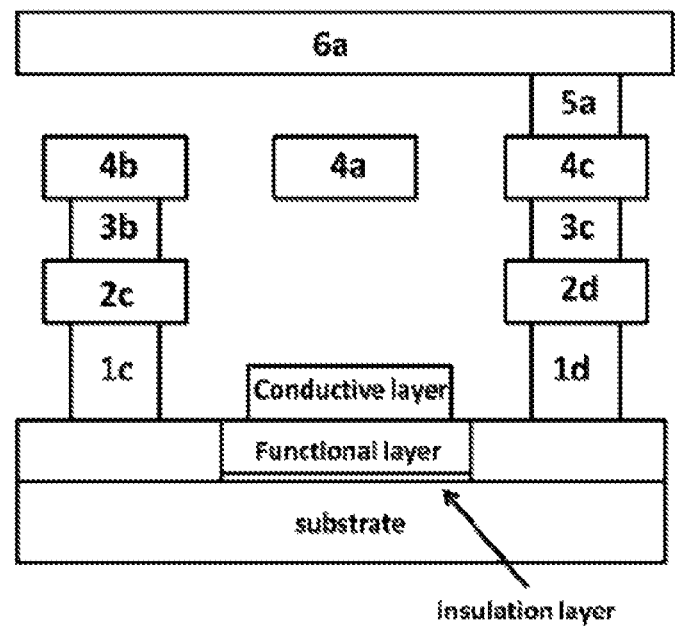
Figure 5G5
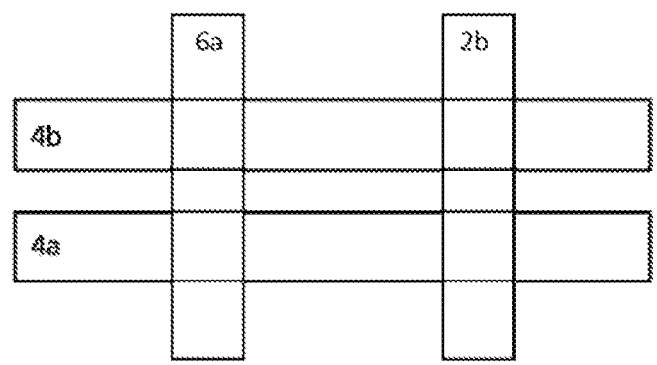
Figure 5G6

NAND logic

| Initial output logic C | Input A | Input B | Output C | After logic operation |
|---|---|---|---|---|
| C=1 | 0 | 0 | 1 | FFL / CL / FPL |
| | 0 | 1 | 1 | FFL / CL / FPL |
| | 1 | 0 | 1 | FFL / CL / FPL |
| | 1 | 1 | 0 | FFL / CL / FPL |

Figure 15B1

NOR logic

| Initial output logic C | Input A | Input B | Output C | After logic operation |
|---|---|---|---|---|
| C=0 ↓FFL CL ↓FPL | 0 | 0 | 1 | ↓FFL CL ↓FPL |
| | 0 | 1 | 0 | ↑FFL CL ↓FPL |
| | 1 | 0 | 0 | ↑FFL CL ↓FPL |
| | 1 | 1 | 0 | ↑FFL CL ↑FPL |

Figure 15B2

NOR logic

| Initial output logic C | Input A | Input B | Output C | After logic operation |
|---|---|---|---|---|
| C=0 ↓FFL CL ↑FPL | 0 | 0 | 1 | ↓FFL CL ↓FPL |
| | 0 | 1 | 0 | ↓FFL CL ↑FPL |
| | 1 | 0 | 0 | ↓FFL CL ↑FPL |
| | 1 | 1 | 0 | ↑FFL CL ↑FPL |

Figure 15B3

NOR logic

| Initial output logic C | Input A | Input B | Output C | After logic operation |
|---|---|---|---|---|
| C=0 | 0 | 0 | 1 | |
| | 0 | 1 | 0 | |
| | 1 | 0 | 0 | |
| | 1 | 1 | 0 | |

Figure 15B4

NOR logic

| Initial output logic state D | Input A | Input B | Input C | Output D | After logic operation |
|---|---|---|---|---|---|
| D=0 <br> ↑ FFL <br> CL <br> ↓ FPL | 0 | 0 | 0 | 1 | ↓ FFL <br> CL <br> ↓ FPL |
| | 0 | 1 | 0 | 0 | ↑ FFL <br> CL <br> ↓ FPL |
| | 1 | 0 | 0 | 0 | ↑ FFL <br> CL <br> ↓ FPL |
| | 1 | 1 | 0 | 0 | ↓ FFL <br> CL <br> ↓ FPL |

Figure 16B1

NOR logic

| Initial output logic state D | Input A | Input B | Input C | Output D | After logic operation |
|---|---|---|---|---|---|
| D=0 <br> ↓ FFL <br> CL <br> ↑ FPL | 0 | 0 | 0 | 1 | ↓ FFL <br> CL <br> ↓ FPL |
| | 0 | 1 | 0 | 0 | ↓ FFL <br> CL <br> ↑ FPL |
| | 1 | 0 | 0 | 0 | ↓ FFL <br> CL <br> ↑ FPL |
| | 1 | 1 | 0 | 0 | ↓ FFL <br> CL <br> ↑ FPL |

Figure 16B2

NOR logic

| Initial output logic state D | Input A | Input B | Input C | Output D | After logic operation |
|---|---|---|---|---|---|
| D=0 | 0 | 0 | 0 | 1 | |
| | 0 | 1 | 0 | 0 | |
| | 1 | 0 | 0 | 0 | |
| | 1 | 1 | 0 | 0 | |

Figure 16B3

NAND logic

| Initial output logic state D | Input A | Input B | Input C | Output D | After logic operation |
|---|---|---|---|---|---|
| D=1 | 0 | 0 | 1 | 1 | |
| | 0 | 1 | 1 | 1 | |
| | 1 | 0 | 1 | 1 | |
| | 1 | 1 | 1 | 0 | |

Figure 16B4

NAND logic
| Initial output logic state D | Input A | Input B | Input C | Output D | After logic operation |
|---|---|---|---|---|---|
| D=1  | 0 | 0 | OFF | 1 |  |
| | 0 | 1 | OFF | 1 |  |
| | 1 | 0 | OFF | 1 |  |
| | 1 | 1 | OFF | 0 | 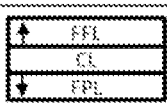 |
Figure 16B5
NOR logic
| Initial output logic state D | Input A | Input B | Input C | Output D | After logic operation |
|---|---|---|---|---|---|
| D=0  | 0 | 0 | OFF | 1 | 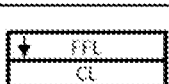 |
| | 0 | 1 | OFF | 0 |  |
| | 1 | 0 | OFF | 0 | 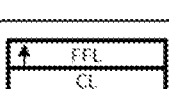 |
| | 1 | 1 | OFF | 0 |  |
Figure 16B6

NAND logic

| Initial output logic state C | Input A | Input B | Output C | After logic operation |
|---|---|---|---|---|
| C=1 | 0 | 0 | 1 | |
| | 0 | 1 | 1 | |
| | 1 | 0 | 1 | |
| | 1 | 1 | 0 | |

NAND logic
| Initial output logic C | Input A | Input B | Output C | After logic operation |
|---|---|---|---|---|
| C=1  | 0 | 0 | 1 |  |
| | 0 | 1 | 1 | 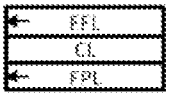 |
| | 1 | 0 | 1 |  |
| | 1 | 1 | 0 | 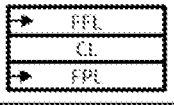 |
Figure 18B1
NOR logic
| Initial output logic C | Input A | Input B | Output C | After logic operation |
|---|---|---|---|---|
| C=0  | 0 | 0 | 1 |  |
| | 0 | 1 | 0 | 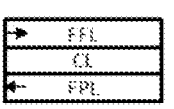 |
| | 1 | 0 | 0 |  |
| | 1 | 1 | 0 | 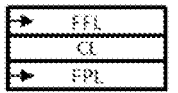 |
Figure 18B2

NOR logic
| Initial output logic C | Input A | Input B | Output C | After logic operation |
|---|---|---|---|---|
| C=0 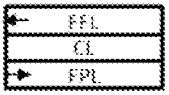 | 0 | 0 | 1 | 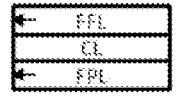 |
| | 0 | 1 | 0 | 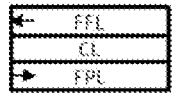 |
| | 1 | 0 | 0 | 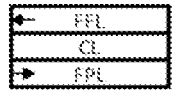 |
| | 1 | 1 | 0 | 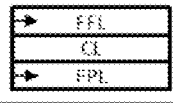 |
Figure 18B3
NOR logic
| Initial output logic C | Input A | Input B | Output C | After logic operation |
|---|---|---|---|---|
| C=0  | 0 | 0 | 1 | 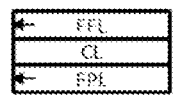 |
| | 0 | 1 | 0 | 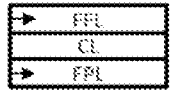 |
| | 1 | 0 | 0 | 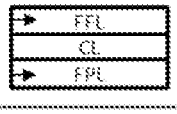 |
| | 1 | 1 | 0 |  |
Figure 18B4

NOR logic

| Initial output logic state D | Input A | Input B | Input C | Output D | After logic operation |
|---|---|---|---|---|---|
| D=0 ← FFL CL → FPL | 0 | 0 | 0 | 1 | ← FFL CL ← FPL |
| | 0 | 1 | 0 | 0 | → FFL CL ← FPL |
| | 1 | 0 | 0 | 0 | → FFL CL ← FPL |
| | 1 | 1 | 0 | 0 | → FFL CL ← FPL |

Figure 19B1

NOR logic
| Initial output logic state D | Input A | Input B | Input C | Output D | After logic operation |
|---|---|---|---|---|---|
| D=0 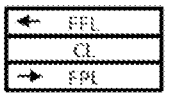 | 0 | 0 | 0 | 1 | 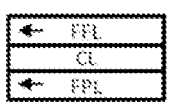 |
| | 0 | 1 | 0 | 0 | 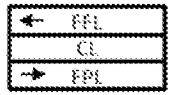 |
| | 1 | 0 | 0 | 0 | 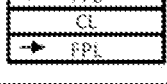 |
| | 1 | 1 | 0 | 0 |  |
Figure 19B2
NOR logic
| Initial output logic state D | Input A | Input B | Input C | Output D | After logic operation |
|---|---|---|---|---|---|
| D=0  | 0 | 0 | 0 | 1 | 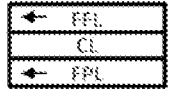 |
| | 0 | 1 | 0 | 0 |  |
| | 1 | 0 | 0 | 0 | 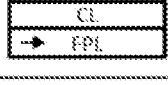 |
| | 1 | 1 | 0 | 0 |  |
Figure 19B3

NAND logic

| Initial output logic state D | Input A | Input B | Input C | Output D | After logic operation |
|---|---|---|---|---|---|
| D=1 | 0 | 0 | 1 | 1 | ← FFL / CL / ← FPL |
| | 0 | 1 | 1 | 1 | ← FFL / CL / ← FPL |
| | 1 | 0 | 1 | 1 | ← FFL / CL / ← FPL |
| | 1 | 1 | 1 | 0 | → FFL / CL / → FPL |

Figure 19B4

NAND logic

| Initial output logic state D | Input A | Input B | Input C | Output D | After logic operation |
|---|---|---|---|---|---|
| D=1 | 0 | 0 | OFF | 1 | ← FFL / CL / ← FPL |
| | 0 | 1 | OFF | 1 | ← FFL / CL / ← FPL |
| | 1 | 0 | OFF | 1 | ← FFL / CL / ← FPL |
| | 1 | 1 | OFF | 0 | → FFL / CL / ← FPL |

NAND logic
| Initial output logic state C | Input A | Input B | Output C | After logic operation |
|---|---|---|---|---|
| C=1  | 0 | 0 | 1 | 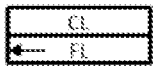 |
| | 0 | 1 | 1 |  |
| | 1 | 0 | 1 | 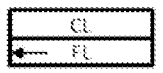 |
| | 1 | 1 | 0 |  |
Figure 20B1
NOR logic
| Initial output logic state C | Input A | Input B | Output C | After logic operation |
|---|---|---|---|---|
| C=0  | 0 | 0 | 1 |  |
| | 0 | 1 | 0 |  |
| | 1 | 0 | 0 | 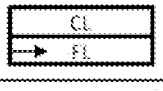 |
| | 1 | 1 | 0 | 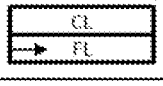 |
Figure 20B2

NANO MULTILAYER FILM, FIELD EFFECT TUBE, SENSOR, RANDOM ACCESSORY MEMORY AND PREPARATION METHOD

CROSS-REFERENCE TO RELATED APPLICATION

This application is a continuation of International application No. PCT/CN2012/001283, filed on Sep. 19, 2012 which claims the benefits of priority of CN application No. 2011110278414.7 filed on Sep. 19, 2011, and CN application No. 201110290063.1 filed on Sep. 21, 2011 and CN application No. 201110304812.1 filed on Sep. 26, 2011 and CN application No. 201110304805.1 filed on Sep. 26, 2011 and CN application No. 201110305257.4 filed on Sep. 30, 2011 the content of which are incorporated herein by reference.

TECHNICAL FIELD

The present invention pertains to the field of ferroelectric or multi-ferric materials, and specifically, relates to a multilayer film driven by electrical field presenting a reversible electroresistance (ER) effect, a preparation method and application thereof, a random access memory cell array of electrical field modulation type, and a random access memory of electrical field modulation type; a complementary field effect tube (FET) controlled by electrical field and having a reversible ER effect, wherein the logic circuits including basic NOT gates, NAND gates, NOR gates and various other circuits formed by the combinations thereof, and a ferroelectric or multi-ferric material-based nano multilayer film logic device having a reversible ER effect.

BACKGROUND

The resistance of a material significantly changes under an external electrical field. This is called the ER effect, which is presented by a characteristic resistance-electrical field curve. Owing to this effect, the resistance of a material can be regulated and controlled by modulating the external electrical field. In case of a positive or negative external electrical field, the resistance of the material is at a high- or low-resistance state. The high-resistance and low-resistance states of the ER effect correspond exactly to the two states, "0" and "1", of electronic information. For this reason, such an ER effect can be used to develop many electronic devices, such as field effect tubes of electrical field modulation type, electrical field sensors of switch type, electrical field type logic devices, and an electric-field-switching random access memory (ERAM), and other electronic devices. When ER is varying linearly but slowly, the resistance varies proportionally to the external electrical field and, accordingly, can be used in the production of amplifiers in digitally controlled potentiometers and analog circuits. (Reference: S. Rizwan and X. F. Han* et al., CPL Vol. 28, No. 10, (2011) 107504). Generally speaking, such effect should be ascribed to the influence of an asymmetric potential distribution of not completely shielded electric charges, this charge distribution is generated the interface, makes an impact on electronic conductance or tunneling conductance. Therefore, an ERAM based on such an ER effect is different from a Phase-change Random Access Memory (PCRAM) based on a phase-change theory, different from a Ferroelectric Random Access Memory (FeRAM) based on the capacitance effect of a ferroelectric film, and also different from a Resistance Random Access Memory (RRAM) based on various metal oxide films as storage medium units, that is regulated and controlled by the conductance filament channel mechanism thereof.

Currently, due to their electric-field-regulatable spontaneous electrical polarization and other unique physical properties, ferroelectric materials have gradually become an important research direction in the researches on non-volatile random access memory materials. However, the most important aspect is the resistive switching caused by an electrical polarization switching in the ferroelectric tunneling junction. Due to the unique electrical polarization properties of ferroelectric materials with a perovskite structure, their uses in non-volatile memories, pyroelectric detectors, sensors of switch type and other micro electro-mechanical devices have gradually aroused researcher's attention again.

Patent publication CN 102129863 A discloses a patent entitled "Spin valve structure with electrical field-adjustable magnetoresistance and preparation process thereof". In this patent, the anti-ferromagnetic layer used in a traditional spin valve is replaced with a multi-ferric material, and the magnetic moment direction of the pinning layer is changed by applying an electrical field. Because the directions of magnetic moments of the pinning layer and the free layer are different, conduction electrons in different spin directions are subjected to different scatterings, thereby resulting in a change in resistance state. The shortcoming is that a traditional spin valve with a giant magnetoresistance structure is used, yet such a structure is complex; the change in resistance state with the change in the external magnetic field results mainly from an asymmetric potential distribution caused by a giant magnetoresistance effect rather than the interface charges. Experimental results measured in this way are not obvious, not to mention the low magnetoresistance (MR) and poor stability. Patent WO 2008/111274 A1 discloses a patent entitled "LAMINATE STRUCTURE ON SEMICONDUCTOR SUBSTRATE". This patent mainly introduces the use of monocrystalline $\gamma\text{-}Al_2O_3$ as a buffer layer to optimize the crystallographic texture of a PZT material; however, this patent does not set forth the change in resistance that is caused by the change of the applied electrical field.

SUMMARY

To solve the above-mentioned problems, it is an object of the present invention to present a nano multilayer film of electrical field modulation type, a field effect tube of electrical field modulation type, an electrical field sensor of switch type and a random access memory of electrical field drive type, as well as preparation methods thereof.

It is an object of the present invention to provide a novel memory cells array of electrical field modulation type as well as a random access memory, wherein said memory comprises a novel memory cells array of electrical field modulation type and the corresponding read/write circuit, and can speed up data writing and increase the reliability of data writing.

It is an object of the present invention to, by using stepped electroresistance, provide an electrical field controlled FET having a complementary property and the logic circuits thereof, which include an inverter, a NAND gate and a NOR gate as well as various circuits formed by the combinations of these basic logic circuits.

It is an object of the present invention to provide a control circuit of the electric-field-controlled FET, and the logic circuits thereof, including basic circuits of an inverter, a NAND gate and a NOR gate as well as various circuits formed by the combinations of these basic logic circuits.

It is an object of the present invention to make an addressing table in a field programmable gate array (FPGA) by using said two FETs.

It is another object of the present invention to prepare ferroelectric or multi-ferroic material-based nano multilayer films having a reversible ER effect into a logic device, and to achieve logic functions.

The above objects of the present invention are achieved by the following technical solution.

To achieve the above objects, the present invention provides a nano multilayer film of electrical field modulation type comprising in succession from bottom to top: a bottom layer; a substrate; a buffer layer; an insulating barrier layer; a conductive layer; and a cap layer;

wherein, the bottom layer is of a conductive material and which, as a lower electrode, is used for applying an electrical field onto a ferroelectric or multi-ferric material; the substrate is of a ferroelectric or multi-ferric material and can alter and regulate the intensity and the direction of electrical polarization under the action of an electrical field; the buffer layer, as an upper electrode, is used for applying an electrical field onto the ferroelectric or multi-ferric material; the intermediate insulating barrier layer is of an oxide; the cap layer, as a protective layer, prevents the oxidation of the intermediate conductive layers; an electrical field is applied between the bottom layer and the buffer layer (the upper and the lower electrodes), and because of the changes in the intensity and the direction of electrical polarization of the substrate (of a ferroelectric or multi-ferric material), the in-plane conductivity between the neighboring conductive layers is influenced and changed, so as to obtain different resistance states corresponding to different electrical fields, thereby achieving a reversible ER effect;

wherein, the bottom layer of the nano multilayer film comprises a conductive metal material;

wherein, the conductive layer of the nano multilayer film comprises a non-magnetic metal layer, a magnetic metal layer, an antiferromagnetic layer, a conductive polymer material, a topological insulator material, a conductive semiconductor doped material, or the like;

wherein, the non-magnetic metal layer of the nano multilayer film consists of a non-magnetic metal or an alloy thereof, with a thickness of 2 to 100 nm; the magnetic metal layer is made of a magnetic metal or an alloy thereof, with a thickness of 2 to 100 nm, or made of a diluted magnetic semiconductor material or a semi-metallic material, with a thickness of 2 to 100 nm; the magnetic metal layer comprises a directly or indirectly pinning structure, the directly pinning structure comprising an antiferromagnetic/ferromagnetic layer, and the indirectly pinning structure comprising an antiferromagnetic layer/a first ferromagnetic layer/a non-magnetic metal layer/a second ferromagnetic layer;

wherein, the antiferromagnetic layer is made of an antiferromagnetic material, which comprises an antiferromagnetic alloy or oxide;

wherein, the ferromagnetic layer, the first ferromagnetic layer and the second ferromagnetic layer of the nano multilayer film are made of a ferromagnetic metal or an alloy thereof, with a thickness of 2 to 100 nm, or made of a diluted magnetic semiconductor material or a semi-metallic material, with a thickness of 2 to 100 nm;

wherein, the cap layer of the nano multilayer film comprises a monolayer or multilayer film made of a not readily oxidizable metal material, with a thickness of 2 to 200 nm.

Moreover, the present invention provides a nano multilayer film of electrical field modulation type comprising in succession from bottom to top: a substrate; a bottom layer; a functional layer; a buffer layer; an insulating barrier layer; conductive layers; and a cap layer;

wherein, the bottom layer is of a conductive material and which, as a lower electrode, is used for applying an electrical field onto a ferroelectric or multi-ferric material; the functional layer is a ferroelectric or multi-ferric film which can alter and regulate the intensity and the direction of electrical polarization under the action of an electrical field; the buffer layer, as an upper electrode, is used for applying an electrical field onto the ferroelectric or multi-ferric film material; the intermediate insulating barrier layer is of an oxide; the cap layer, as a protective layer, prevents the oxidation of the intermediate conductive layers; an electrical field is applied between the bottom layer and the buffer layer (the upper and the lower electrodes), and because of the changes in the intensity and the direction of electrical polarization of the functional layer (of a ferroelectric or multi-ferric material), the in-plane conductivity between the neighboring conductive layers is influenced and changed, so as to obtain different resistance states corresponding to different electrical fields, thereby achieving a reversible ER effect;

wherein, the substrate of the nano multilayer film comprises a Si substrate, SiC, a glass substrate or Si—$SiO_2$ substrate, a MgO monocrystalline substrate, an $Al_2O_3$ monocrystalline substrate, an organic flexible substrate, or the like.

wherein, the bottom layer of the nano multilayer film comprises a conductive metal material.

wherein, the functional layer of the nano multilayer film comprises a ferroelectric or multi-ferric nano-film, which can deposit a seed layer in advance as required for optimizing an interface with the substrate and improving the crystalline structure of the ferroelectric or multi-ferric nano-film;

wherein, the conductive layer of the nano multilayer film grows on the material of the insulating barrier layer, and its conductivity can be regulated by the intensity and the direction of electrical polarization of the ferroelectric or multi-ferric film in the bottom via electrical polarization interaction or magnetoelectric coupling effect;

wherein, the conductive layers of the nano multilayer film comprise a non-magnetic metal layer, a magnetic metal layer, an antiferromagnetic layer, a conductive polymer material, a topological insulator material, a conductive semiconductor doped material, or the like;

wherein, the non-magnetic metal layer of the nano multilayer film consists of a non-magnetic metal or an alloy thereof, with a thickness of 2 to 100 nm; the magnetic metal layer is made of a magnetic metal or an alloy thereof, with a thickness of 2 to 100 nm, or made of a diluted magnetic semiconductor material or a semi-metallic material, with a thickness of 2 to 100 nm; the magnetic metal layer comprises a directly or indirectly pinning structure, with the directly pinning structure comprising an antiferromagnetic/ferromagnetic layer and the indirectly pinning structure comprising an antiferromagnetic layer/a first ferromagnetic layer/a non-magnetic metal layer/a second ferromagnetic layer;

wherein, the antiferromagnetic layer of the nano multilayer film is made of an antiferromagnetic material, which comprises an antiferromagnetic alloy or oxide;

wherein, the ferromagnetic layer, the first ferromagnetic layer and the second ferromagnetic layer of the nano multilayer film are made of a ferromagnetic metal or an alloy thereof, with a thickness of 2 to 100 nm, or made of a diluted magnetic semiconductor material or a semi-metallic material, with a thickness of 2 to 100 nm;

wherein, the cap layer of the nano multilayer film comprises a monolayer or multilayer film made of a not readily oxidable metal material, with a thickness of 2 to 200 nm.

Furthermore, the present invention provides a nano multilayer film of electrical field modulation type, which comprises in succession from bottom to top: a substrate; a bottom layer; a functional layer; a magnetic layer; and a cap layer;

wherein, the substrate is of a non-ferroelectric or multiferric material; the bottom layer is of a conductive material and which, as a lower electrode, is used for applying an electrical field onto the functional layer; the functional layer is a ferroelectric or multi-ferric film which can alter and regulate the intensity and the direction of electrical polarization under the action of an electrical field; the cap layer, as an upper electrode and a protective layer, prevents the oxidation of the intermediate magnetic layer; an electrical field is applied between the bottom layer and the cap layer (the upper and the lower electrodes), and because of the changes in the intensity and the direction of electrical polarization of the functional layer (a ferroelectric or multiferric material), the in-plane conductivity between the neighboring metal and magnetic layers is influenced and changed, so as to obtain different resistance states corresponding to different electrical fields, thereby achieving a reversible ER effect;

wherein, the bottom layer of the nano multilayer film comprises a conductive metal material;

wherein, the substrate of the nano multilayer film comprises a Si substrate, SiC, a glass substrate or Si—$SiO_2$ substrate, a MgO monocrystalline substrate, an $Al_2O_3$ monocrystalline substrate, an organic flexible substrate, or the like;

wherein, the functional layer of the nano multilayer film comprises a ferroelectric or multi-ferric nanofilm;

wherein, the magnetic layer of the nano multilayer film grows on the material of the functional layer, and it can interact with the functional layer via magnetoelectric coupling;

wherein, the magnetic layer of the nano multilayer film is made of a ferromagnetic metal or an alloy thereof, with a thickness of 2 to 100 nm, or made of a diluted magnetic semiconductor material or a semi-metallic material, with a thickness of 2 to 100 nm;

wherein, the magnetic layer of the nano multilayer film comprises a directly or indirectly pinning structure, the directly pinning structure comprising an anti ferromagnetic/ferromagnetic layer, and the indirectly pinning structure comprising an antiferromagnetic layer/a first ferromagnetic layer/a non-magnetic metal layer/a second ferromagnetic layer;

wherein, the antiferromagnetic layer of the nano multilayer film is made of an antiferromagnetic material, which comprises an antiferromagnetic alloy or oxide;

wherein, the ferromagnetic layer, the first ferromagnetic layer and the second ferromagnetic layer of the nano multilayer film are made of a ferromagnetic metal or an alloy thereof, with a thickness of 2 to 100 nm, or made of a diluted magnetic semiconductor material or a semi-metallic material, with a thickness of 2 to 100 nm;

wherein, the cap layer of the nano multilayer film comprises a monolayer or multilayer film made of a not readily oxidable metal material, with a thickness of 2 to 200 nm.

Based on the above structure, according to one aspect of the present invention, a novel memory cell array of electrical field modulation type is provided. Each said memory cell in the memory array is a structure free of a transistor. The memory cell stores data by using the bottom layer, the functional layer, the buffer layer, the insulation layer and the conductive layer deposited sequentially on the substrate. The resistivity of the conductive layer can be altered by applying a voltage between the bottom layer and the buffer layer, thereby reading and writing data. Each cell is connected to 4 metal wires, of which two are used for reading data while the other two for writing data. Two metal wires for reading data are perpendicular to each other for selecting a memory cell at the intersection to read data; also, two metal wires for writing data are perpendicular to each other for selecting a memory cell at the intersection to write data. A memory array consists of memory cells and has a network structure formed by metal wires for reading and metal wires for writing that cross each other.

According to another aspect of the present invention, a novel memory cell array of electrical field modulation type is provided. Each said memory cell in the memory array is a structure free of a transistor. The memory cell stores data by the bottom layer, the functional layer and the conductive layer deposited sequentially on the substrate. The resistivity of the conductive layer can be altered by applying a voltage between the bottom layer and the conductive layer, thereby reading and writing data. Each cell is connected to 4 metal wires, of which two are used for reading data while the other two for writing data. Two metal wires for reading data are perpendicular to each other for selecting a memory cell at the intersection to read data; also, two metal wires for writing data are perpendicular to each other for selecting a memory cell at the intersection to write data. A memory array consists of memory cells and has a network structure formed by metal wires for reading and metal wires for writing that cross each other.

According to another aspect of the present invention, a novel memory cell array of electrical field modulation type is provided, wherein the electrical field is applied in-plane to the memory cell, rather than in vertical direction. It has a structure consisting of a bottom layer, a functional substrate layer, an insulation layer and a conductive layer. It is the electrical field that applies electrodes to both in-plane ends of the functional layer, and further applies an in-plane electrical field.

According to another aspect of the present invention, a novel memory cell array of electrical field modulation type is provided. Each said memory cell in the memory array is a structure having a transistor. The memory cells store data by the bottom layer, the functional layer, the buffer layer, the insulation layer and the conductive layer deposited sequentially over the transistor. The metal connecting wire of the transistor gate cooperates with a metal wire for reading data or a metal wire for writing data to select the memory cell. The metal connecting wire of the transistor gate and the metal wire for reading data or the metal wire for writing data are perpendicular to each other for selecting a memory cell at the intersection to read or write data. A memory array consists of memory cells and has a network structure formed by metal wires for reading and metal wires for writing that cross each other.

The present invention also provides a random access memory comprising the aforementioned three novel memory cell arrays of electrical field modulation type, wherein the random access memory further comprising a row decoder, a sense amplifier, a column decoder, a register, a control circuit, a read-write drive, a register, input and output, etc.

According to one aspect of the present invention, a novel electrical field controlled FET of switch type is provided. Its core structure consists of an electrode layer/a functional layer/a buffer layer/an insulating barrier layer/a conductive layer (including a protective layer), wherein the electrode layer is of a conductive material and which, as a lower electrode, is used for applying an electrical field onto a ferroelectric or multi-ferric material; the functional layer is of a ferroelectric or multi-ferric material and can alter and regulate the intensity and the direction of electrical polarization under the action of an electrical field; the buffer layer, as an upper electrode, is used for applying a perpendicular or parallel electrical field onto the ferroelectric or multi-ferric material; the intermediate insulating barrier layer is of an oxide and is used for blocking leakage current; the resistance of the conductive layer (including a protective layer) will be affected by the electrical polarization field of the functional layer, to perform a step change.

The perpendicular or parallel electrical field applied between the bottom layer and the buffer layer will form an electrical field in the functional layer, and when the voltage gradually increases from zero, the electrical field applied onto the functional layer gradually increases as well. When the electrical field is less than a certain threshold value, the resistance of the conductive layer does not change; however, when the electrical field exceeds the threshold value, the resistance of the conductive layer may change suddenly from a high resistance state to a low resistance state or from a low resistance state to a high impedance state. When the electrical field is reversed and exceeds a certain threshold value, the resistance of the conductive layer will change suddenly once again, thereby achieving the functions of the electric-field-controlled switch-type FET.

In the above technical solution, one electrode is grounded and a positive or negative voltage is applied to the other electrode so as to apply and reverse an electrical field.

The application and inversion of an electrical field in the above technical solution can also be achieved by the following method, even if the voltages of the two electrodes may vary: when one electrode has a zero voltage, the other one has a positive voltage; vice versa. In this way, a forward or reverse direction electrical field can also be generated.

The application and inversion of an electrical field in the above technical solution can also be achieved by applying an intermediate voltage $V_m$ to one electrode and applying a high voltage $V_H$ or a low voltage $V_L$ to the other electrode, wherein $V_m=(V_H+V_L)/2$, it is defined that $V_A=V_H-V_m$, the electrical field generated by $V_A$ is greater than the reversed electrical field of electroresistance, whereby a switch between a high resistance state and a low resistance state can be achieved when the voltage on the electrode varies between a high voltage and a low voltage.

According to one aspect of the present patent, the core structures of two said FETs are combined back to back, to form a conductive layer/an insulating barrier layer/a buffer layer/a functional layer/a buffer layer/an insulating barrier layer/a conductive layer structure. The conductive layer includes a protective layer, so that two complementary FETs can be formed. The material of each layer is of the same type as the material of said FET. Different from the aforementioned structures, this structure has two buffer layers as a control gate, wherein perpendicular or parallel voltages are applied to the two layers and then the voltages are changed appropriately, so that a forward or reverse direction reversed electrical field can be generated. This reversed electrical field will induce the resistances of the two conductive layers to change, but because the two conductive layers are arranged exactly anti-symmetrically, the resistances of the conductive layers vary in opposite directions. That is to say, when one conductive layer is in a low resistance state, then the other one is in a high resistance state.

The application and inversion of an electrical field in the above technical solution can also be achieved by grounding one buffer layer and then applying a positive or negative voltage to the other buffer layer.

The application and inversion of an electrical field in the above technical solution can also be achieved by the following method, even if the voltages of the two buffer layers may vary: when one buffer layer has a zero voltage, the other one has a positive voltage; vice versa. In this way, a forward or reverse electrical field can also be generated.

The application and inversion of an electrical field in the above technical solution can also be achieved by applying an intermediate voltage $V_m$ to one buffer layer and applying a high voltage $V_H$ or a low voltage $V_L$ to the other buffer layer, wherein $V_m=(V_H+V_L)/2$, it is defined that $V_A=(V_H-V_m)/2$, the electrical field generated by $V_A$ is greater than the reversed electrical field of electroresistance, whereby the two conductive layers can vary between a high resistance state and a low resistance state when the voltage on the buffer layer varies between a high voltage and a low voltage.

According to one aspect of the present patent, said first FET may be used in combination with a resistor to fabricate basic logic circuits comprising an inverter, a NAND gate, a NOR gate, and a complex logic circuit constituted by these basic circuits.

According to one aspect of the present patent, as said second FET is a complementary dual FET, it can be used to fabricate basic complementary logic circuits, each comprising an inverter, a NAND gate and a NOR gate, and a complex logic circuit constituted by these basic circuits. The complementary logic circuit is a ratio-less logic circuit, of which the logic level is independent of the dimension of the device. It is far superior to the previous logic circuit, because the logic circuit fabricated with the first FET is a ratio logic circuit.

In the above solution, devices in the circuit can be interconnected by a process for fabricating an existing large scale integrated circuit, which is easy to integrate and produce on a large scale. Since the four electrode layers of said FETs may be located in different layers of the circuit board, a multilayer wiring can be realized, with an increased number of devices in each single layer.

According to one aspect of the present patent, said logic circuits may form a field-programmable gate array (FPGA). Compared with SRAM-FPGA, ERAM-FPGA fabricated using electroresistance is non-volatile, whereby information will not be lost after power down and, meanwhile, static electrical loss can be eliminated.

Compared with the ordinary FETs, the novel electrical field controlled FET is very different in the following aspects: on the one hand, the FET according to the invention is controlled by an electrical field and has a higher input impedance up to the order of MΩ, so that the input leakage current is smaller and will not affect the signals input into the circuit; on the other hand, the FET according to the invention is non-volatile, i.e. the FET maintains the original resistance state when the electrical field working on the gate disappears, so only one control pulse needs to be input in advance without the need of being maintained during the work, thereby greatly reducing the electrical loss of the circuit and reducing the power consumption of devices. According to one aspect of the present invention, the logic device can be produced using the reversible ER effect: (1) fabricating four point-contact electrodes on the cap layer by a collinearly method: the resistance in a high resistance state is denoted by a logic output "1" (the polarization intensity of the ferroelectric or multi-ferric material is downward), and the resistance in a low resistance state is denoted by a logic output "0" (the polarization intensity of the ferroelectric or multi-ferric material is upward); and (2) two identical input electrical field intensities $E_A$ and $E_B$ are applied between the bottom layer and the cap layer: both $E_A$ and $E_B$ are smaller than the coercive field intensity of the ferroelectric material, and $E_A+E_B$ is greater than the coercive field intensity of the ferroelectric material. $E_A$, $E_B>0$ is denoted by a logic input "1", and $E_A$, $E_B<0$ is denoted by a logic input "0". NAND Logic and NOR logic can be achieved through a logic device produced by those wirings.

Moreover, the present invention presents a method for preparing an nano multilayer film of electric field modulation type as mentioned above, comprising sequentially depositing a bottom layer, a buffer layer, an insulating barrier layer, a conductive layer and a cap layer on a substrate using magnetron sputtering in combination with a growth method such as Pulsed Laser Deposition (PLD), Molecular Beam Epitaxy (MBE), Atomic Layer Deposition (ALD) or Metal-organic Chemical Vapor Deposition (MOCVD), wherein the bottom layer is of a conductive material and which, as a lower electrode, is used for applying an electrical field onto a ferroelectric or multi-ferric material, the substrate is of a ferroelectric or multi-ferric material which can alter and regulate the intensity and the direction of electrical polarization under the action of an electrical field, the buffer layer, as an upper electrode, is used for applying an electrical field onto the ferroelectric or multi-ferric material, the intermediate insulating barrier layer is of an oxide, the cap layer, as a protective layer, prevents the oxidation of the intermediate conductive layer. An electrical field is applied between the bottom layer and the buffer layer (the upper and the lower electrodes), and because of the changes in the intensity and the direction of electrical polarization of the substrate (of a ferroelectric or multi-ferric material), the in-plane conductivity between the neighboring conductive layers is influenced and changed, so as to obtain different resistance states corresponding to different electrical fields, thereby achieving a reversible ER effect.

Furthermore, the present invention also presents a method for preparing a nano multilayer film of electrical field modulation type, comprising sequentially depositing a bottom layer, a functional layer, a buffer layer, an insulating barrier layer, conductive layers and a cap layer on a substrate using magnetron sputtering in combination with a growth method such as Pulsed Laser Deposition (PLD), Molecular Beam Epitaxy (MBE), Atomic Layer Deposition (ALD) or Metal-organic Chemical Vapor Deposition (MOCVD), wherein the bottom layer is of a conductive material and which, as a lower electrode, is used for applying an electrical field onto the functional layer, the functional layer is a ferroelectric or multi-ferric film which can alter and regulate the intensity and the direction of electrical polarization under the action of an electrical field, the buffer layer, as an upper electrode, is used for applying an electrical field onto the ferroelectric or multi-ferric thin film material, the intermediate insulating barrier layer is of an oxide, the cap layer, as a protective layer, prevents the oxidation of the intermediate conductive layer. An electrical field is applied between the bottom layer and the buffer layer (the upper and the lower electrodes), and because of the changes in the intensity and the direction of electrical polarization of the functional layer (of a ferroelectric or multi-ferric material), the in-plane conductivity between the neighboring conductive layers is influenced and changed, so as to obtain different resistance states corresponding to different electrical fields, thereby achieving a reversible ER effect.

In addition, the present invention also presents a method for preparing nano multilayer film of electrical field modulation type, comprising sequentially depositing a bottom layer, a functional layer, a magnetic layer and a cap layer on a substrate using magnetron sputtering in combination with a growth method, such as Pulsed Laser Deposition (PLD), Molecular Beam Epitaxy (MBE), Atomic Layer Deposition (ALD) or Metal-organic Chemical Vapor Deposition (MOCVD), wherein the substrate is of a non-ferroelectric or multi-ferric material, the bottom layer is of a conductive material and which, as a lower electrode, is used for applying an electrical field onto the functional layer, the functional layer is a ferroelectric or multi-ferric film which can alter and regulate the intensity and the direction of electrical polarization under the action of an electrical field, the cap layer, as an upper electrode and a protective layer, prevents the oxidation of the intermediate magnetic layer. An electrical field is applied between the bottom layer and the cap layer (the upper and the lower electrodes), and because of the changes in the intensity and the direction of electrical polarization of the functional layer (of a ferroelectric or multi-ferric material), the in-plane conductivity between the neighboring metal and magnetic layers is influenced and changed, so as to obtain different resistance states corresponding to different electrical fields, thereby achieving a reversible ER effect.

BRIEF DESCRIPTION OF THE FIGURES

FIGS. 5A1, 5A2, 5A3, 5B1, 5B2, 5B3, 5C1, 5C2, 5C3, 5D1, 5D2, 5D3, 5E1, 5E2, 5E3, 5F1, 5F2, 5F3, 5G1, 5G2, 5G3, 5G4, 5G5 and 5G6 are cross-sectional views and plan views corresponding to the core structures of seven memory cells of electrical field modulation type shown in the figures;

FIG. 6 is a schematic view of an array of seven memory cells of electrical field modulation type illustrated in FIGS. 4 and 5;

FIG. 15B is the corresponding truth table;

FIG. 16B is the corresponding truth table;

FIG. 17B is the corresponding truth table;

FIG. 18B is the corresponding truth table;

FIG. 19B is the corresponding truth table;

FIG. 20B is the corresponding truth table.

DETAILED DESCRIPTION OF THE PREFERRED EMBODIMENTS

Figure 1A:
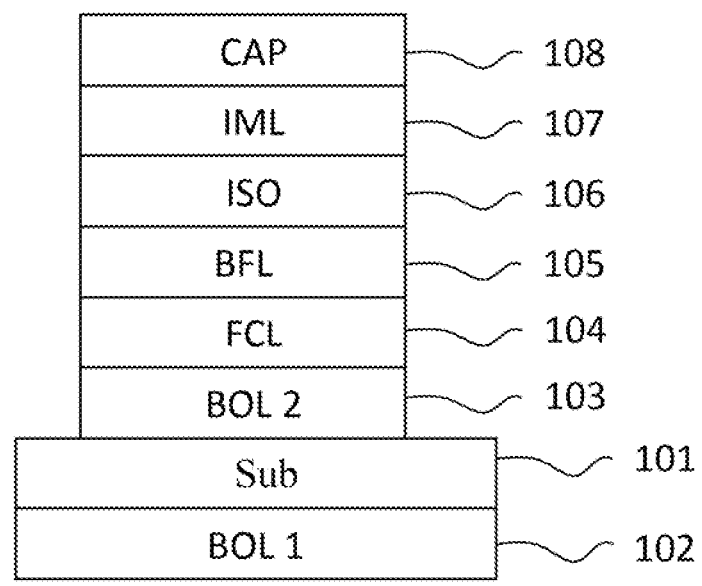
FIG. 1a is a schematic view illustrating the structure of a nano multilayer film according to the present invention.

The object of the present invention is to present a nano multilayer film of electrical field modulation type, a field effect transistor of electrical field modulation type, an electrical field sensor of switch type and a random access memory of electrical field drive type, configured to achieve a novel reversible ER effect in a nano multilayer film of electrical field modulation type at room temperature, and to apply the reversible ER effect in electronic devices.

The nano multilayer film comprises, in succession from bottom to top, a bottom layer, a substrate, a bottom layer, a functional layer, a buffer layer, an insulating barrier layer, an intermediate conductive layer, and a cap layer, wherein when the intermediate conductive layer is a magnetic metal, magnetic alloy or magnetic metal composite layer, the buffer layer and the insulation layer can be selectively added as required. The intermediate conductive layer comprises a metal layer, a conductive polymer material, topological insulator material, a conductive semiconductor doped material, or the like. The metal layer comprises a non-magnetic metal layer, a magnetic metal layer, an anti ferromagnetic layer, or the like. When the intermediate conductive layer is a non-magnetic metal layer or an antiferromagnetic layer, the buffer layer and the insulating barrier layer must be added in order to obtain a relatively high signal to noise ratio.

According to the first aspect of the present invention, a nano multilayer film of electrical field modulation type is provided, which comprises in succession from bottom to top: a bottom layer; a substrate; a buffer layer; an insulating barrier layer; a conductive layer; and a cap layer.

wherein, the bottom layer is a conductive material which, as a lower electrode, is used for applying an electrical field onto the substrate; the substrate is a ferroelectric or multi-ferric material which can alter and regulate the intensity and the direction of electrical polarization under the action of an electrical field; the buffer layer, as an upper electrode, is used for applying an electrical field onto the ferroelectric or multi-ferric material; the intermediate insulation layer is an oxide; the cap layer, as a protective layer, prevents the oxidation of the intermediate conductive layers. An electrical field is applied between the bottom layer and the buffer layer (the upper and the lower electrodes), and because of the changes in the intensity and the direction of electrical polarization of the substrate (of a ferroelectric or multi-ferric material), the in-plane conductivity between the neighboring conductive layers is influenced and changed, so as to obtain different resistance states corresponding to different electrical fields, thereby achieving a reversible ER effect.

The bottom layer of the above nano multilayer film comprises a conductive metal material.

The substrate of the above nano multilayer film comprises a substrate made of a ferroelectric or multi-ferric material.

The buffer layer of the above nano multilayer film can improve the interface between the substrate and the multilayer film, and can be used as an upper electrode for applying an electrical field onto the ferroelectric or multi-ferric film material.

The conductive layer of the above nano multilayer film can grow perfectly on the insulating barrier layer, and its conductivity can be regulated by the intensity and the direction of electrical polarization of the ferroelectric or multi-ferric film at the bottom via electrical polarization interaction or magnetoelectric coupling.

The conductive layer of the above nano multilayer film comprises a non-magnetic metal layer, a magnetic metal layer, an antiferromagnetic layer, a conductive polymer material, a topological insulator material, a conductive semiconductor doped material, or the like.

The non-magnetic metal layer of the above nano multilayer film consists of a non-magnetic metal or an alloy thereof, with a thickness of 2 to 100 nm.

The intermediate conductive layer of the above nano multilayer film comprises a conductive polymer material, a topological insulator material, a conductive semiconductor doped material, or the like.

The magnetic metal layer of the above nano multilayer film is made of a magnetic metal or an alloy thereof, with a thickness of 2 to 100 nm, or made of a diluted magnetic semiconductor material or a semi-metallic material, with a thickness of 2 to 100 nm.

The magnetic metal layer of the above nano multilayer film comprises a directly or indirectly pinning structure, the directly pinning structure comprising an antiferromagnetic (AFM)/ferromagnetic (FM) layer, and the indirectly pinning structure comprising an antiferromagnetic (AFM) layer/a first ferromagnetic (FM1) layer/a non-magnetic metal (NM) layer/a second ferromagnetic (FM2) layer.

The antiferromagnetic material of the above nano multilayer film comprises an antiferromagnetic alloy or oxide.

The ferromagnetic (FM) layer, the first ferromagnetic (FM1) layer and the second ferromagnetic (FM2) layer of the above nano multilayer film are made of a ferromagnetic metal or an alloy thereof, with a thickness of 2 to 100 nm, or made of a diluted magnetic semiconductor material or a semi-metallic material, with a thickness of 2 to 100 nm.

The cap layer of the above nano multilayer film comprises a monolayer or multilayer film made of a not readily oxidable metal material, with a thickness of 2 to 200 nm.

According to the second aspect of the present invention, a nano multilayer film of electrical field modulation type is provided, which comprises in succession from bottom to top: a substrate; a bottom layer; a functional layer; a buffer layer; an insulating barrier layer; a conductive layer; and a cap layer.

wherein, the bottom layer is of a conductive material which, as a lower electrode, is used for applying an electrical field onto the functional layer; the functional layer is a ferroelectric or multi-ferric film which can alter and regulate the intensity and the direction of electrical polarization under the action of an electrical field; the buffer layer, as an upper electrode, is used for applying an electrical field onto the ferroelectric or multi-ferric film material; the intermediate insulation layer is of an oxide; the cap layer, as a protective layer, prevents the oxidation of the intermediate conductive layers. An electrical field is applied between the bottom layer and the buffer layer (the upper and the lower electrodes), and because of the changes in the intensity and the direction of electrical polarization of the functional layer (of a ferroelectric or multi-ferric material), the in-plane conductivity between the neighboring conductive layers is influenced and changed, so that different resistance states corresponding to different electrical fields can be obtained, thereby achieving a reversible ER effect.

The substrate of the above nano multilayer film comprises a Si substrate, SiC, a glass substrate or Si—$SiO_2$ substrate, a MgO monocrystalline substrate, an $Al_2O_3$ monocrystalline substrate, an organic flexible substrate, or the like.

The bottom layer of the above nano multilayer film comprises a conductive metal material.

The functional layer of the above nano multilayer film comprises a ferroelectric or multi-ferric nano-film, which can deposit a seed layer in advance as required for optimizing an interface with the substrate and improving the crystalline structure of the ferroelectric or multi-ferric nano-film.

The buffer layer of the above nano multilayer film can improve the interface between the insulating barrier layer and the functional layer, and can be used as an upper electrode for applying an electrical field onto the material of the ferroelectric or multi-ferric film.

The conductive layer of the above nano multilayer film can grow perfectly on the insulating barrier layer, and its conductivity (resistance) can be regulated by the intensity and the direction of electrical polarization of the ferroelectric or multi-ferric film in the bottom via electrical polarization interaction or magnetoelectric coupling effect.

The conductive layer of the above nano multilayer film comprises a non-magnetic metal layer, a magnetic metal layer, an antiferromagnetic layer, a conductive polymer material, a topological insulator material, a conductive semiconductor doped material, or the like.

The non-magnetic metal layer of the above nano multilayer film consists of a non-magnetic metal or an alloy thereof, with a thickness of 2 to 100 nm.

The intermediate conductive layer of the above nano multilayer film comprises a conductive polymer material, a topological insulator material, a conductive semiconductor doped material, or the like.

The magnetic metal layer of the above nano multilayer film is made of a magnetic metal or an alloy thereof, with a thickness of 2 to 100 nm, or made of a diluted magnetic semiconductor material or a semi-metallic material, with a thickness of 2 to 100 nm.

The magnetic metal layer of the above nano multilayer film comprises a directly or indirectly pinning structure, the directly pinning structure comprising an antiferromagnetic (AFM)/ferromagnetic (FM) layer, and the indirectly pinning structure comprising an antiferromagnetic (AFM) layer/a first ferromagnetic (FM1) layer/a non-magnetic metal (NM) layer/a second ferromagnetic (FM2) layer.

The antiferromagnetic material of the above nano multilayer film comprises an antiferromagnetic alloy or oxide.

The ferromagnetic (FM) layer, the first ferromagnetic (FM1) layer and the second ferromagnetic (FM2) layer of the above nano multilayer film are made of a ferromagnetic metal or an alloy thereof, with a thickness of 2 to 100 nm, or made of a diluted magnetic semiconductor material or a semi-metallic material, with a thickness of 2 to 100 nm.

The cap layer of the above nano multilayer film comprises a monolayer or multilayer film made of a not readily oxidable metal material, with a thickness of 2 to 200 nm.

According to the fourth aspect of the present invention, a nano multilayer film of electrical field modulation type is provided, which comprises in succession from bottom to top: a substrate; a bottom layer; a functional layer; a magnetic layer; and a cap layer.

wherein, the substrate is a non-ferroelectric or multi-ferric material; the bottom layer is a conductive material which, as a lower electrode, is used for applying an electrical field onto the functional layer; the functional layer is a ferroelectric or multi-ferric film which can alter and regulate the intensity and the direction of electrical polarization under the action of an electrical field; the cap layer, as an upper electrode and a protective layer, prevents the oxidation of the intermediate magnetic layer. An electrical field is applied between the bottom layer and the cap layer (the upper and the lower electrodes), and since the changes in the intensity and the direction of electrical polarization of the functional layer (a ferroelectric or multi-ferric material) influence and change the in-plane conductivity between the neighboring metal and magnetic layers, different resistance states corresponding to different electrical fields can be obtained, thereby achieving a reversible ER effect.

The bottom layer of the above nano multilayer film comprises a conductive metal material.

The substrate of the above nano multilayer film comprises a Si substrate, SiC, a glass substrate or Si—$SiO_2$ substrate, a MgO monocrystalline substrate, an $Al_2O_3$ monocrystalline substrate, an organic flexible substrate, or the like.

The functional layer of the above nano multilayer film comprises a ferroelectric or multi-ferric nanofilm.

The magnetic layer of the above nano multilayer film can grow perfectly on the material of the functional layer, and its conductivity can be regulated by the intensity and the direction of electrical polarization of the ferroelectric or multi-ferric film at the bottom via electrical polarization interaction or magnetoelectric coupling.

The magnetic layer of the above nano multilayer film is made of a ferromagnetic metal or an alloy thereof, with a thickness of 2 to 100 nm, or made of a diluted magnetic semiconductor material or a semi-metallic material, with a thickness of 2 to 100 nm.

The magnetic layer of the above nano multilayer film comprises a directly or indirectly pinning structure, the directly pinning structure comprising an antiferromagnetic (AFM)/ferromagnetic (FM) layer, and the indirectly pinning structure comprising an antiferromagnetic (AFM) layer/a first ferromagnetic (FM1) layer/a non-magnetic metal (NM) layer/a second ferromagnetic (FM2) layer.

The antiferromagnetic material of the above nano multilayer film comprises an anti ferromagnetic alloy or oxide.

The ferromagnetic (FM) layer, the first ferromagnetic (FM1) layer and the second ferromagnetic (FM2) layer of the above nano multilayer film are made of a ferromagnetic metal or an alloy thereof, with a thickness of 2 to 100 nm, or made of a diluted magnetic semiconductor material or a semi-metallic material, with a thickness of 2 to 100 nm.

The cap layer of the above nano multilayer film comprises a monolayer or multilayer film made of a not readily oxidable metal material, with a thickness of 2 to 200 nm.

According to the fifth aspect of the present invention, FETs of electrical field modulation type based on the ER effect is provided. By applying different voltages to the gates of the nano multilayer film of electrical field modulation type according to the first, second, third and fourth aspects of the present invention, a certain electrical field is formed between the cap layer and the bottom layer. Additionally, a certain voltage is applied between the source and the drain, because of the generation of the ER effect, the multilayer film has different resistances corresponding to different electrical fields, whereupon the conductivity from the source to the drain varies. Therefore, the conductivity or resistance values from the source electrode to the drain electrode can be regulated via the voltages applied to the gates.

FIG. 1a shows the nano multilayer film according to one embodiment of the present invention, which comprises in succession from bottom to top: a bottom layer 102 (abbreviated as BOL 1), a substrate 101 (abbreviated as SUB), a bottom layer 103 (abbreviated as BOL 2), a function layer 104 (abbreviated as FCL), a buffer layer 105 (abbreviated as BFL), an insulation layer 106 (abbreviated as ISO), an intermediate conductive layer 107 (abbreviated as IML), and a cap layer 108 (abbreviated as CAP). Each of the layers is described in detail below.

The substrate 101 is a ferroelectric or multi-ferric substrate, or a general substrate including a Si substrate, SiC, a glass substrate or Si—$SiO_2$ substrate, a MgO mono-crystalline substrate, an $Al_2O_3$ mono-crystalline substrate, an organic flexible substrate, or the like.

The substrate 101 of the above substrate is a ferroelectric or multi-ferric substrate, including $Pb(Mg_{1/3}Nb_{2/3})O$—$PbTiO_3$ (PMN-PT), $BiFeO_3$ (BFO), $BaTiO_3$, $Pb(Zn_{1/3}Nb_{2/3})O_3$—$PbTiO_3$ (PZN-PT), $PbTiO_3$ (PTO), $SrTiO_3$ (STO), $BiMnO_3$ or the like, with a thickness of 0.1 to 1 mm.

The substrate of the nano multilayer film is a general substrate including a Si substrate, SiC, a glass substrate or Si—$SiO_2$ substrate, a MgO mono-crystalline substrate, an $Al_2O_3$ mono-crystalline substrate, an organic flexible substrate, or the like, with a thickness of 0.1 to 1 mm.

The bottom layer 102 of the nano multilayer film is a conductive metal layer. The conductive metal layer is generally made of Cu, Cr, V, Nb, Mo, Ru, Pd, Ta, W, Pt, Ag, Au or an alloy thereof, with a thickness of 2.0 to 100 nm.

The bottom layer 103 of the nano multilayer film is a conductive metal layer. The conductive metal layer is generally used Cu, Cr, V, Nb, Mo, Ru, Pd, Ta, W, Pt, Ag, Au or an alloy thereof, with a thickness of 2.0 to 100 nm.

The functional layer 104 is a ferroelectric or multi-ferric film. The ferroelectric or multi-ferric film generally includes $Pb(Mg_{1/3}Nb_{2/3})O_3$—$PbTiO_3$ (PMN-PT), $BiFeO_3$ (BFO), $BaTiO_3$ (BTO), $PbTiO_3$ (PTO), $SrTiO_3$ (STO), $BiMnO_3$ or the like, with a thickness of 5 to 500 nm; a seed layer of $SrRuO_3$ or $TiO_2$ or the like can be deposited in advance, in order to ensure a relatively good functional layer and a relatively close binding of the functional layer to the substrate.

In general, the buffer layer 105 is a non-magnetic metal layer (including a single layer or multiple layers) which has a relatively good electrical conductivity and binds closely to the substrate. The material is preferably Ta, Ru, Cr, Au, Ag, Pt, Pd, Cu, CuN or the like, or may also be a metal alloy or a metal composite layer, of which the thickness may range from 2.0 to 100 nm.

The insulation layer 106 is generally made of a material, such as $AlO_x$, MgO, $Mg_{1-x}Zn_xO$, AlN, $Ta_2O_5$, $MgAlO_x$, ZnO, $MgSiO_x$, $SiO_2$, $HfO_2$, $TiO_2$, Alq3, an LB organic composite film, GaAs, AlGaAs, InAs or the like, preferably made of MgO, $AlO_x$, MgZnO, AlN and Alq3, or an LB organic composite film, with a thickness of 0.5 to 10 nm.

The intermediate conductive layer 107 is a ferromagnetic metal, or a directly or indirectly pinning structure. "Directly pinning" means directly contacting the antiferromagnetic layer AFM with the ferromagnetic layer FM (abbreviated as AFM/FM), and "indirectly pinning" means interposing there between a composite layer NM/FM (abbreviated as FM1/NM/FM2/AFM).

The ferromagnetic metal of the above magnetic layer 107 comprises a ferromagnetic metal with a relatively high spin polarization, preferably Co, Fe or Ni, or a film made of an alloy of these ferromagnetic metals, preferably a ferromagnetic alloy, such as Co—Fe, Co—Fe—B, NiFeCr or Ni—Fe (e.g. $Ni_{18}Fe_{19}$ or $Co_{75}Fe_{25}$), with a thickness of 2.0 to 100 nm, or a diluted magnetic semiconductor material, such as GaMnAs or Ga—Mn—N, or a semi-metallic material, such as Co—Mn—Si, Co—Fe—Al, Co—Fe—Si, Co—Mn—Al, Co—Fe—Al—Si, Co—Mn—Ge, Co—Mn—Ga, Co—Mn—Ge—Ga, $La_{1-x}Sr_xMnO_3$ or $La_{1-x}Ca_xMnO_3$ (where 0<X<1), with a thickness of 2.0 to 100 nm.

The antiferromagnetic layer AFM of the above magnetic layer 107 comprises an antiferromagnetic alloy material, preferably Pt—Mn, Ir—Mn, Fe—Mn or Ni—Mn, with a thickness of 5 to 50 nm, or an antiferromagnetic oxide, preferably CoO or NiO, with a thickness of 5 to 50 nm. The ferromagnetic layer FM is made of a ferromagnetic metal with a relatively high spin polarization, preferably Co, Fe or Ni, or a film made of an alloy of these ferromagnetic metals, preferably a ferromagnetic alloy such as Co—Fe, Co—Fe—B, NiFeCr or Ni—Fe (e.g. $Ni_{81}Fe_{19}$ or $Co_{75}Fe_{25}$), with a thickness of 2.0 to 100 nm, or a diluted magnetic semiconductor material, such as GaMnAs or Ga—Mn—N, or a semi-metallic material, such as Co—Mn—Si, Co—Fe—Al, Co—Fe—Si, Co—Mn—Al, Co—Fe—Al—Si, Co—Mn—Ge, Co—Mn—Ga, Co—Mn—Ge—Ga, $La_{1-x}Sr_xMnO_3$ or $La_{1-x}Ca_xMnO_3$ (where 0<x<1), with a thickness of 2.0 to 100 nm. The ultrathin non-magnetic metal layer NM interposed between the ferromagnetic layer FM and the antiferromagnetic layer AFM is generally made of Cu, Cr, V, Nb, Mo, Ru, Pd, Ta, W, Pt, Ag, Au or an alloy thereof, with a thickness of 0.1 to 5 nm.

The intermediate conductive layer is a non-magnetic metal layer with a relatively good conductivity (including a single-layer or multi-layer composite metal film). The material is preferably Ta, Cu, Ti, Ru, Au, Ag, Pt, Al, Cr, V, W, Nb or the like, with a thickness of 2.0 to 100 nm.

The intermediate conductive layer is an antiferromagnetic metal layer. The material is preferably IrMn, FeMn, PtMn or NiMn, with a thickness of 5 to 50 nm. Alternatively, it is an antiferromagnetic oxide, preferably CoO, NiO or the like, with a thickness of 5 to 50 nm.

The intermediate conductive layer is a conductive polymer material, a topological insulator material, or doped conductive semiconductor materials. The material is preferably Graphene, a conductive semiconductor doped material, or the like. The material is preferably a conductive material, such as Graphene, doped polyacetylene, Sb, Bi—Te, Bi—Se or Sb—Te.

The cap layer 108 is a metal layer (including a single-layer or multi-layer composite metal film) which is not easy to oxidize and has a relatively good conductivity. The material is preferably Ta, Cu, Ti, Ru, Au, Ag, Pt or the like, with a thickness of 2.0 to 200 nm, for protecting the core structure from oxidation and corrosion.

Figure 1B:
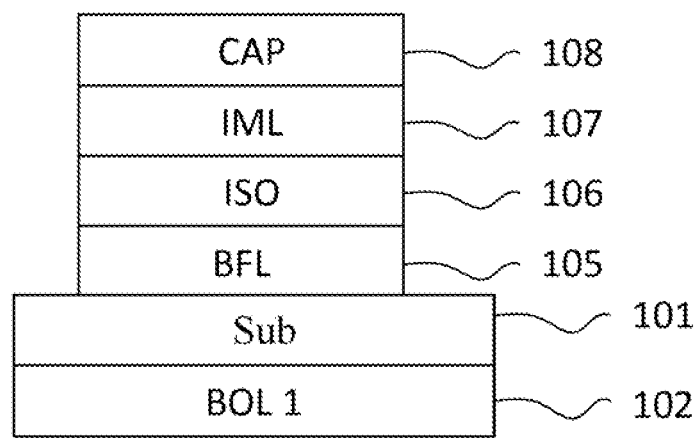
FIG. 1b shows Structure A: BOL 1/SUB/B FL/ISO/NM (or FM, or AFM)/CAP.
Figure 1C:
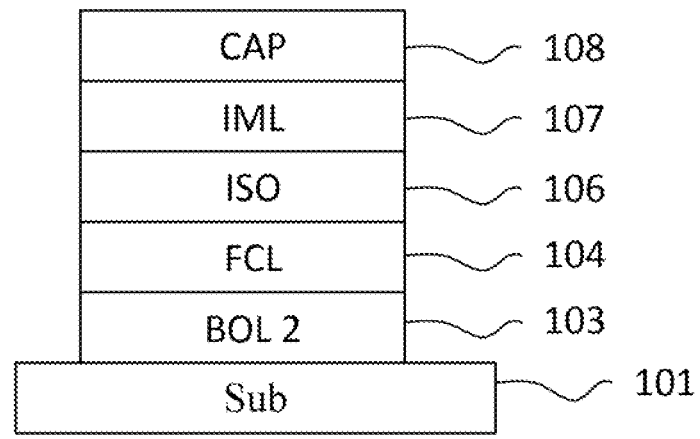
FIG. 1c shows Structure B: SUB/BOL 2/FCL/ISO/NM (or FM, or AFM)/CAP.
Figure 1D:
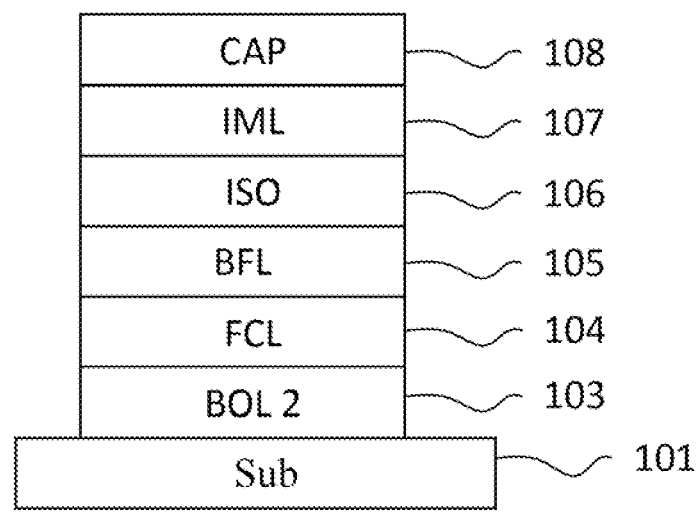
FIG. 1d shows Structure C: SUB/BOL 2/FCL/BFL/ISO/NM (or FM, or AFM)/CAP.
Figure 1E:
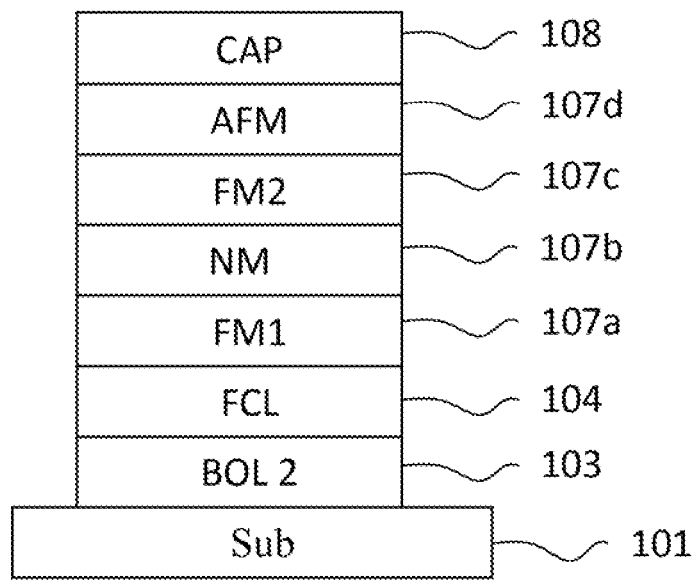
FIG. 1e shows Structure D: SUB/BOL 2/FCL/FM1/NM/FM2/AFM/CAP.
Figure 1F:
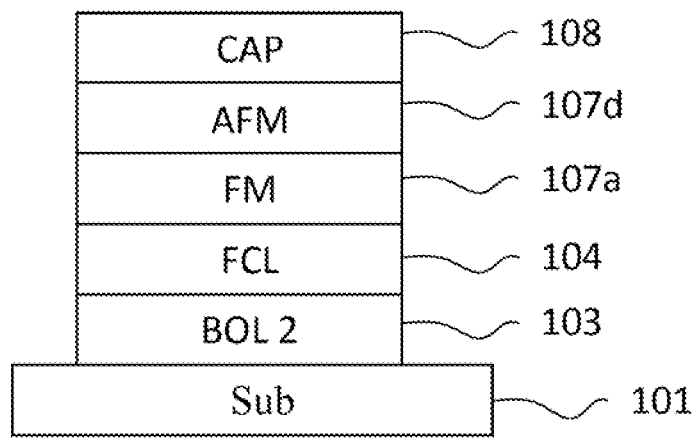
FIG. 1f shows Structure E: SUB/BOL 2/FCL/FM/AFM/CAP.
Figure 1G:
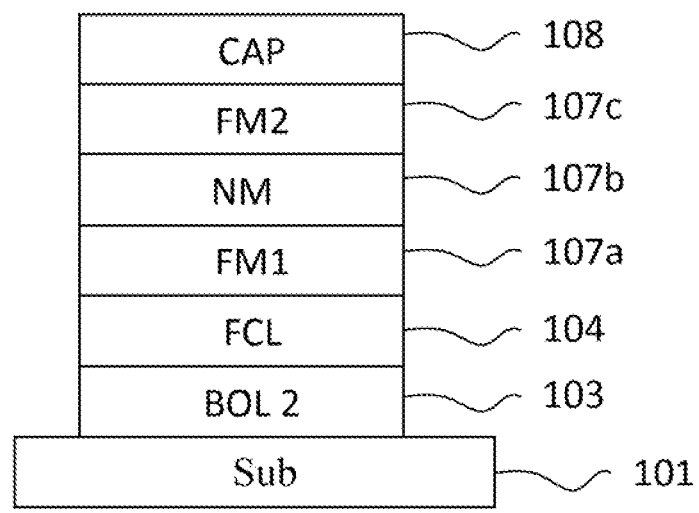
FIG. 1g shows Structure F: SUB/BOL 2/FCL/FM1/NM/FM2/CAP.
Figure 1H:
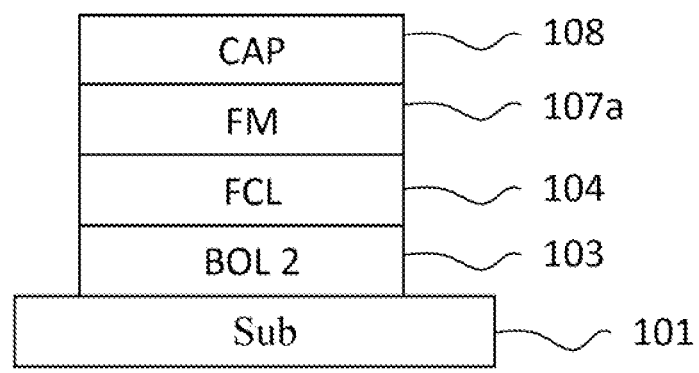
FIG. 1h shows Structure G: SUB/BOL 2/FCL/FM/CAP.

Therefore, the magnetic nano multilayer film structure of the present invention includes, but is not limited to:

Structure A: BOL 1/SUB/B FL/ISO/NM (or FM, or AFM)/CAP (FIG. 1*b*);
Structure B: SUB/BOL 2/FCL/ISO/NM (or FM, or AFM)/CAP (FIG. 1*c*);
Structure C: SUB/BOL 2/FCL/BFL/ISO/NM (or FM, or AFM)/CAP (FIG. 1*d*);
Structure D: SUB/BOL 2/FCL/FM1/NM/FM2/AFM/CAP (FIG. 1*e*);
Structure E: SUB/BOL 2/FCL/FM/AFM/CAP (FIG. 1*f*);
Structure F: SUB/BOL 2/FCL/FM1/NM/FM2/CAP (FIG. 1*g*); and
Structure G: SUB/BOL 2/FCL/FM/CAP (FIG. 1*h*).

Example 1

In a magnetron sputtering apparatus, 5 nm-thick $Co_{75}Fe_{25}$ was directly grown as a magnetic layer on a (001)-PMN-PT ferroelectric oxide substrate at a vacuum degree of greater than $2\times10^{-6}$ Pa, a deposition rate of 0.06 nm is, and an Ar pressure of 0.07 Pa. Then, 6 nm Ta was directly deposited as a cap layer on the 5 nm-thick $Co_{75}Fe_{25}$ magnetic layer to prevent oxidation of the $Co_{75}Fe_{25}$ magnetic layer. The obtained nano multilayer film was placed into the magnetron sputtering apparatus, and a 100 nm-thick Au film was deposited at the top of the 6 nm-thick Ta cap layer at a vacuum degree of greater than $2\times10^{-5}$ Pa, a deposition rate of 10 nm/min, and an Ar pressure of 0.1 Pa to produce a top electrode. Finally, 10 nm-thick Cr and 100 nm-thick Au films were directly deposited as the bottom electrode on the back of the (001)-PMN-PT ferroelectric oxide substrate so as to apply an electrical field.

Figure 2A:
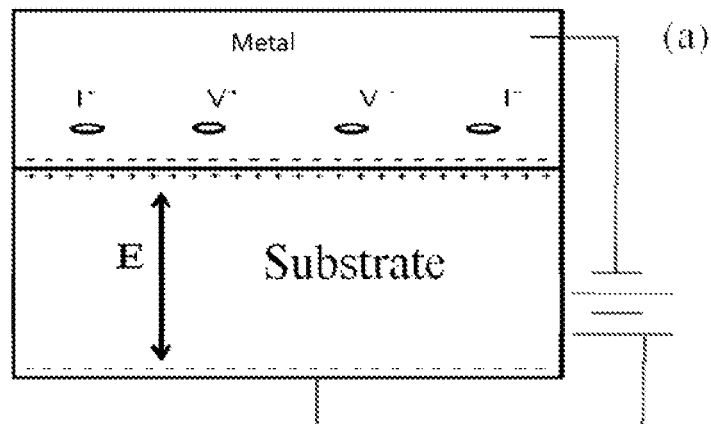
FIG. 2a is a schematic view illustrating the structure of a nano multilayer film in Example 1 according to the present invention.
Figure 2B:
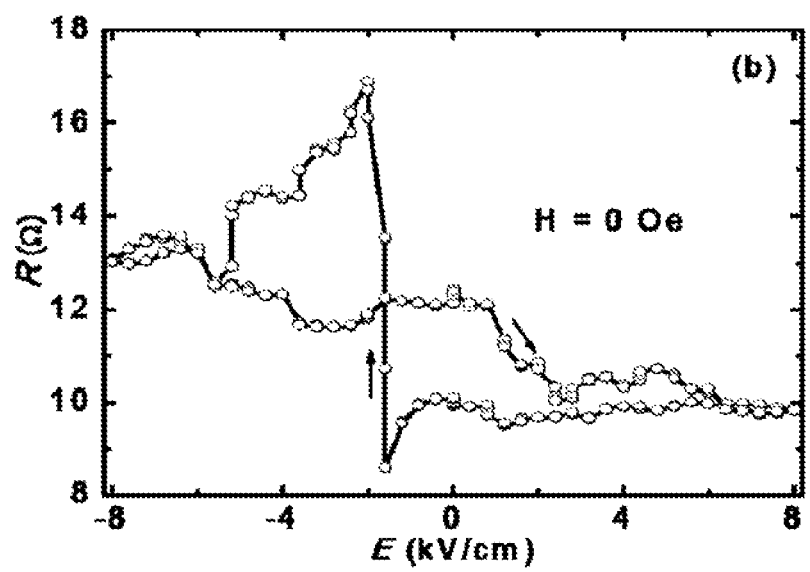
FIG. 2b is a schematic view illustrating the relationship between the variation of resistance R of a device and the variation of an external electrical field E.

An electrical field of −8 kV/cm to 8 kV/cm is applied between the contact electrode and the Au film on the lower surface of the (001)-PMN-PT ferroelectric oxide substrate, as shown in FIG. 2*a*; FIG. 2*b* is a schematic view showing the varying external electrical field E applied between the contact electrode and the Au film on the lower surface of the (001)-PMN-PT ferroelectric oxide substrate and the measurement results of the resistance of the nano multilayer film.

Example 2

Figure 3A:
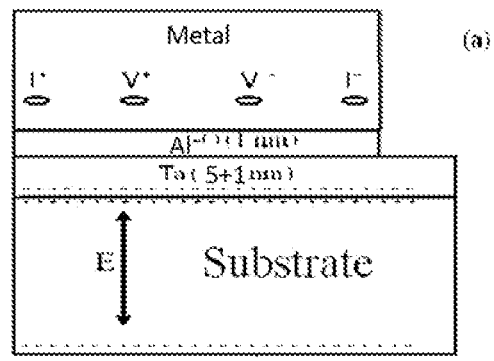
FIG. 3a is a schematic view illustrating the structure of a nano multilayer film in Example 2 according to the present invention.
Figure 3B:
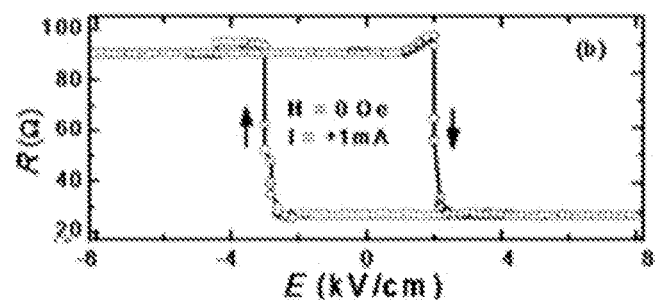
FIG. 3b is a schematic view illustrating the relationship between the variation of resistance R of a device, in which the intermediate conductive layer is the magnetic metal $Co_{75}Fe_{25}$, and the variation of an external electrical field E.
Figure 3C:
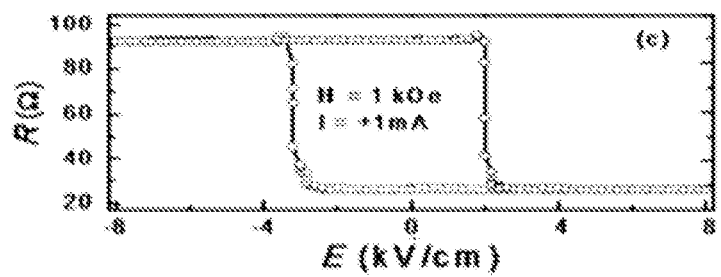
FIG. 3c is a schematic view illustrating the measurement results of the varying external electrical field E and the resistance R of a nano multilayer film in case the intermediate conductive layer is $Co_{75}Fe_{25}$, wherein the measurement is performed while a magnetic field of 1 kOe is being applied.
Figure 3D:
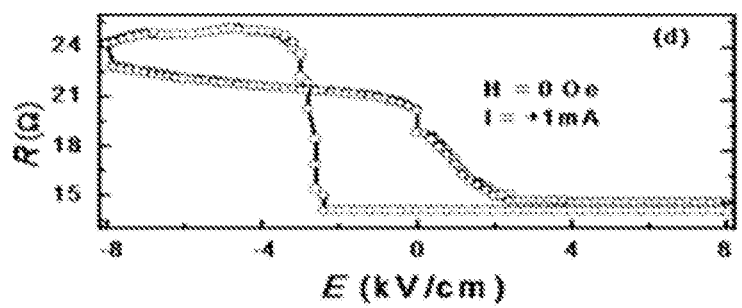
FIG. 3d is a schematic view illustrating the measurement results of the varying external electrical field E and the resistance R of a nano multilayer film in case the intermediate conductive layer is a 5 nm-thick Al film.
Figure 3E:
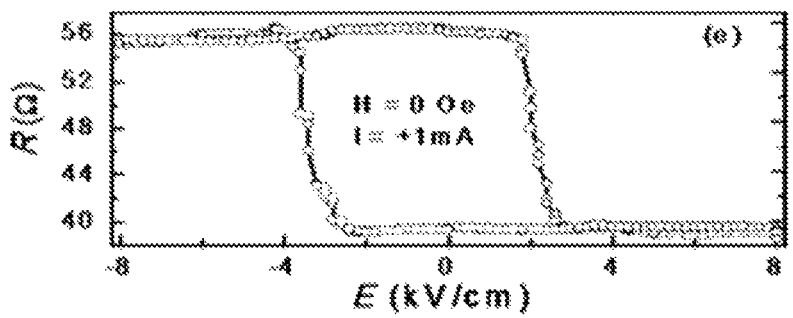
FIG. 3e is a schematic view illustrating the measurement results of the varying external electrical field E and the resistance R of a nano multilayer film in case the intermediate conductive layer is a 5 nm-thick IrMn antiferromagnetic alloy film.
Figure 4A:
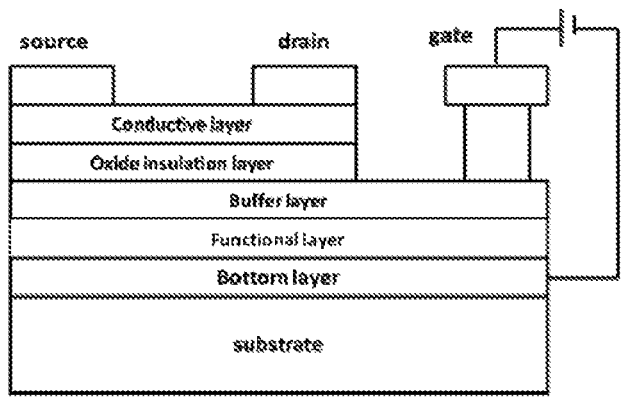
FIGS. 4A, 4B, 4C, 4D, 4E, 4F, 4G and 4H are schematic views illustrating the core structures of eight memory cells of electrical field modulation type.
Figure 4B:
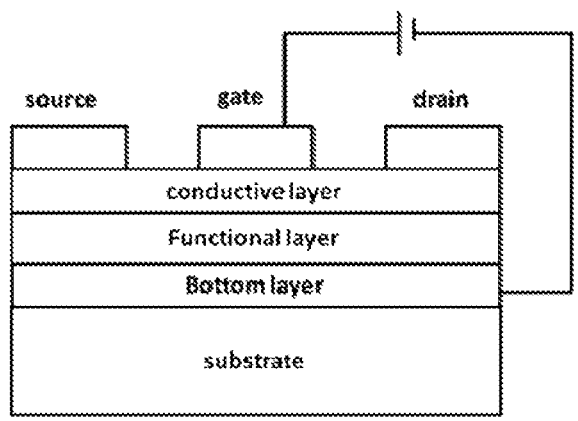
Figure 4C:
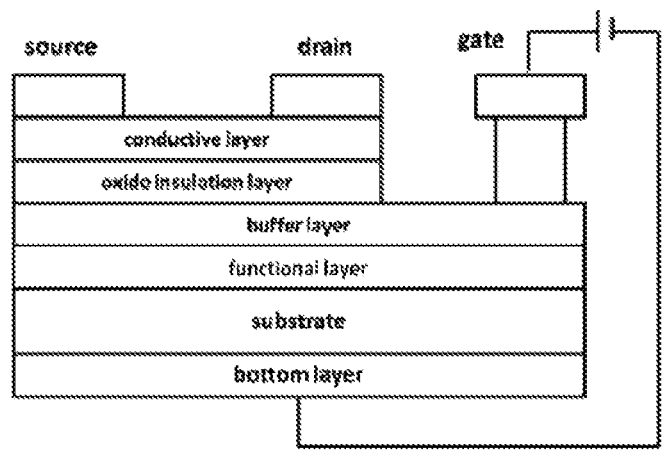
Figure 4D:
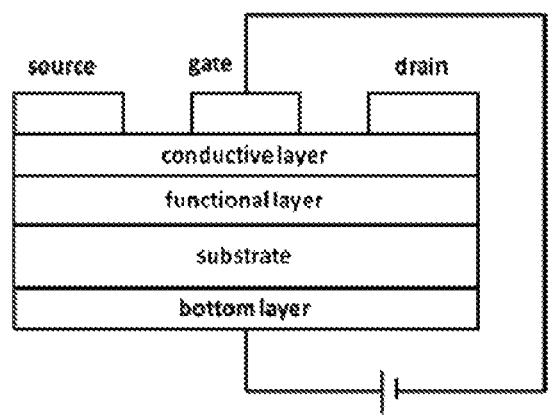
Figure 4E:
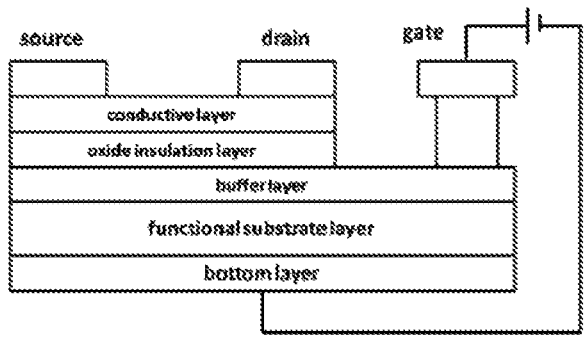
Figure 4F:
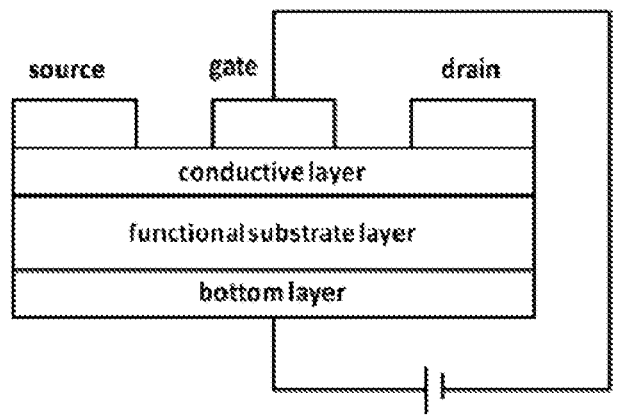
Figure 4G:
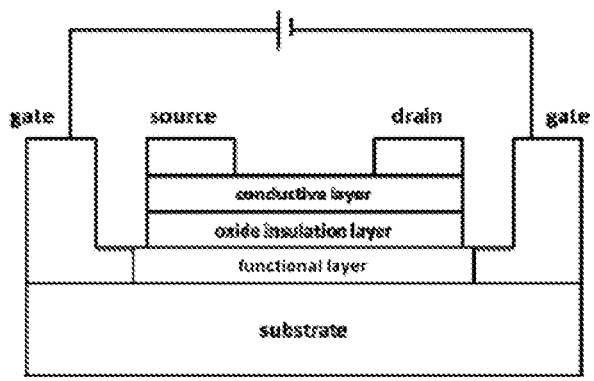
Figure 4H:
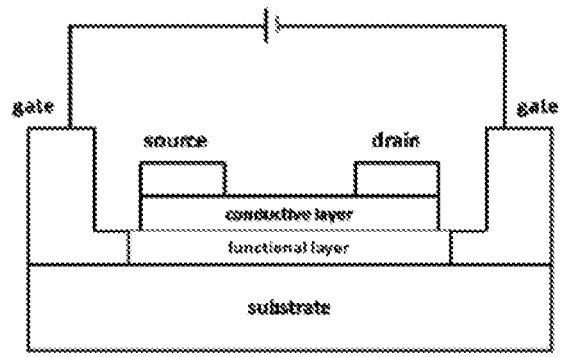

In a magnetron sputtering apparatus, a Ta (5 nm) buffer layer (BFL) was deposited on a (001)-PMN-PT ferroelectric oxide substrate at a vacuum degree of greater than $1\times10^{-6}$ Pa, a deposition rate of 0.1 nm/s, and an Ar pressure of 0.07 Pa during deposition. Then, in the magnetron sputtering apparatus, $AlO_x$ with a deposition thickness of 1.0 nm was directly deposited as an insulating barrier layer on the Ta buffer layer at a vacuum degree of greater than $2\times10^{-6}$ Pa, a deposition rate of 0.07 nm/s, and an Ar pressure of 0.07 Pa. Subsequently, the magnetic metal $Co_{73}Fe_{25}$ with a thickness of 5 nm was directly deposited (alternatively, the non-magnetic metal Al with a thickness of 5 nm was directly deposited, or the antiferromagnetic layer IrMn with a thickness of 5 nm was deposited) as an intermediate conductive layer on the 1.0 nm $AlO_x$ insulating barrier layer at a vacuum degree of greater than $1\times10^{-6}$ Pa, a deposition rate of 0.1 nm/s, and an Ar pressure of 0.07 Pa during deposition. Cr with a thickness of 10 nm and Au with a thickness of about 100 nm were sputtered onto the lower surface of the (001)-PMN-PT ferroelectric oxide substrate so as to apply an electrical field. An electrical field of −8 kV/cm to 8 kV/cm was applied between the contact electrode and the Au film on the lower surface of the (001)-PMN-PT ferroelectric oxide substrate, as shown in FIG. 3*a*; FIG. 3*b* is a schematic view showing the measurement results of the varying external electrical field E and the resistance R of the nano multilayer film when the intermediate conductive layer was $Co_{75}Fe_{25}$; FIG. 3*c* is a schematic view showing the measurement results of the varying external electrical field E and the resistance R of the nano multilayer film when the intermediate conductive layer was $Co_{75}Fe_{25}$, wherein the measurement was performed while a magnetic field of 1 kOe was being applied, so as to measure and analyze the relationship among the resistance of the nano multilayer film, the varying external electrical field and the fixed external magnetic field. As can be seen from the figures, there is still a ~260% resistance variation relationship. In addition, it can be analyzed from the measurement results that the external magnetic field does not affect the R-E curve of the nano multilayer film. This shows that the effect does not result from magnetic interaction. FIG. 3d is a schematic view illustrating the varying external electrical field E and the measurement results of the resistance R of a nano multilayer film in case the intermediate conductive layer is an Al film of 5 nm thick. As can be seen from the figure, there is still a ~100% resistance variation. This implies that the effect does not result from magnetoelectric interaction. FIG. 3e is a schematic view illustrating the measurement results of the varying external electrical field E and the resistance R of a nano multilayer film in case the intermediate conductive layer is a 5 nm-thick IrMn film. As can be seen from the figure, there is still a ~44% resistance variation.

FIG. 4 (FIG. 4A to FIG. 4H) are schematic views illustrating the core structures of eight electric-field-modulated memory cells. The random access memory based on the aforesaid electric-field-modulated memory cells according to the present invention has a novel memory cell architecture, in which data is written by using an electrical field to regulate the electrical polarization direction of the ferroelectric material. This novel architecture requires that the memory cell have a particular cell structure, as shown in FIGS. 5 and 7. Wherein, the cell structure shown in FIG. 5 is a structure free of a transistor, while what is shown in FIG. 7 is a form having a transistor.

Figure 6:
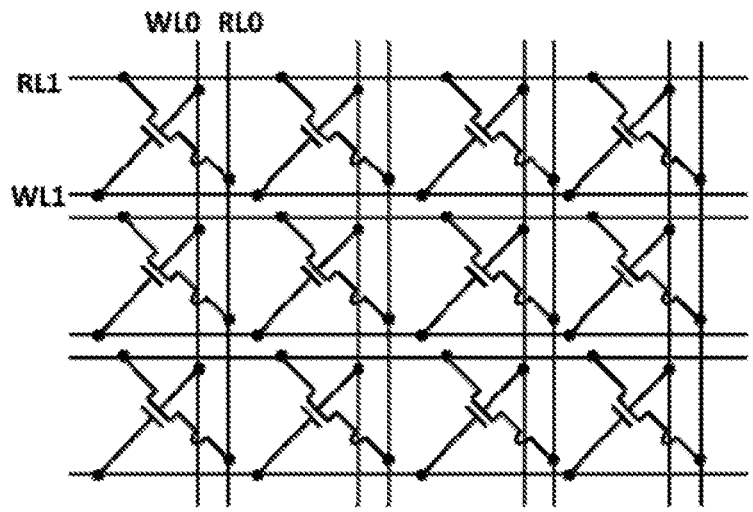
Figure 8A:
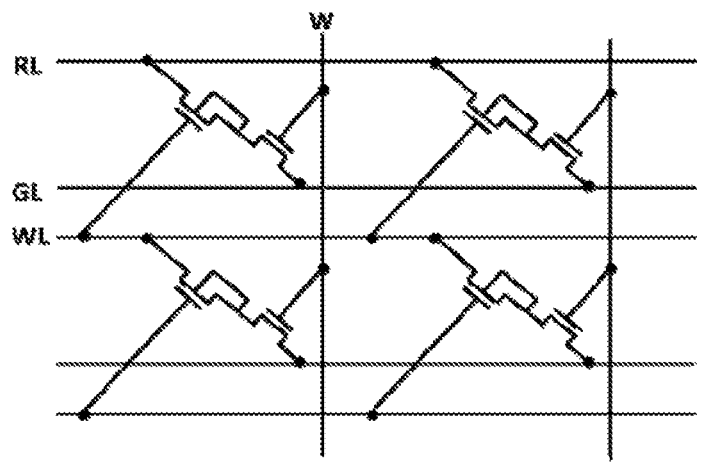
FIGS. 8A and 8B are schematic views of two arrays of memory cells of electrical field modulation type having transistors.

For the cell structures shown in figure, the array thereof is shown in FIG. 6. For transistor-containing cells, the cell array is shown in FIG. 8.

Example 3

The present invention provides a novel array of electric-field-modulated memory cells. FIG. 5A (FIG. 5A1, FIG. 5A2 and FIG. 5A3) exemplifies the structure of the cell array.

The conductive layer of the multi-layer film in the cell is connected to 2a and 2b via 1a and 1b. The buffer layer is connected to 2c via 1c. The bottom layer is connected to 2d via 1d.

The multi-layer film in the cell is connected to 2a, 2b, 2c and 2d via 1a, 1b, 1c, and 1d, respectively, wherein 2a and 2d are metal wires adapted for connecting all memory cells, 2a and 2d are on the same layer and parallel to each other, and 2b and 2c are transition metal layers.

The electrodes of the transition metal layers 2b and 2c are connected to wires 4a and 4b through via holes 3a and 3b, respectively, wherein 4a and 4b are metal wires adapted for connecting all memory cells, and 4a and 4b are on the same layer and parallel to each other.

The wires 2a and 4b are perpendicular to each other for data reading for a cell at the intersection.

When the wires 2a and 4b are being used for data reading, a low current is passed between 2a and 4b and the voltages at both ends are measured to thereby obtain a high resistance state "1" or a low resistance state "0".

The wires 4a and 2d are perpendicular to each other for data writing for a cell at the intersection.

The wires 4a and 2d are used for data writing. When data is being written, appropriate positive and negative voltages are applied to 4a and 2d to generate an electrical field in the functional layer to change the resistivity of the conductive layer, thereby storing "0" and "1" of data.

Based on such a cell structure, the form shown in FIG. 3 constitutes a memory cell array. Wherein, each cell is connected with four metal wires. Metal wires 2a and 4a are used for data reading, corresponding to RL1 and RL0, respectively, as shown in FIG. 3. When data is being read, an appropriate positive voltage is applied to RL1 to read the data of the cell. Metal wires 4b and 2d are used for data writing, corresponding to WL0 and WL1, respectively, as shown in FIG. 4. When data is being written, an appropriate voltage is applied between WL0 and WL1 to reverse the electrical dipole moment of the functional layer, thereby writing data into the conductive layer. To achieve a positive voltage between WL1 and WL0, WL0 can be grounded while a positive voltage is applied to the wire WL1. To achieve a negative voltage between WL1 and WL0, WL1 can be grounded while a positive voltage is applied to the wire WL0.

Example 4

The present invention provides a novel memory cell array of electrical field modulation type. FIG. 5B (FIG. 5B1, FIG. 5B2, FIG. 5B3) exemplifies the structure of the cell array.

The conductive layer of the multi-layer film in the cell is connected to 2a, 2b and 2c via 1a, 1b and 1c. The bottom layer is connected to 2d via 1d, wherein 2a and 2d are metal wires adapted for connecting all memory cells, 2a and 2d are on the same layer and parallel to each other, and 2b and 2c are transition metal layers.

The electrodes of the transition metal layers 2b and 2c are connected to wires 4a and 4b through via holes 3a and 3b, respectively, wherein 4a and 4b are metal wires adapted for connecting all memory cells, and 4a and 4b are on the same layer and parallel to each other.

The wires 2a and 4b are perpendicular to each other for data reading for a cell at the intersection.

When the wires 2a and 4b are being used for data reading, a low current is passed between 2a and 4b and the voltages at both ends are measured to thereby obtain a high resistance state "1" or a low resistance state "0".

The wires 4a and 2d are perpendicular to each other for data writing for a cell at the intersection.

The wires 4a and 2d are used for data writing. When data is being written, appropriate positive and negative voltages are applied to 4a and 2d to generate an electrical field in the functional layer to change the resistivity of the conductive layer, thereby storing "0" and "1" of data.

Based on such a cell structure, the form shown in FIG. 3 constitutes a memory cell array. Wherein, each cell is connected with four metal wires. Metal wires 2a and 4b are used for data reading, corresponding to RL1 and RL0, respectively, as shown in FIG. 6. When data is being read, an appropriate positive voltage is applied to RL1 to read out the data in the cell. Metal wires 4a and 2d are used for data writing and corresponding to WL0 and WL1, respectively, as shown in FIG. 7. When data is being written, an appropriate voltage is applied between WL0 and WL1 to reverse the electrical dipole moment of the functional layer, thereby writing data into the conductive layer. To achieve a positive voltage between WL1 and WL0, WL0 can be grounded while a positive voltage is applied to the wire WL1. To achieve a negative voltage between WL1 and WL0, WL1 can be grounded while a positive voltage is applied to the wire WL0.

Example 5

The present invention provides a novel memory cell array of electrical field modulation type. FIG. 5C (FIG. 5C1, FIG. 5C2 and FIG. 5C3) exemplifies the structure of the cell array.

The conductive layer of the multi-layer film in the cell is connected to 2a and 2b via 1a and 1b. The buffer layer is connected to 2c via 1c. The bottom layer on the back of the substrate is connected to 2d via 1d.

The multi-layer film in the cell is connected to 2a, 2b, 2c and 2d via 1a, 1b, 1c, and 1d, respectively, wherein 2a and 2d are metal wires adapted for connecting all memory cells, 2a and 2d are on the same layer and parallel to each other, and 2b and 2c are transition metal layers.

The electrodes of the transition metal layers 2b and 2c are connected to wires 4a and 4b through via holes 3a and 3b, respectively, wherein 4a and 4b are metal wires adapted for connecting all memory cells, and 4a and 4b are on the same layer and parallel to each other.

The wires 2a and 4b are perpendicular to each other for data reading for a cell at the intersection.

When the wires 2a and 4b are being used for data reading, a low current is passed between 2a and 4b and the voltages at both ends are measured to thereby obtain a high resistance state "1" or a low resistance state "0".

The wires 4a and 2d are perpendicular to each other for data writing for a cell at the intersection.

The wires 4a and 2d are used for data writing. When data is being written, an electrical field is generated in the functional layer by applying appropriate positive and negative voltages to 4a and 2d, so as to change the resistivity of the conductive layer, thereby storing "0" and "1" of data.

The array thus formed is similar to those described in Examples 1 and 2, as shown in FIG. 6.

Example 6

The present invention provides a novel memory cell array of electrical field modulation type. FIG. 5D (FIG. 5D1, FIG. 5D2 and FIG. 5D3) exemplifies the structure of the cell array.

The conductive layer of the multi-layer film in the cell is connected to 2a, 2b and 2c via 1a, 1b and 1c. The bottom layer on the back of the substrate is connected to 2d via 1d, wherein 2a and 2d are metal wires adapted for connecting all memory cells, 2a and 2d are on the same layer and parallel to each other, and 2b and 2c are transition metal layers.

The electrodes of the transition metal layers 2b and 2c are connected to wires 4a and 4b through via holes 3a and 3b, respectively, wherein 4a and 4b are metal wires adapted for connecting all memory cells, and 4a and 4b are on the same layer and parallel to each other.

The wires 2a and 4b are perpendicular to each other for data reading for a cell at the intersection.

When the wires 2a and 4b are being used for data reading, a low current is passed between 2a and 4b and the voltages at both ends are measured to thereby obtain a high resistance state "1" or a low resistance state "0".

The wires 4a and 2d are perpendicular to each other for data writing for a cell at the intersection.

The wires 4a and 2d are used for data writing. When data is being written, appropriate positive and negative voltages are applied to 4a and 2d to generate an electrical field in the functional layer to change the resistivity of the conductive layer, thereby storing "0" and "1" of data. The array thus formed is similar to those described in Examples 1 and 2, as shown in FIG. 6.

Example 7

The present invention provides a novel memory cell array of electrical field modulation type. FIG. 5E (FIG. 5E1, FIG. 2E2 and FIG. 5E3) exemplifies the structure of the cell array.

The conductive layer of the multi-layer film in the cell is connected to 2a and 2b via 1a and 1b. The buffer layer is connected to 2c via 1c. The bottom layer on the back of the substrate is connected to 2d via 1d.

The multi-layer film in the cell is connected to 2a, 2b, 2c and 2d via 1a, 1b, 1c, and 1d, respectively, wherein 2a and 2d are metal wires adapted for connecting all memory cells, 2a and 2d are on the same layer and parallel to each other, and 2b and 2c are transition metal layers.

The electrodes of the transition metal layers 2b and 2c are connected to wires 4a and 4b through via holes 3a and 3b, respectively, wherein 4a and 4b are metal wires adapted for connecting all memory cells, and 4a and 4b are on the same layer and parallel to each other.

The wires 2a and 4b are perpendicular to each other for data reading for a cell at the intersection.

When the wires 2a and 4b are being used for data reading, a low current is passed between 2a and 4b and the voltages at both ends are measured to thereby obtain a high resistance state "1" or a low resistance state "0".

The wires 4a and 2d are perpendicular to each other for data writing for a cell at the intersection.

The wires 4a and 2d are used for data writing. When data is being written, appropriate positive and negative voltages are applied to 4a and 2d to generate an electrical field in the functional layer to change the resistivity of the conductive layer, thereby storing "0" and "1" of data. The array thus formed is similar to those described in Examples 1 and 2, as shown in FIG. 6.

Example 8

The present invention provides a novel memory cell array of electrical field modulation type. FIG. 5F (FIG. 5F1, FIG. 5F2 and FIG. 5F3) exemplifies the structure of the cell array.

The conductive layer of the multi-layer film in the cell is connected to 2a, 2b and 2c via 1a, 1b and 1c. The bottom layer on the back of the substrate is connected to 2d via 1d, wherein 2a and 2d are metal wires adapted for connecting all memory cells, 2a and 2d are on the same layer and parallel to each other, and 2b and 2c are transition metal layers.

The electrodes of the transition metal layers 2b and 2c are connected to wires 4a and 4b through via holes 3a and 3b, respectively, wherein 4a and 4b are metal wires adapted for connecting all memory cells, and 4a and 4b are on the same layer and parallel to each other.

The wires 2a and 4b are perpendicular to each other for data reading for a cell at the intersection.

When the wires 2a and 4b are being used for data reading, a low current is passed between 2a and 4b and the voltages at both ends are measured to thereby obtain a high resistance state "1" or a low resistance state "0".

The wires 4a and 2d are perpendicular to each other for data writing for a cell at the intersection.

The wires 4a and 2d are used for data writing. When data is being written, appropriate positive and negative voltages are applied to 4a and 2d to generate an electrical field in the functional layer to change the resistivity of the conductive layer, thereby storing "0" and "1" of data. The array thus formed is similar to those described in Examples 1 and 2, as shown in FIG. 6.

Example 9

According to Example 1, an electrical field is applied to the memory cell not in a mode of vertical-direction application but in a mode of in-plane application. The structure is shown in FIG. 5G (FIG. 5G1, FIG. 5G2, FIG. 5G3, FIG. 5G4, FIG. 5G5 and FIG. 5G6), wherein the electrodes for applying an electrical field are at both ends of the functional layer so as to apply an in-plane electrical field.

Example 10

Figure 7A:
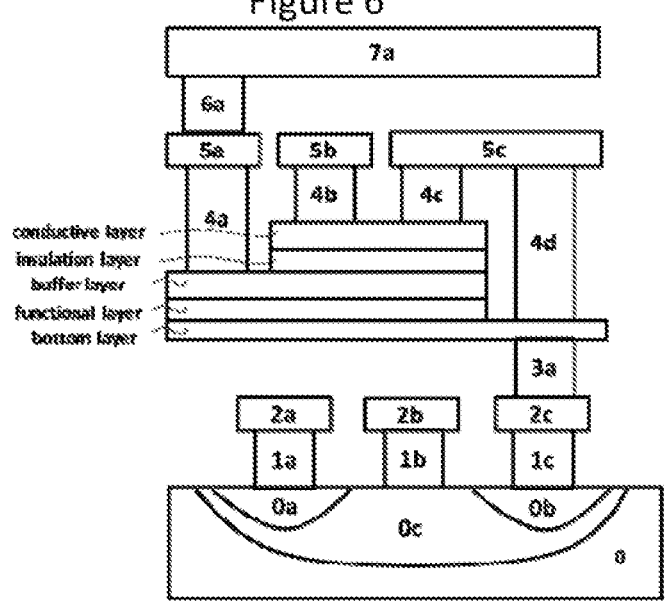
FIGS. 7A, 7B and 7C are cross-sectional views and plan views showing the structures of memory cells of electrical field modulation type having transistors.
Figure 7B:
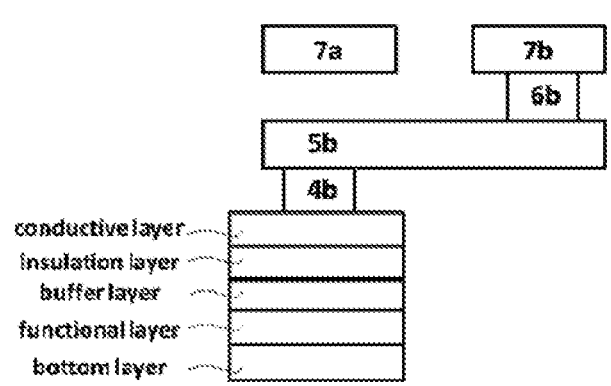
Figure 7C:
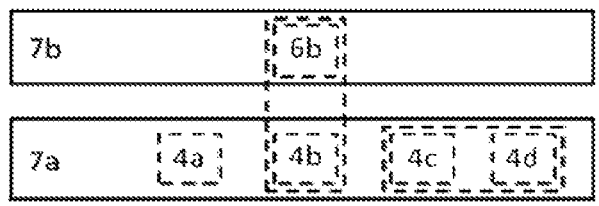

The present invention further provides a novel memory cell array of electrical field modulation type. FIG. 7 (FIG. 7A, FIG. 7B and FIG. 7C) exemplifies the structure of the cell array.

The bottom layer of the multi-layer film in the cell is connected to the drain electrode 2c of the transistor through via a hole 3a.

The source electrode of the transistor in the cell is connected to the wire 2a via 1a. The wire 2a connects the source electrodes of all the transistors and ground them.

The gate of the transistor is connected to the wire 2b via 1b. The wire 2b connects the gates in all the cells.

The bottom layer of the multi-layer film in the cell is connected to the metal wire 5c through a via hole 4d. The conductive layer is connected to the metal wire 5c through a via hole 4c. The metal wire 5c is grounded.

The conductive layer of the multi-layer film in the cell is connected to Sb via 4a. The buffer layer is connected to 5a via 4a.

In the cell, 5a and 5b are connected to metal wires 7a and 7b via 6a and 6b, respectively. The metal wires 7a and 7b are on the same layer and parallel to each other.

Both of the metal wires 7a and 7b are perpendicular to the metal wire 2b, wherein 7a and 2b are adapted for writing data, and 7b and 2b for reading data.

When the wires 7b and 2b are being used for data reading, a low current is passed between 7a and 2b and the voltages at both ends are measured to thereby obtain a high resistance state "1" or a low resistance state "0".

The wires 7a and 2b are used for data writing. When data is being written, appropriate positive and negative voltages are applied to 7a and 2b to generate an electrical field in the functional layer to change the resistivity of the conductive layer, thereby storing "0" and "1" of data.

Based on such a cell structure, the form shown in FIG. 5A constitutes a memory cell array. Wherein, each cell is connected with three operable metal wires and one ground wire. Metal wire 2b, corresponding to WRL shown in FIG. 6, is adapted for forming a cross structure together with a metal wire for reading or for writing, so as to select a memory cell. WRL is adapted for opening the transistor in the bottom of the cell. Metal wires 7b and 2b are adapted for reading data, wherein 7b corresponds to the metal wire RL, as shown in FIG. 5A.

When data is being read, an appropriate positive voltage is applied to WRL to thereby open the transistor in the cell. Meanwhile, a positive voltage is applied to RL to read the data of the selected cell.

The metal wires 7a and 2b are adapted for reading data, wherein 7a corresponds to the metal wire WL, as shown in FIG. 5A. When data is being written, an appropriate positive voltage is applied to WRL to thereby open the transistor in the cell. Meanwhile, a voltage is applied to WL to write data into the selected cell. An appropriate positive or negative voltage is applied between the metal wires WL and WRL to reverse the electrical dipole moment of the functional layer, thereby writing data into the conductive layer.

Example 11

Figure 8B:
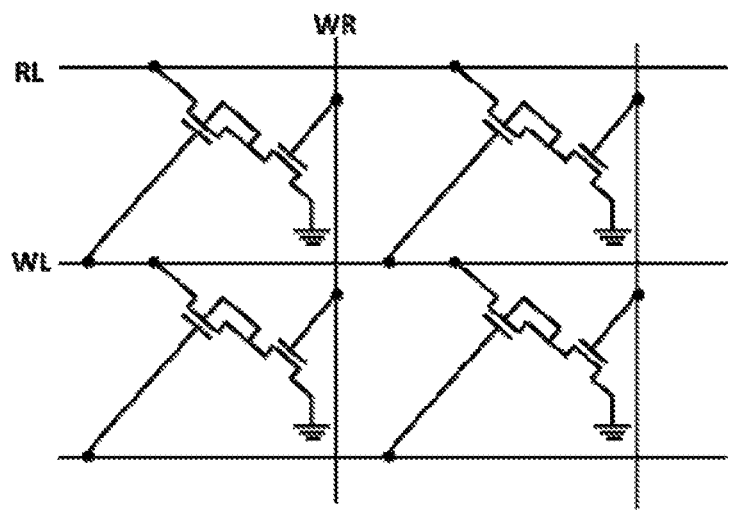

According to the cell array structure set forth in Example 8, an array shown in FIG. 8B is constituted.

Wherein, each cell is connected to three operable metal wires. In addition, the source electrode of each transistor is grounded directly through a metal via hole.

Example 12

Figure 9:
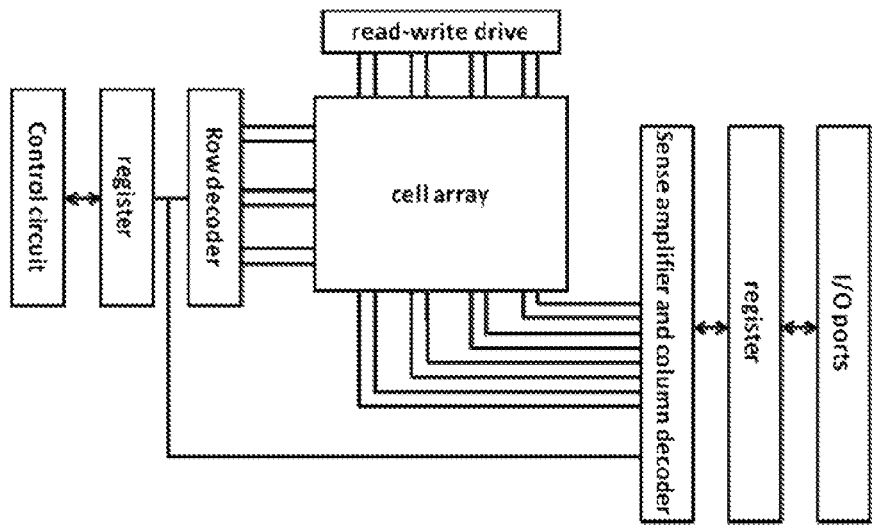
FIG. 9 is a schematic view showing the overall structure of a random access memory based on memory cells of electrical field modulation type according to the present invention.

According to one example of the present invention, a random access memory based on the novel array of electric-field-modulated memory cells as set forth in Example 1 is provided. FIG. 9 shows the overall structure of the random access memory in this example, the random access memory comprising a basic row decoder, a sense amplifier and a column decoder, a register, a control circuit, a read-write drive, a register, input and output, etc. The memory array disclosed in any of the aforementioned examples and the corresponding read-write circuit can be used as the memory array and the read-write circuit thereof in this example. It is worth noting that the structure chart in this example is only a particular example of the design of a memory, and some changes made to the structure chart, e.g., changes in the structure of the array and in the wiring, are within the scope of spirit of the design of this structure and all should be included in and belong to the design of this example.

Example 13

According to one example of the present invention, similar to Example 10, a random access memory based on the novel memory cell array of electrical field modulation type as set forth in Example 2, 3, 4, 5, 6, 7, 8 or 9 is provided.

Example 14

Figure 10A:
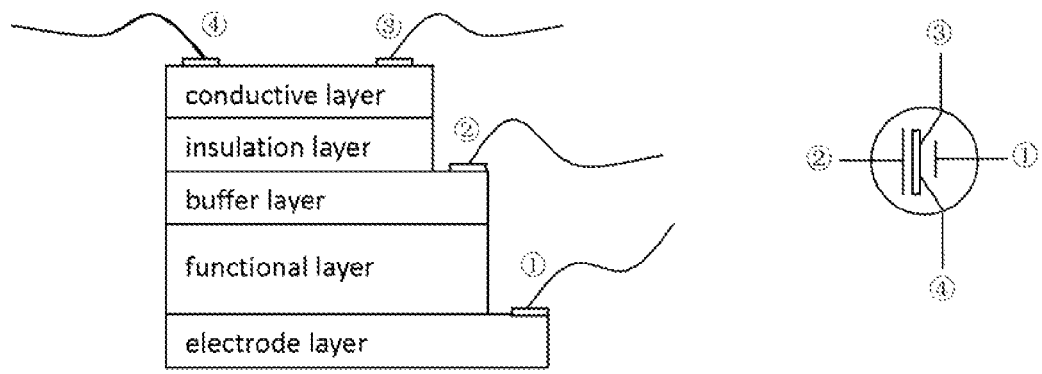
FIG. 10A shows the core structure of an ER FET, to which an electrical field is vertically applied, and the self-defined electrical symbols.
Figure 10B:
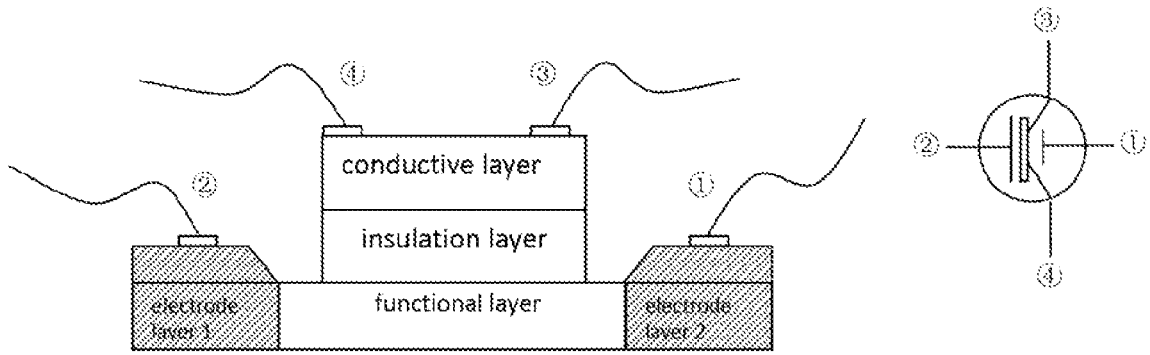
FIG. 10B shows the core structure of an ER FET, to which an electrical field is horizontally applied, and the self-defined electrical symbols.

FIGS. 10A and 10B show the core structure of an ER FET (FET-ER1) and the self-defined electrical symbols. Its structure is an electrode layer/a functional layer/a buffer layer/an insulating barrier layer/a conductive layer, and a FET shown in FIG. 10 is obtained by film deposition and photolithography. The FET has four electrodes in all, wherein two electrodes from each of the bottom layer and the buffer layer are used as the control electrodes ① and ②, and also two electrodes ③ and ④ at both ends of the conductive layer are connected to an external circuit. When a forward voltage is applied between the bottom layer and the buffer layer, it will form an electrical field in the functional layer, and when the voltage gradually increases from zero, the electrical field applied onto the functional layer gradually increases as well. When the electrical field is less than a certain threshold value, the resistance of the conductive layer does not change; however, when the electrical field exceeds the threshold value, the resistance of the conductive layer may change suddenly from a high resistance state to a low resistance state or from a low resistance state to a high impedance state. When the electrical field is reversed and exceeds a certain threshold value, the resistance of the conductive layer will change suddenly once again.

As seen in FIG. 10A and FIG. 10B, the four electrodes are located on different layers and the electrodes are insulated from each other by $SiO_2$, thus hierarchical wiring can be realized during the actual circuit design, which will greatly reduce the difficulty in wiring and can increase the number of integrated devices. There can be three wiring layers in the entire circuit: an electrode layer in the bottom generally serves as a reference layer of the wiring, with the potential of this layer unchanged, so it is positioned on the lowest layer of the multilayer circuit board, and in a set of circuit, a plurality of the FETs according to the invention can all be connected to this reference layer so as to uniformly connect to the reference potential; a buffer layer in the middle serves as a control layer of the wiring, and the control electrodes of all the FETs are located on this layer; a conductive layer at the top serves as a circuit layer of the wiring, with most of the circuit being disposed on this layer, and this layer can be connected to the control layer through a via hole.

The potentials of the reference layer and the control layer as mentioned above may be crossly exchanged, so that the FET can vary between a high resistance state and a low resistance state, as shown in Type 1 of Table 1; however, this method causes each FET to have an additional peripheral circuit, thereby lowering the integration level. Similarly, the potential of the reference layer may remain zero, i.e., be grounded, then the voltage of the control layer must have both the function of inputting a positive voltage and the function of inputting a negative voltage, in order for the FET according to the invention to vary between a high resistance state and a low resistance state, as shown in Type 2 of Table 1. This type of control mode requires an additional circuit for generating a negative voltage, but each transistor does not need an additional external circuit; the potential of the reference layer can also be kept at a constant value $V_m$, then a high voltage $V_H$ or a low voltage $V_L$ is applied to the control layer, wherein $V_m=(V_H+V_L)/2$, it is defined that $V_A=V_H-V_m$, the electrical field generated by $V_A$ is greater than the reversed electrical field of electroresistance, whereby a switch between a high resistance state and a low resistance state can be achieved when the voltage on the electrode varies between a high voltage and a low voltage, as shown in Type 3 of Table 1. The design of such a circuit is the simplest, but the selection of the reference voltage needs to be very precise, otherwise a misoperation will be caused.

TABLE 1

Listing of Control States (FET-ER1)

| Type | Control Layer | Reference Layer | Circuit Layer |
|---|---|---|---|
| 1 | High Voltage | Zero Voltage | Low resistance state |
|   | Zero Voltage | High Voltage | High resistance state |
| 2 | Positive Voltage | Zero Voltage | Low resistance state |
|   | Negative Voltage | Zero Voltage | High resistance state |
| 3 | High Voltage | Reference Voltage | Low resistance state |
|   | Zero Voltage | Reference Voltage | High resistance state |

Example 15

Figure 11A:
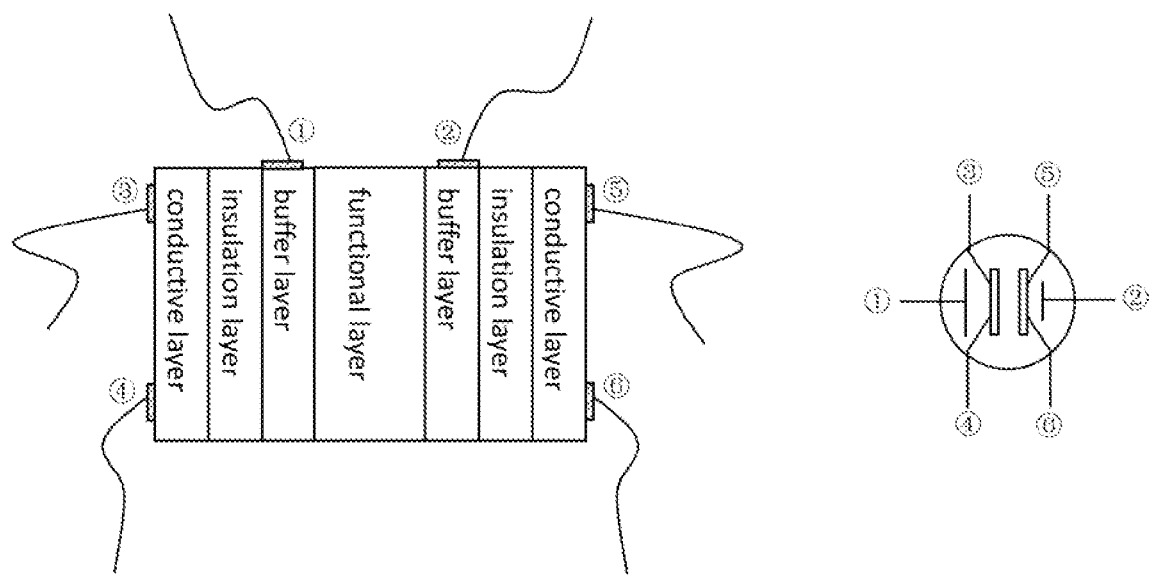
FIG. 11A shows the basic structure of a complementary ER FET, to which an electrical field is vertically applied, and the self-defined electrical symbols.
Figure 11B:
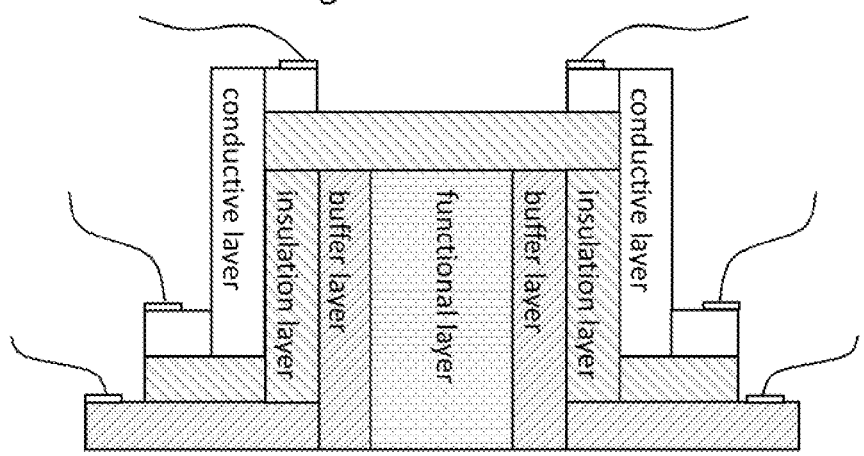
FIG. 11B is a diagram showing the technological structure of a complementary ER FET, to which an electrical field is vertically applied.
Figure 11C:
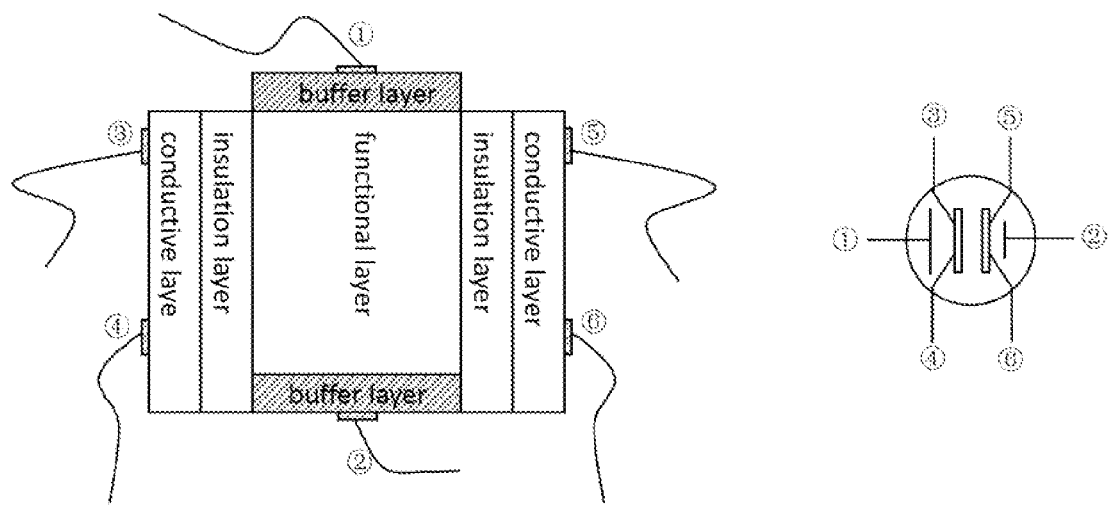
FIG. 11C shows the basic structure of a complementary ER FET, to which an electrical field is horizontally applied, and the self-defined electrical symbols.
Figure 11D:
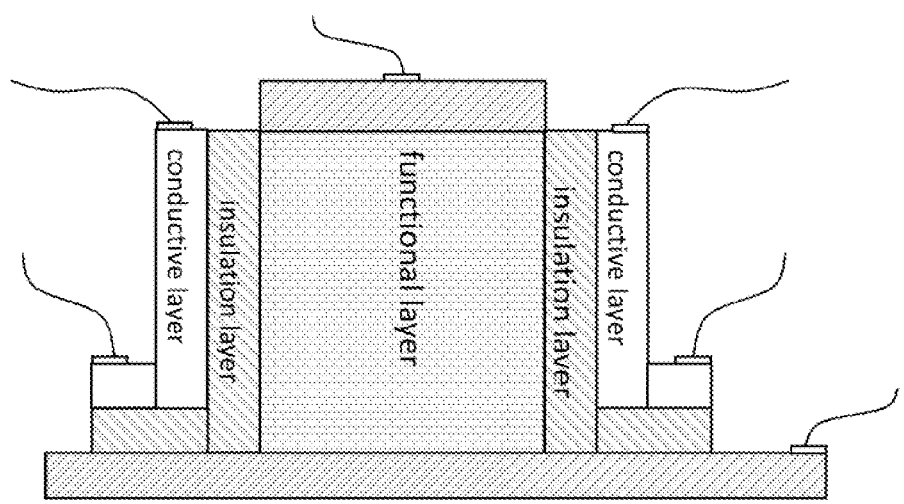
FIG. 11D is a diagram showing the technological structure of a complementary ER FET, to which an electrical field is horizontally applied.

FIGS. 11A and 11C show the basic structure of a complementary ER FET (FET-ER2) and the self-defined electrical symbols. The basic structure of the complementary ER FET according to the invention is a conductive layer/an insulating barrier layer/a buffer layer/a functional layer/a buffer layer/an insulating barrier layer/a conductive layer. It has a total of six electrodes, wherein the two buffer layers have electrodes ① and ②, respectively, as the control electrodes, and the conductive layers on the left and right sides have electrodes ③ ④ and electrodes ⑤ ⑥, respectively, which can be connected to an external circuit. When voltages are applied to both the buffer layers, a polarized electrical field can be generated in the functional layer, and the electrical field will act on the conductive layers on the two sides to induce their resistances to reverse; however, since the conductive layers on the two sides are in reverse symmetry, their resistance states are just opposite and complementary to each other.

TABLE 2

Listing of Control States (FET-ER2)

| Type | Control Electrode 1 | Control Electrode 2 | Conductive Layer 1 | Conductive Layer 2 |
|---|---|---|---|---|
| 1 | High Voltage | Zero Voltage | High resistance state | Low resistance state |
|   | Zero Voltage | High Voltage | Low resistance state | High resistance state |
| 2 | Positive Voltage | Zero Voltage | High resistance state | Low resistance state |
|   | Negative Voltage | Zero Voltage | Low resistance state | High resistance state |
| 3 | High Voltage | Reference Voltage | High resistance state | Low resistance state |
|   | Zero Voltage | Reference Voltage | Low resistance state | High resistance state |

The complementary FETs can be controlled in three ways, as specified in Table 2. The first type is interleaving control, i.e., the positive or negative of the electrical field is controlled by switching between the voltages of the two control electrodes; the second type is positive-negative control, i.e., the voltage of one control electrode remains zero and the voltage of the other control electrode has two polarities, wherein when the polarity of said electrode's voltage is changed, the resistance state of the complementary FET will change as well, as shown in Type 2 of Table 2; the third type is reference control, i.e., the potential of the control electrode 2 is kept at the reference voltage, namely the constant value $V_m$, and a high voltage $V_H$ or a zero voltage is applied to the control electrode 1, wherein $V_m=V_H/2$ (it is defined that $V_A=V_H-V_m$), the electrical field generated by $V_A$ is greater than the reversed electrical field of electroresistance, whereby a switch between a high resistance state and a low resistance state can be achieved when the voltage on the electrode varies between a high voltage and a low voltage, as shown in Type 3 of Table 2.

As seen in FIG. 11, the six electrodes are located on different layers and the electrodes are insulated from each other by $SiO_2$, thus hierarchical wiring can be realized during the actual circuit design. There can be three wiring layers in the entire circuit: in the bottom is a control layer of the wiring, with the control electrodes of all the FETs being located on this layer; a conductive layer in the middle serves as a circuit layer 1 of the wiring, a conductive layer at the top serves as a circuit layer 2 of the wiring, wherein most of the circuits are disposed on these two layers, and these two layers can be connected to each other and to the control layer through via holes.

Example 16

Figure 12A:
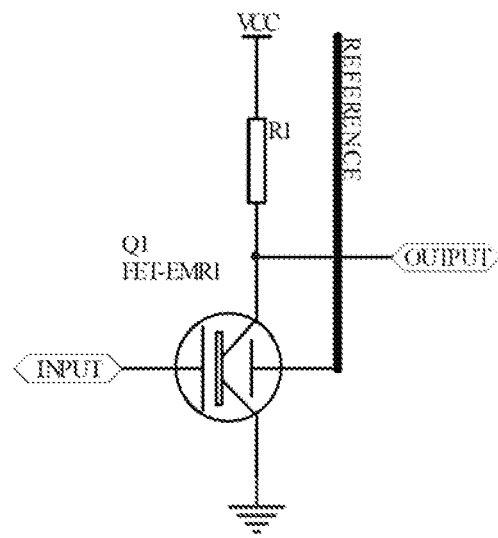
FIG. 12A shows an inverter circuit realized by using an ER FET.
Figure 12B:
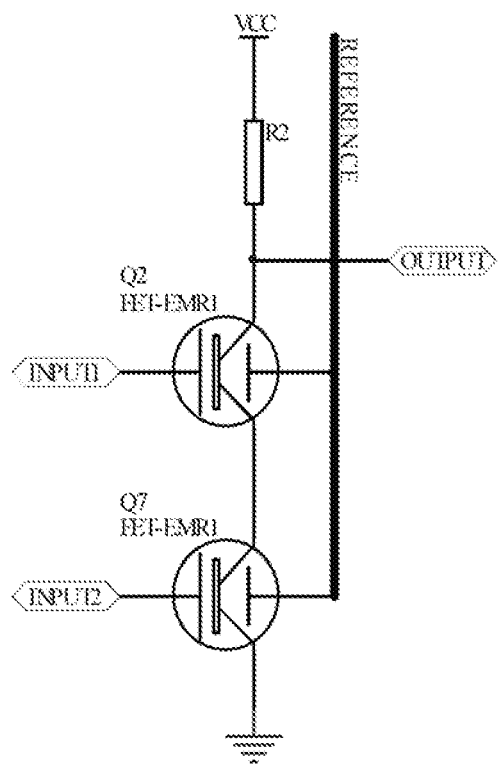
FIG. 12B shows a NAND gate circuit realized by using an ER FET.
Figure 12C:
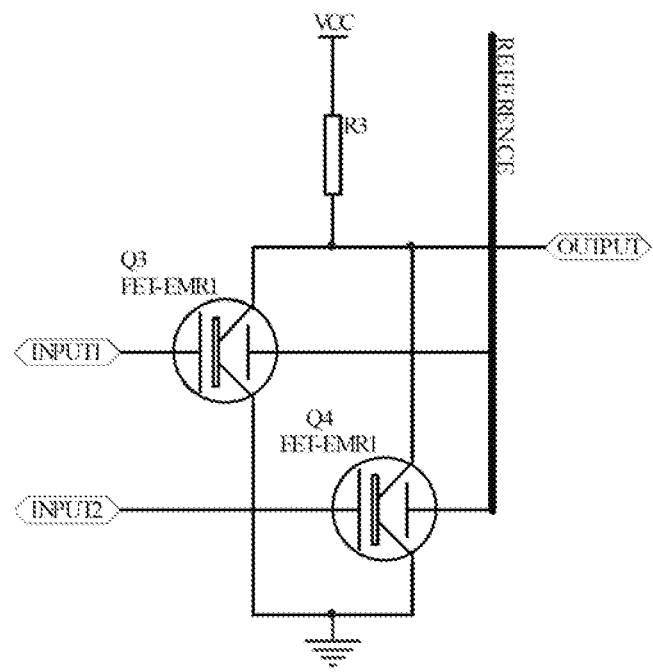
FIG. 12C shows a NOR gate circuit realized by using an ER FET.
Figure 13A:
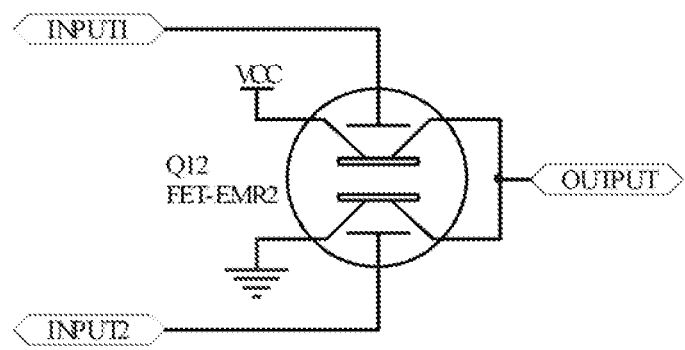
FIG. 13A shows an inverter circuit realized by using a complementary ER FET.
Figure 13B:
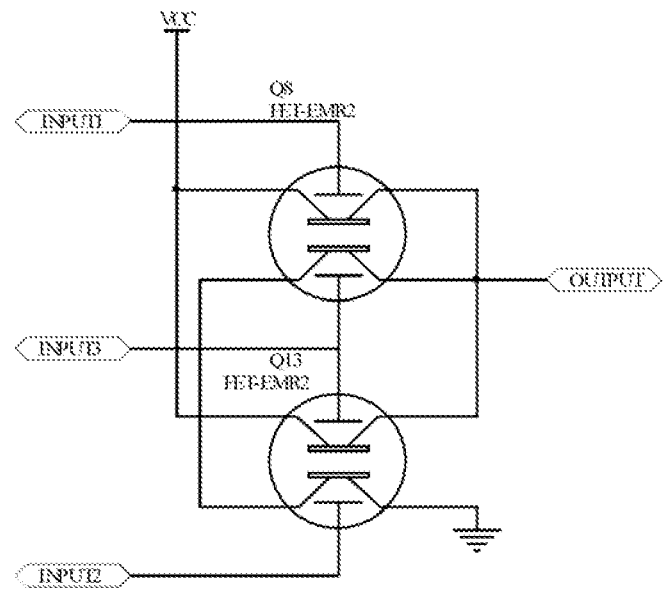
FIG. 13B shows a NAND gate circuit realized by using a complementary ER FET.
Figure 13C:
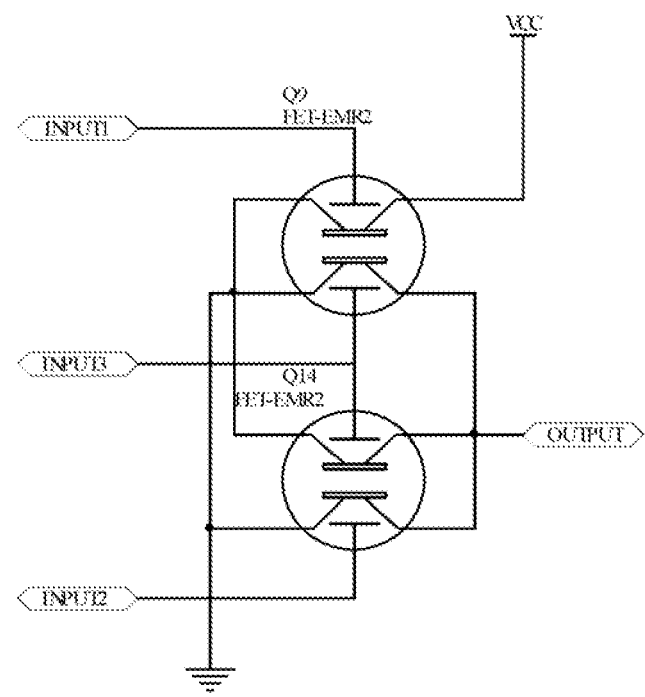
FIG. 13C shows a NOR gate circuit realized by using a complementary ER FET.

The basic circuits of an inverter, a NAND gate and a NOR gate can be obtained by using the FET-ER1 according to the invention and an externally applied conventional resistance, as shown in FIGS. 12A, 12B, and 12C, respectively. Next, each of the circuits will be described separately.

The logic circuit of an inverter is shown in FIG. 12A, wherein R1 is an external resistor, and Q1 is the FET-ER1 according to the invention. The FET has a total of four electrodes, two of which are control electrodes and the other two are connected to external circuits. One of the two control electrodes is connected to a reference voltage REFERENCE, and the other serves as an input port INPUT, and the output port OUTPUT is as shown in the figure.

The reference voltage REFERENCE may be a constant value $V_m$, a high voltage $V_H$ or a zero voltage is applied to the input port INPUT, wherein $V_m=V_H/2$, it is defined that $V_\Delta=V_H-V_m$, the electrical field generated by $V_\Delta$ is greater than the reversed electrical field of electroresistance, whereby a switch between a high resistance state and a low resistance state can be achieved when the voltage on the electrode varies between a high voltage and a low voltage.

The logic state of the entire circuit is shown in Table 3A. In case of high-level input, i.e., logic 1, according to the state of control of the FET-ER1 as shown in Type 3 of Table 1, the FET then is in a low resistance state RL. When RL<<R1, according to the relationship of voltage division in series, then VRL<<VR1, the output is a low voltage i.e., logic 0. Similarly, in case of low-level input, i.e., logic 0, according to the state of control of the FET-ER1 as shown in Type 3 of Table 1, the FET then is in a high resistance state RH. When RH>>R1, according to the relationship of voltage division in series, then VRL>>VR1, the output is a high voltage, i.e., logic 1. Therefore the logic functions of the inverter can be achieved.

TABLE 3A

Logic state table of a FET-ER1 inverter (OUTPUT = $\overline{\text{INPUT}}$)

| REFERENCE | INPUT | OUTPUT | Q1 |
| --- | --- | --- | --- |
| Constant Value $V_m$ | 1 | 0 | Low resistance state $R_L$ |
| Constant Value $V_m$ | 0 | 1 | High resistance state $R_H$ |

The logic circuit of a NAND gate is shown in FIG. 12B, wherein R2 is an external resistor, Q2 and Q7 are each the FET-ER1 according to the invention, and they are connected in series with the resistor in the circuit. Each of the FETs has four electrodes, two of which are control electrodes and the other two are connected to external circuits. One of the two control electrodes is connected to a reference voltage REFERENCE, and the other serves as an input port INPUT. The two input ports are labeled INPUT1 and INPUT2, respectively. The output port OUTPUT is as shown in the figure.

As concerns each said FET-ER1, the reference voltage REFERENCE may be a constant value $V_m$, a high voltage $V_H$ or a zero voltage is applied to the input port INPUT, wherein $V_m=V_H/2$, it is defined that $V_\Delta=V_H-V_m$, the electrical field generated by $V_\Delta$ is greater than the reversed electrical field of electroresistance, whereby a switch between a high resistance state and a low resistance state can be achieved when the voltage on the electrode varies between a high voltage and a low voltage.

TABLE 3B

Logic state table of FET-ER1 and a NAND gate (OUTPUT = $\overline{\text{INPUT1·INPUT2}}$)

| REFERENCE | INPUT1 | INPUT2 | OUTPUT | Q2 | Q7 |
| --- | --- | --- | --- | --- | --- |
| Constant Value $V_m$ | 0 | 0 | 1 | High resistance state $R_H$ | High resistance state $R_H$ |
| Constant Value $V_m$ | 0 | 1 | 1 | High resistance state $R_H$ | High resistance state $R_H$ |
| Constant Value $V_m$ | 1 | 0 | 1 | Low resistance state $R_L$ | High resistance state $R_H$ |
| Constant Value $V_m$ | 1 | 1 | 0 | Low resistance state $R_L$ | Low resistance state $R_L$ |

The logic state of the entire circuit is shown in Table 3B. The low resistance state and the high resistance state of the FET satisfy RH>>R2>>RL. The specific analysis is as follows:

In case of low-level INPUT1 and INPUT2, i.e., logic 0, according to the state of control of the FET-ER1 as shown in Type 3 of Table 1, each of the two FETs then is in a high resistance state RH. According to the relationship of voltage division in series, then VRH1+VRH2>>VR2, the output is a high voltage, i.e., logic 1.

In case of low-level INPUT1, i.e., logic 0, and high-level INPUT2, i.e., logic 1, according to the state of control of the FET-ER1 as shown in Type 3 of Table 1, the FET corresponding to INPUT1 then is in a high resistance state RH1, while the FET corresponding to INPUT2 then is in a low resistance state RL2. According to the relationship of voltage division in series, then VRH1+VRL2>>VR2, the output is a high voltage, i.e., logic 1.

In case of high-level INPUT1, i.e., logic 1, and low-level INPUT2, i.e., logic 0, according to the control state of the FET-ER1 as shown in Type 3 of Table 1, the FET corresponding to INPUT1 then is in a low resistance state RL1, while the FET corresponding to INPUT2 then is in a high resistance state RH2. According to the relationship of voltage division in series, then VRL+VRL2>>VR2, the output is a high voltage, i.e., logic 1.

In case of high-level INPUT1 and INPUT2, i.e., logic 1, according to the control state of the FET-ER1 as shown in Type 3 of Table 1, both of the two FETs are in a low resistance state RL1. According to the relationship of voltage division in series, then VRL1+VRL2<<VR2, the output is a low voltage, i.e., logic 0.

Example 17

A look-up table of a nonvolatile field programmable gate array (FPGA) can be obtained by using the FET-ER1 and the complementary FET-ER2 according to the invention. By means of a random access memory based on an ER effect, a FPGA which is fully based on such ER effect can be obtained and, accordingly, can entirely replace the existing FPGA fabricated with a semiconductor device.

Figure 14:
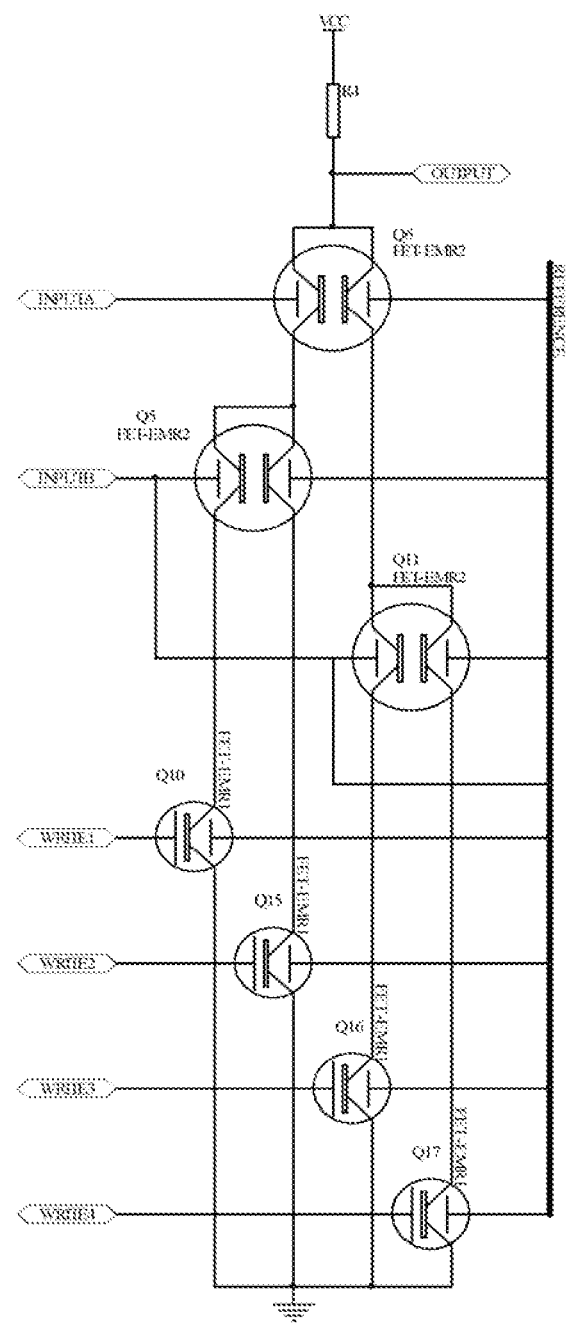
FIG. 14 shows a circuit with a two-channel input LUT (look-up table) function in a FPGA that is realized by using an ER FET and a complementary ER FET.

In this example, a basic circuit of a look-up table with double input channels is introduced, as shown in FIG. 14A, and a look-up table with $2^n$ input channels can also be designed according to this principle. Hereinafter, the circuit of a look-up table with double input channels is introduced in detail.

Q5, Q6 and Q11 are each a complementary ER FET-ER2, Q10, Q15, Q16 and Q17 are each an ER FET-ER1, and R4 is a pull-up network. The electrodes of each FET are connected as shown in the figure. INPUT1 and INPUT2 serve as strobe input ports, and WRITE1, WRITE2, WRITE3 and WRITE4 are state write ports. Any one of Q10, Q15, Q16 and Q17 can be gated by INPUT1 and INPUT2. In this way, the resistance state of Q10, Q15, Q16 or Q17 can be read through the pull-up network R4. In addition, the resistance state of Q10, Q15, Q16 or Q17 can be artificially pre-set through WRITE1, WRITE2, WRITE3 or WRITE4, so that it can be used in any two-input logic operation. According to theoretical calculations, each device has two states, so there should be $2^4=16$ combinations of states, i.e., sixteen kinds of logical operations. Hereinafter, some basic logic operation truth tables, including NAND Gate Truth Table 5B, are introduced.

TABLE 5A

Listing of Strobe of a look-up table in FPGA

| INPUTA | INPUTB | Strobe Device | Resistance State of Device |
|---|---|---|---|
| 0 | 0 | Q10 | High resistance state/Low resistance state |
| 0 | 1 | Q15 | High resistance state/Low resistance state |
| 1 | 0 | Q16 | High resistance state/Low resistance state |
| 1 | 1 | Q17 | High resistance state/Low resistance state |

TABLE 5B

NAND gate truth table (OUTPUT = $\overline{INPUT1 \cdot INPUT2}$)

| INPUTA | INPUTB | Strobe Device | Preset Resistance State of Device | OUTPUT |
|---|---|---|---|---|
| 0 | 0 | Q10 | High resistance state | 1 |
| 0 | 1 | Q15 | High resistance state | 1 |
| 1 | 0 | Q16 | High resistance state | 1 |
| 1 | 1 | Q17 | Low resistance state | 0 |

The nano multilayer film structure described below can be used in the above-mentioned core structure of the present invention.

The object of the present invention is to present a nano multilayer film of electrical field modulation type, a field effect transistor of electrical field modulation type, an electrical field sensor of switch type and a random access memory of electrical field drive type, configured to achieve a novel reversible ER effect by regulating nano multilayer films under an electrical field at room temperature, and to use the reversible ER effect in electronic devices.

Compared with the ordinary FETs, the novel FET controlled by electrical field according to the present invention is significantly different in the following aspects: on the one hand, the FET according to the invention is controlled by an electrical field and has a higher input impedance up to the order of MΩ, so that the input leakage current is relatively small and will not affect the signals input into the circuit; on the other hand, the FET according to the invention is non-volatile, i.e. the FET maintains the original resistance state when the electrical field working on the gate disappears, so, only one control pulse needs to be input in advance but does not need to be maintained during the work, thereby greatly reducing the electrical loss of the circuit and reducing the power consumption of devices.

Example 18

Figure 15A:
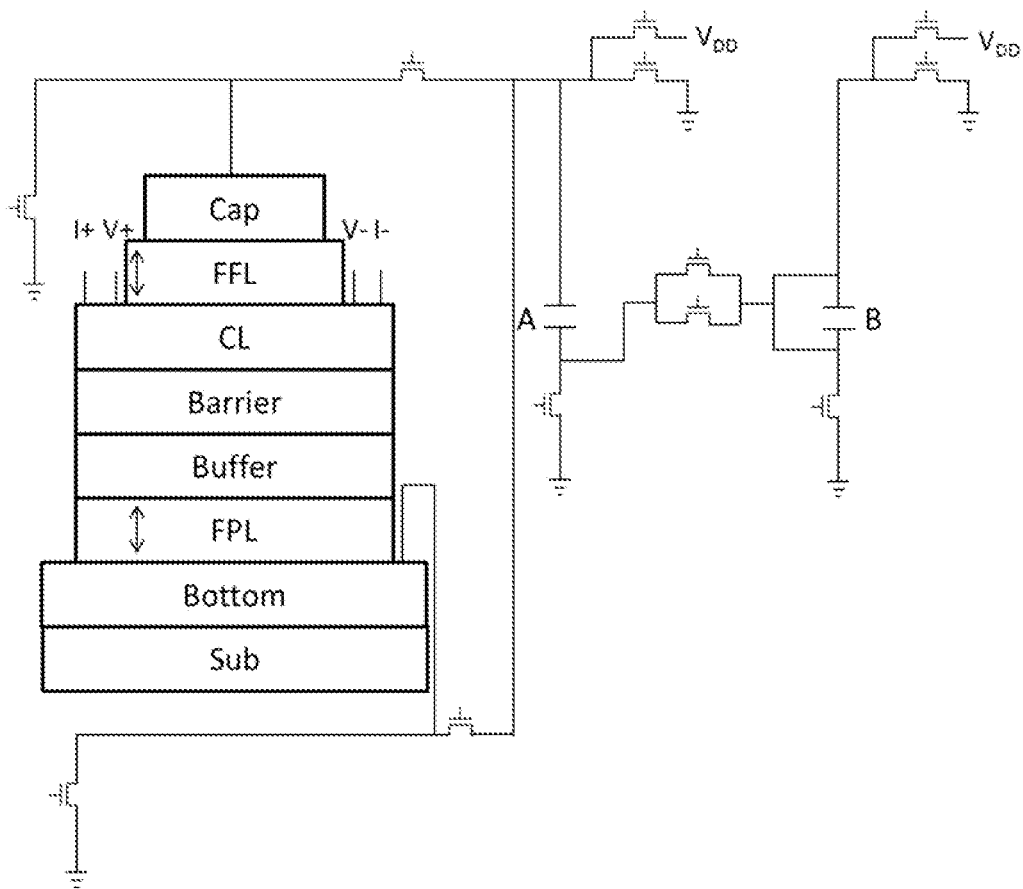
FIG. 15A is a schematic view showing a logic device based on Structure h in Scheme 2.

FIG. 15A is a schematic view showing a logic device based on structure h in Scheme 2, and FIG. 15B is the corresponding truth table. Structure: a substrate/a bottom layer/a functionally pinning layer (FPL)/a buffer layer/a barrier layer/a conductive layer (CL)/a functionally free layer (FFL)/a cap layer.

Wherein, the substrate is an insulating material; the bottom layer is a conductive material for applying an electrical field to the functionally pinning layer and the functionally free layer; the functionally pinning layer is a ferroelectric or multi-ferric material, which can alter and regulate the intensity and the direction of polarization under the action of an electrical field; the buffer layer is a conductive material for reducing the roughness of the barrier layer; the barrier layer is an oxide; the conductive layer is a conductive inorganic or organic material; the functionally free layer is a ferroelectric or multiferroic material, which can alter and regulate the intensity and the direction of polarization under the action of an electrical field; the cap layer is a protective layer for preventing the oxidation of the structure.

Circuit Connection:

1. Four collinear point electrodes are obtained on the surface of the cap layer by such methods as UV exposure, argon ion etching, and post-deposition of metals: the resistance in a high resistance state is denoted by a logic output "1" (the polarization intensity of the functionally pinning layer is downward, and the polarization intensity of the functionally free layer is downward), and the resistance in a low resistance state is denoted by a logic output "0" (the polarization intensity of the functionally pinning layer is downward, and the polarization intensity of the functionally free layer is upward; the polarization intensity of the functionally pinning layer is upward, and the polarization intensity of the functionally free layer is downward; the polarization intensity of the functionally pinning layer is upward, and the polarization intensity of the functionally free layer is upward).

2. Two identical input electrical field intensities $E_A$ and $E_B$ are applied between the bottom layer and the cap layer, wherein both $E_A$ and $E_B$ are greater than the coercive field intensity of the functionally free layer but smaller than the coercive field intensity of the functionally pinning layer, and $E_A+E_B$ is greater than the coercive field intensity of the functionally pinning layer. $E_A$, $E_B>0$ is denoted by a logic input "1", and $E_A$, $E_B<0$ is denoted by a logic input "0".

NAND Logic (See FIG. 15B1 for the Truth Table)

1. Input logic states A=0, B=0, so that the polarization intensity of the functionally pinning layer is downward and the polarization intensity of the functionally free layer is downward, and set the initial output logic state C=1;

2. Rules for logical operation:

1) input logic states A=0, B=0, so that the polarization intensity of the functionally pinning layer is downward and the polarization intensity of the functionally free layer is downward, and output a logic state C=1;

2) input logic states A=0, B=1, so that the polarization intensity of the functionally pinning layer is downward and the polarization intensity of the functionally free layer is downward, and output a logic state C=1;

3) input logic states A=1, B=0, so that the polarization intensity of the functionally pinning layer is downward and the polarization intensity of the functionally free layer is downward, and output a logic state C=1; and 4) input logic states A=1, B=1, so that the polarization intensity of the functionally pinning layer is upward and the polarization intensity of the functionally free layer is upward, and output a logic state C=0.

NOR Logic (See FIG. 15B2 for the Truth Table)

1. Input logic states A=0, B=0, so that the polarization intensity of the functionally pinning layer is downward and the polarization intensity of the functionally free layer is downward; disconnect input B and input a logic state A=1, so that the polarization intensity of the functionally pinning layer is downward and the polarization intensity of the functionally free layer is upward, and set the initial output logic state C=0;

2. Rules for logical operation:

1) input logic states A=0, B=0, so that the polarization intensity of the functionally pinning layer is downward and the polarization intensity of the functionally free layer is downward, and output a logic state C=1;

2) input logic states A=0, B=1, so that the polarization intensity of the functionally pinning layer is downward and the polarization intensity of the functionally free layer is upward, and output a logic state C=0;

3) input logic states A=1, B=0, so that the polarization intensity of the functionally pinning layer is downward and the polarization intensity of the functionally free layer is downward, and output a logic state C=0; and 4) input logic states A=1, B=1, so that the polarization intensity of the functionally pinning layer is upward and the polarization intensity of the functionally free layer is upward, and output a logic state C=0.

NOR Logic (See FIG. 15B3 for the Truth Table)

1. Input logic states A=1, B=1, so that the polarization intensity of the functionally pinning layer is upward and the polarization intensity of the functionally free layer is upward; disconnect input B and input a logic state A=0, so that the polarization intensity of the functionally pinning layer is upward and the polarization intensity of the functionally free layer is upward, and set the initial output logic state C=0;

2. Rules for logical operation:

1) input logic states A=0, B=0, so that the polarization intensity of the functionally pinning layer is downward and the polarization intensity of the functionally free layer is downward, and output a logic state C=1;

2) input logic states A=0, B=1, so that the polarization intensity of the functionally pinning layer is upward and the polarization intensity of the functionally free layer is downward, and output a logic state C=0;

3) input logic states A=1, B=0, so that the polarization intensity of the functionally pinning layer is upward and the polarization intensity of the functionally free layer is downward, and output a logic state C=0; and 4) input logic states A=1, B=1, so that the polarization intensity of the functionally pinning layer is upward and the polarization intensity of the functionally free layer is upward, and output a logic state C=0.

NOR Logic (See FIG. 15B4 for the Truth Table)

1. Input logic states A=1, B=1, so that the polarization intensity of the functionally pinning layer is upward and the polarization intensity of the functionally free layer is upward, and set the initial output logic state C=0;

2. Rules for logical operation:

1) input logic states A=0, B=0, so that the polarization intensity of the functionally pinning layer is downward and the polarization intensity of the functionally free layer is downward, and output a logic state C=1;

2) input logic states A=0, B=1, so that the polarization intensity of the functionally pinning layer is upward and the polarization intensity of the functionally free layer is upward, and output a logic state C=0;

3) input logic states A=1, B=0, so that the polarization intensity of the functionally pinning layer is upward and the polarization intensity of the functionally free layer is upward, and output a logic state C=0; and 4) input logic states A=1, B=1, so that the polarization intensity of the functionally pinning layer is upward and the polarization intensity of the functionally free layer is upward, and output a logic state C=0.

Example 19

Figure 16A:
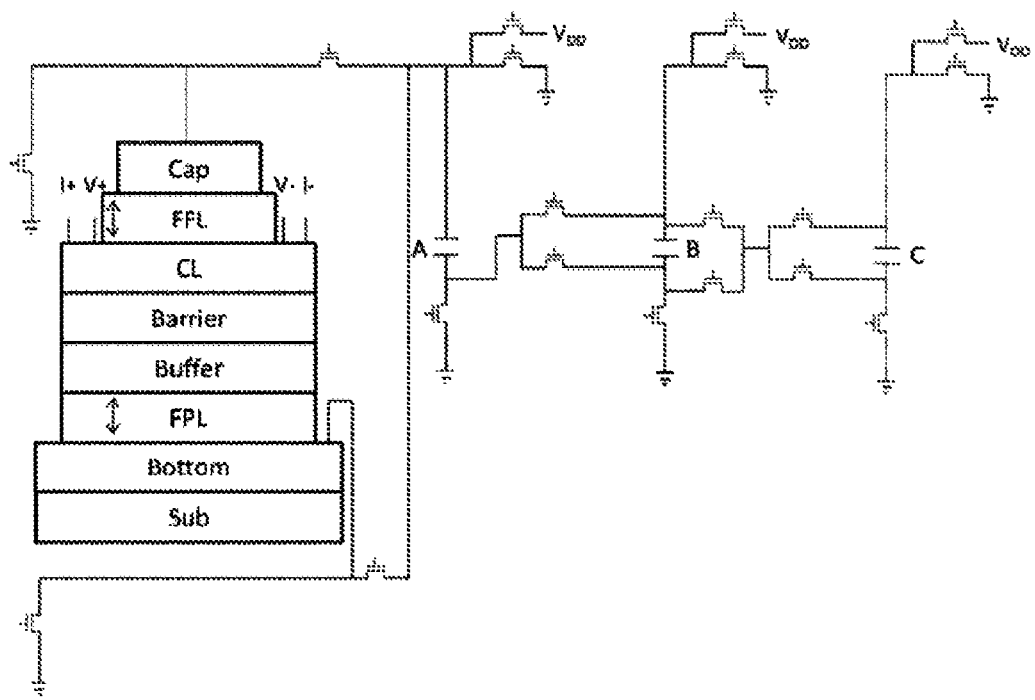
FIG. 16A is a schematic view showing a logic device based on Structure h in Scheme 3.

FIG. 16A is a schematic view showing a logic device based on Structure h in Scheme 3, and FIG. 16B is the corresponding truth table. Structure: a substrate/a bottom layer/a functionally pinning layer/a buffer layer/a barrier layer/a conductive layer/a functionally free layer/a cap layer.

Wherein, the substrate is of an insulating material; the bottom layer is of a conductive material for applying an electrical field to the functionally pinning layer and the functionally free layer; the functionally pinning layer is of a ferroelectric or multi-ferric material, which can alter and regulate the intensity and the direction of polarization under the action of an electrical field; the buffer layer is of a conductive material for reducing the roughness of the barrier layer; the barrier layer is of an oxide; the conductive layer is of a conductive inorganic or organic material; the functionally free layer is of a ferroelectric or multiferroic material, which can alter and regulate the intensity and the direction of polarization under the action of an electrical field; the cap layer is a protective layer for preventing the oxidation of the structure.

Circuit Connection:

1. Four collinear point electrodes are obtained on the surface of the cap layer by such methods as UV exposure, argon ion etching, and post-deposition of metals: the resistance in a high resistance state is denoted by a logic output "1" (the polarization intensity of the functionally pinning layer is downward, and the polarization intensity of the functionally free layer is downward), and the resistance in a low resistance state is denoted by a logic output "0" (the polarization intensity of the functionally pinning layer is downward, and the polarization intensity of the functionally free layer is upward; the polarization intensity of the functionally pinning layer is upward, and the polarization intensity of the functionally free layer is downward; the polarization intensity of the functionally pinning layer is upward, and the polarization intensity of the functionally free layer is upward).

2. Three identical input electrical field intensities $E_A$, $E_B$ and $E_C$ are applied between the bottom layer and the cap layer: both $E_A$ and $E_B$ are less than the coercive field intensity of the functionally free layer, $E_A+E_1$ is greater than the coercive field intensity of the functionally free layer, $E_A+E_B$ is smaller than the coercive field intensity of the functionally pinning layer, and $E_A+E_B+E_C$ is greater than the coercive field intensity of the functionally pinning layer. $E_A$, $E_B$ and $E_C>0$ is denoted by a logic input "1", and $E_A$, $E_B$ and $E_C<0$ is denoted by a logic input "0". Wherein, $E_C$ denotes a control input.

NOR Logic (See FIG. 16B1 for the Truth Table)

1. Input logic states A=0, B=0, C=0, so that the polarization intensity of the functionally pinning layer is downward and the polarization intensity of the functionally free layer is downward; disconnect input C and input logic states A=1, B=1, so that the polarization intensity of the functionally pinning layer is downward and the polarization intensity of the functionally free layer is upward, and set the initial output logic state D=0;

2. Rules for logical operation:

1) input logic states A=0, B=0, C=0, so that the polarization intensity of the functionally pinning layer is downward and the polarization intensity of the functionally free layer is downward, and output a logic state D=1;

2) input logic states A=0, B=1, C=0, so that the polarization intensity of the functionally pinning layer is downward and the polarization intensity of the functionally free layer is upward, and output a logic state D=0;

3) input logic states A=1, B=0, C=0, so that the polarization intensity of the functionally pinning layer is downward and the polarization intensity of the functionally free layer is upward, and output a logic state D=0; and 4) input logic states A=1, B=1, C=0, so that the polarization intensity of the functionally pinning layer is downward and the polarization intensity of the functionally free layer is upward, and output a logic state D=0.

NOR Logic (See FIG. 16B2 for the Truth Table)

1. Input logic states A=1, B=1, C=1, so that the polarization intensity of the functionally pinning layer is upward and the polarization intensity of the functionally free layer is upward; disconnect input C and input logic states A=0, B=0, so that the polarization intensity of the functionally pinning layer is upward and the polarization intensity of the functionally free layer is downward, and set the initial output logic state D=0;

2. Rules for logical operation:

1) input logic states A=0, B=0, C=0, so that the polarization intensity of the functionally pinning layer is downward and the polarization intensity of the functionally free layer is downward, and output a logic state D=1;

2) input logic states A=0, B=1, C=0, so that the polarization intensity of the functionally pinning layer is upward and the polarization intensity of the functionally free layer is downward, and output a logic state D=0;

3) input logic states A=1, B=0, C=0, so that the polarization intensity of the functionally pinning layer is upward and the polarization intensity of the functionally free layer is downward, and output a logic state D=0; and 4) input logic states A=1, B=1, C=0, so that the polarization intensity of the functionally pinning layer is upward and the polarization intensity of the functionally free layer is downward, and output a logic state D=0.

NOR Logic (See FIG. 16B3 for the Truth Table)

1. Input logic states A=1, B=1, C=1, so that the polarization intensity of the functionally pinning layer is upward and the polarization intensity of the functionally free layer is upward, and set the initial output logic state D=0;

2. Rules for logical operation:

1) input logic states A=0, B=0, C=0, so that the polarization intensity of the functionally pinning layer is downward and the polarization intensity of the functionally free layer is downward, and output a logic state D=1;

2) input logic states A=0, B=1, C=0, so that the polarization intensity of the functionally pinning layer is upward and the polarization intensity of the functionally free layer is upward, and output a logic state D=0;

3) input logic states A=1, B=0, C=0, so that the polarization intensity of the functionally pinning layer is upward and the polarization intensity of the functionally free layer is upward, and output a logic state D=0; and 4) input logic states A=1, B=1, C=0, so that the polarization intensity of the functionally pinning layer is upward and the polarization intensity of the functionally free layer is upward, and output a logic state D=0.

NAND Logic (See FIG. 16B4 for the Truth Table)

1. Input logic states A=0, B=0, C=0, so that the polarization intensity of the functionally pinning layer is downward and the polarization intensity of the functionally free layer is downward, and set the initial output logic state D=1;

2. Rules for logical operation:

1) input logic states A=0, B=0, C=1, so that the polarization intensity of the functionally pinning layer is downward and the polarization intensity of the functionally free layer is downward, and output a logic state D=1;

2) input logic states A=0, B=1, C=1, so that the polarization intensity of the functionally pinning layer is downward and the polarization intensity of the functionally free layer is downward, and output a logic state D=1;

3) input logic states A=1, B=0, C=1, so that the polarization intensity of the functionally pinning layer is downward and the polarization intensity of the functionally free layer is downward, and output a logic state D=1; and 4) input logic states A=1, B=1, C=1, so that the polarization intensity of the functionally pinning layer is upward and the polarization intensity of the functionally free layer is upward, and output a logic state D=0.

NAND Logic (See FIG. 16B5 for the Truth Table)

1. Input logic states A=0, B=0, C=0, so that the polarization intensity of the functionally pinning layer is downward and the polarization intensity of the functionally free layer is downward, and set the initial output logic state D=1;

2. Rules for logical operation:

1) input logic states A=0, B=0, C OFF, so that the polarization intensity of the functionally pinning layer is downward and the polarization intensity of the functionally free layer is downward, and output a logic state D=1;

2) input logic states A=0, B=1, C OFF, so that the polarization intensity of the functionally pinning layer is downward and the polarization intensity of the functionally free layer is downward, and output a logic state D=1;

3) input logic states A=1, B=0, C OFF, so that the polarization intensity of the functionally pinning layer is downward and the polarization intensity of the functionally free layer is downward, and output a logic state D=1; and 4) input logic states A=1, B=1, C OFF, so that the polarization intensity of the functionally pinning layer is downward and the polarization intensity of the functionally free layer is upward, and output a logic state D=0.

NOR Logic (See FIG. 16B6 for the Truth Table)

1. Input logic states A=0, B=0, C=0, so that the polarization intensity of the functionally pinning layer is downward and the polarization intensity of the functionally free layer is downward; disconnect input C and input logic states A=1, B=1, so that the polarization intensity of the functionally pinning layer is downward and the polarization intensity of the functionally free layer is upward, and set the initial output logic state D=0;

2. Rules for logical operation:

1) input logic states A=0, B=0, C OFF, so that the polarization intensity of the functionally pinning layer is downward and the polarization intensity of the functionally free layer is downward, and output a logic state D=1;

2) input logic states A=0, B=1, C OFF, so that the polarization intensity of the functionally pinning layer is downward and the polarization intensity of the functionally free layer is upward, and output a logic state D=0;

3) input logic states A=1, B=0, C OFF, so that the polarization intensity of the functionally pinning layer is downward and the polarization intensity of the functionally free layer is upward, and output a logic state D=0; and 4) input logic states A=1, B=1, C OFF, so that the polarization intensity of the functionally pinning layer is downward and the polarization intensity of the functionally free layer is upward, and output a logic state D=0.

Example 20

Figure 17A:
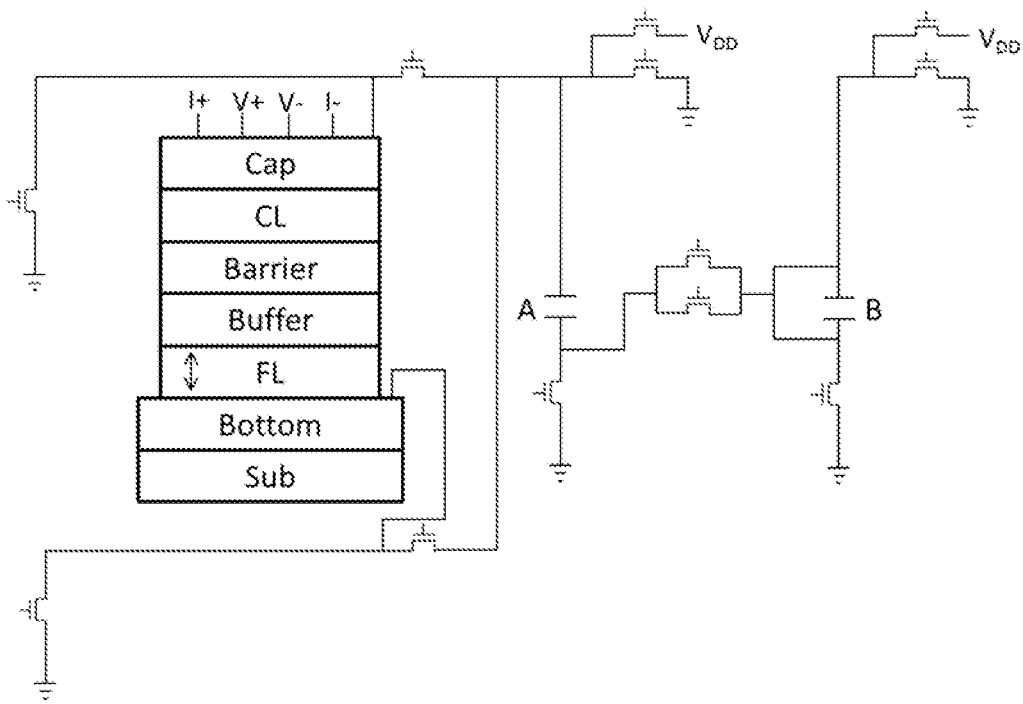
FIG. 17A is a schematic view showing a logic device based on Structure d in Scheme 1.

FIG. 17A is a schematic view showing a logic device based on Structure d in Scheme 1, and FIG. 17B is the corresponding truth table. Structure: a substrate/a bottom layer/a functional layer/a buffer layer/a barrier layer/a conductive layer/a cap layer.

Wherein, the substrate is of an insulating material; the bottom layer is of a conductive material for applying an electrical field to the functional layer; the functional layer is of a ferroelectric or multi-ferric material, which can alter and regulate the intensity and the direction of polarization under the action of an electrical field; the buffer layer is of a conductive material for reducing the roughness of the barrier layer; the barrier layer is of an oxide; the conductive layer is of a conductive inorganic or organic material; the cap layer is a protective layer for preventing the oxidation of the magnetic layer.

Circuit Connection:

1. Four point-contact electrodes are fabricated on the cap layer by a collinearly method: the resistance in a high resistance state is denoted by a logic output "1" (the polarization intensity of the functional layer is downward), and the resistance in a low resistance state is denoted by a logic output "0" (the polarization intensity of the functional layer is upward).

2. Two identical input electrical field intensities $E_A$ and $E_B$ are applied between the bottom layer and the cap layer: both $E_A$ and $E_B$ are less than the coercive field intensity of the functional layer, and $E_A+E_B$ is greater than the coercive field intensity of the functional layer. $E_A, E_B > 0$ is denoted by a logic input "1", and $E_A, E_B < 0$ is denoted by a logic input "0".

NAND Logic (See FIG. 17B1 for the Truth Table)

1. Input logic states A=0, B=0, so that the polarization intensity of the functional layer is downward, and set the initial output logic state C=1;

2. Rules for logical operation:

1) input logic states A=0, B=0, so that the polarization intensity of the functional layer is downward, and output a logic state C=1;

2) input logic states A=0, B=1, so that the polarization intensity of the functional layer is downward, and output a logic state C=1;

3) input logic states A=1, B=0, so that the polarization intensity of the functional layer is downward, and output a logic state C=1; and 4) input logic states A=1, B=1, so that the polarization intensity of the functional layer is upward, and output a logic state C=0.

NOR Logic (See FIG. 17B2 for the Truth Table)

1. Input logic states A=1, B=1, so that the polarization intensity of the functional layer is upward, and set the initial output logic state C=0;

2. Rules for logical operation:

1) input logic states A=0, B=0, so that the polarization intensity of the functional layer is downward, and output a logic state C=1;

2) input logic states A=0, B=1, so that the polarization intensity of the functional layer is upward, and output a logic state C=0;

3) input logic states A=1, B=0, so that the polarization intensity of the functional layer is upward, and output a logic state C=0; and 4) input logic states A=1, B=1, so that the polarization intensity of the functional layer is upward, and output a logic state C=0.

Example 21

Figure 18A:
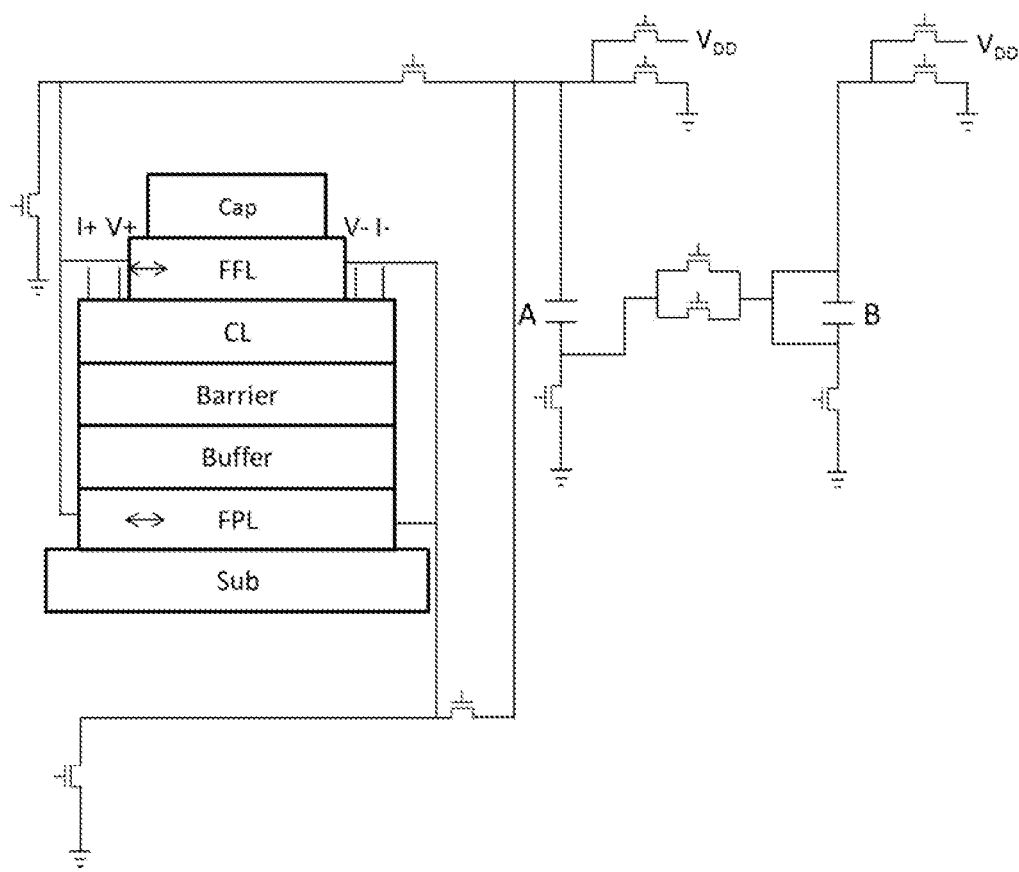
FIG. 18A is a schematic view showing a logic device based on Structure h in Scheme 4.

FIG. 18A is a schematic view showing a logic device based on Structure h in Scheme 4, and FIG. 18B is the corresponding truth table. Structure: a substrate/a functionally pinning layer/a buffer layer/a barrier layer/a conductive layer/a functionally free layer/a cap layer.

Wherein, the substrate is an insulating material; the functionally pinning layer is a ferroelectric or multi-ferric material, which can alter and regulate the intensity and the direction of polarization under the action of an electrical field; the buffer layer is a conductive material for reducing the roughness of the barrier layer; the barrier layer is an oxide; the conductive layer is a conductive inorganic or organic material; the functionally free layer is a ferroelectric or multiferroic material, which can alter and regulate the intensity and the direction of polarization under the action of an electrical field; the cap layer is a protective layer for preventing the oxidation of the structure.

Circuit Connection:

3. Four collinear point electrodes are obtained on the surface of the cap layer by such methods as UV exposure, argon ion etching, and post-deposition of metals: the resistance in a high resistance state is denoted by a logic output "1" (the polarization intensity of the functionally pinning layer is leftward, and the polarization intensity of the functionally free layer is leftward), and the resistance in a low resistance state is denoted by a logic output "0" (the polarization intensity of the functionally pinning layer is leftward, and the polarization intensity of the functionally free layer is rightward; the polarization intensity of the functionally pinning layer is rightward, and the polarization intensity of the functionally free layer is leftward; the polarization intensity of the functionally pinning layer is rightward, and the polarization intensity of the functionally free layer is rightward).

4. Two electrodes are respectively prepared on the left and right sides of each of the functionally pinning layer and the functionally free layer by such methods as UV exposure, argon ion etching, and post-deposition of metals and insulating materials, and two identical in-plane input electrical field intensities $E_A$ and $E_B$ are applied to the functionally pinning layer and the functionally free layer: both $E_A$ and $E_B$ are greater than the coercive field intensity of the functionally free layer but less than the coercive field intensity of the functionally pinning layer, and $E_A+E_B$ is greater than the coercive field intensity of the functionally pinning layer. $E_A, E_B > 0$ is denoted by a logic input "1", and $E_A, E_B < 0$ is denoted by a logic input "0".

NAND Logic (See FIG. 18B1 for the Truth Table)

1. Input logic states A=0, B=0, so that the polarization intensity of the functionally pinning layer is leftward and the polarization intensity of the functionally free layer is leftward, and set the initial output logic state C=1;

2. Rules for logical operation:

1) input logic states A=0, B=0, so that the polarization intensity of the functionally pinning layer is leftward and the polarization intensity of the functionally free layer is leftward, and output a logic state C=1;

2) input logic states A=0, B=1, so that the polarization intensity of the functionally pinning layer is leftward and the polarization intensity of the functionally free layer is leftward, and output a logic state C=1;

3) input logic states A=1, B=0, so that the polarization intensity of the functionally pinning layer is leftward and the polarization intensity of the functionally free layer is leftward, and output a logic state C=1; and 4) input logic states A=1, B=1, so that the polarization intensity of the functionally pinning layer is rightward and the polarization intensity of the functionally free layer is rightward, and output a logic state C=0.

NOR Logic (See FIG. 18B2 for the Truth Table)

1. Input logic states A=0, B=0, so that the polarization intensity of the functionally pinning layer is leftward and the polarization intensity of the functionally free layer is leftward; disconnect input B and input a logic state A=1, so that the polarization intensity of the functionally pinning layer is leftward and the polarization intensity of the functionally free layer is rightward, and set the initial output logic state C=0;

2. Rules for logical operation:

1) input logic states A=0, B=0, so that the polarization intensity of the functionally pinning layer is leftward and the polarization intensity of the functionally free layer is leftward, and output a logic state C=1;

2) input logic states A=0, B=1, so that the polarization intensity of the functionally pinning layer is leftward and the polarization intensity of the functionally free layer is rightward, and output a logic state C=0;

3) input logic states A=1, B=0, so that the polarization intensity of the functionally pinning layer is leftward and the polarization intensity of the functionally free layer is leftward, and output a logic state C=0; and 4) input logic states A=1, B=1, so that the polarization intensity of the functionally pinning layer is rightward and the polarization intensity of the functionally free layer is rightward, and output a logic state C=0.

NOR Logic (See FIG. 18B3 for the Truth Table)

1. Input logic states A=1, B=1, so that the polarization intensity of the functionally pinning layer is rightward and the polarization intensity of the functionally free layer is rightward; disconnect input B and input a logic state A=0, so that the polarization intensity of the functionally pinning layer is rightward and the polarization intensity of the functionally free layer is leftward, and set the initial output logic state C=0;

2. Rules for logical operation:

1) input logic states A=0, B=0, so that the polarization intensity of the functionally pinning layer is leftward and the polarization intensity of the functionally free layer is leftward, and output a logic state C=1;

2) input logic states A=0, B=1, so that the polarization intensity of the functionally pinning layer is rightward and the polarization intensity of the functionally free layer is leftward, and output a logic state C=0;

3) input logic states A=1, B=0, so that the polarization intensity of the functionally pinning layer is rightward and the polarization intensity of the functionally free layer is leftward, and output a logic state C=0; and 4) input logic states A=1, B=1, so that the polarization intensity of the functionally pinning layer is rightward and the polarization intensity of the functionally free layer is rightward, and output a logic state C=0.

NOR Logic (See FIG. 18B4 for the Truth Table)

1. Input logic states A=1, B=1, so that the polarization intensity of the functionally pinning layer is rightward and the polarization intensity of the functionally free layer is rightward, and set the initial output logic state C=0;

2. Rules for logical operation:

1) input logic states A=0, B=0, so that the polarization intensity of the functionally pinning layer is leftward and the polarization intensity of the functionally free layer is leftward, and output a logic state C=1;

2) input logic states A=0, B=1, so that the polarization intensity of the functionally pinning layer is rightward and the polarization intensity of the functionally free layer is rightward, and output a logic state C=0;

3) input logic states A=1, B=0, so that the polarization intensity of the functionally pinning layer is rightward and the polarization intensity of the functionally free layer is rightward, and output a logic state C=0; and 4) input logic states A=1, B=1, so that the polarization intensity of the functionally pinning layer is rightward and the polarization intensity of the functionally free layer is rightward, and output a logic state C=0.

Example 22

Figure 19A:
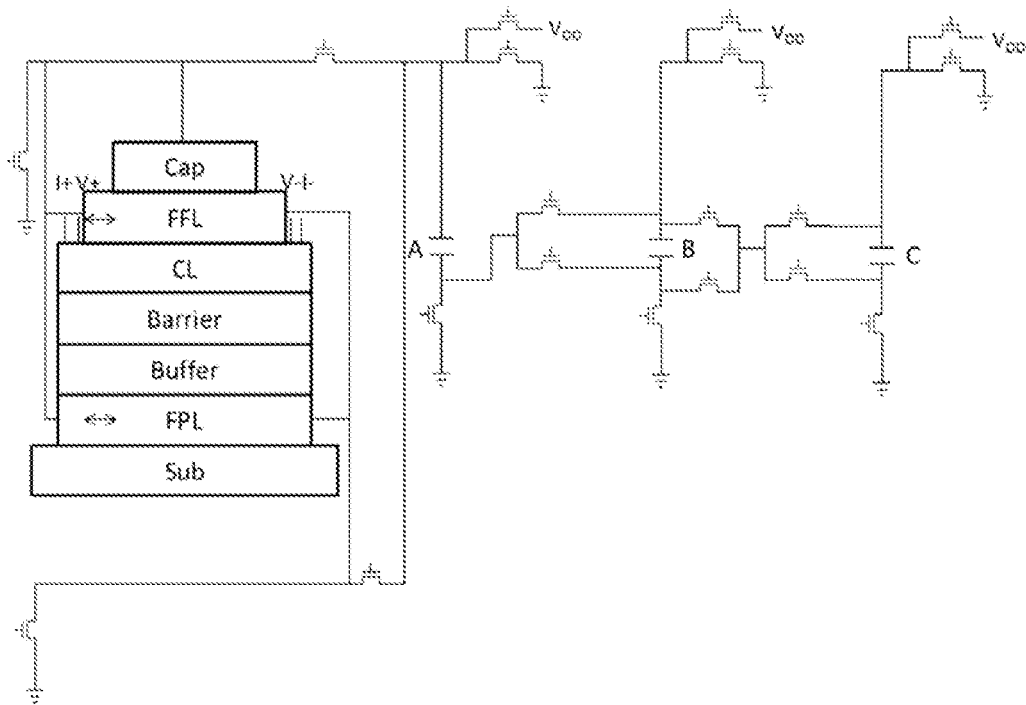
FIG. 19A is a schematic view showing a logic device based on Structure h in Scheme 4.

FIG. 19A is a schematic view showing a logic device based on Structure h in Scheme 4, and FIG. 19B is the corresponding truth table. Structure: a substrate/a functionally pinning layer/a buffer layer/a barrier layer/a conductive layer/a functionally free layer/a cap layer.

Wherein, the substrate is of an insulating material; the functionally pinning layer is of a ferroelectric or multi-ferric material, which can alter and regulate the intensity and the direction of polarization under the action of an electrical field; the buffer layer is of a conductive material for reducing the roughness of the barrier layer; the barrier layer is of an oxide; the conductive layer is of a conductive inorganic or organic material; the functionally free layer is of a ferroelectric or multi-ferric material, which can alter and regulate the intensity and the direction of polarization under the action of an electrical field; the cap layer is a protective layer for preventing the oxidation of the structure.

Circuit Connection:

1. Four collinear point electrodes are obtained on the surface of the cap layer by such methods as UV exposure, argon ion etching, and post-deposition of metals: the resistance in a high resistance state is denoted by a logic output "1" (the polarization intensity of the functionally pinning layer is leftward, and the polarization intensity of the functionally free layer is leftward), and the resistance in a low resistance state is denoted by a logic output "0" (the polarization intensity of the functionally pinning layer is leftward, and the polarization intensity of the functionally free layer is rightward; the polarization intensity of the functionally pinning layer is rightward, and the polarization intensity of the functionally free layer is leftward; the polarization intensity of the functionally pinning layer is rightward, and the polarization intensity of the functionally free layer is rightward).

2. Two electrodes are respectively prepared on the left and right sides of each of the functionally pinning layer and the functionally free layer by methods of UV exposure, argon ion etching, and post-deposition of metals and insulating materials, and three identical in-plane input electrical field intensities $E_A$, $E_B$ and $E_C$ are applied to the functionally pinning layer and the functionally free layer, wherein both $E_A$ and $E_B$ are smaller than the coercive field intensity of the functionally free layer, $E_A+E_B$ is greater than the coercive field intensity of the functionally free layer, $E_A+E_B$ is smaller than the coercive field intensity of the functionally pinning layer, and $E_A+E_B+E_C$ is greater than the coercive field intensity of the functionally pinning layer. $E_A$, $E_B$ and $E_C>0$ is denoted by a logic input "1", and $E_A$, $E_B$ and $E_C<0$ is denoted by a logic input "0". Wherein, $E_C$ denotes a control input.

NOR Logic (See FIG. 19B1 for the Truth Table)

1. Input logic states A=0, B=0, C=0, so that the polarization intensity of the functionally pinning layer is leftward and the polarization intensity of the functionally free layer is leftward; disconnect input C and input logic states A=1, B=1, so that the polarization intensity of the functionally pinning layer is leftward and the polarization intensity of the functionally free layer is rightward, and set the initial output logic state D=0;

2. Rules for logical operation:

1) input logic states A=0, B=0, C=0, so that the polarization intensity of the functionally pinning layer is leftward and the polarization intensity of the functionally free layer is leftward, and output a logic state D=1;

2) input logic states A=0, B=1, C=0, so that the polarization intensity of the functionally pinning layer is leftward and the polarization intensity of the functionally free layer is rightward, and output a logic state D=0;

3) input logic states A=1, B=0, C=0, so that the polarization intensity of the functionally pinning layer is leftward and the polarization intensity of the functionally free layer is rightward, and output a logic state D=0; and 4) input logic states A=1, B=1, C=0, so that the polarization intensity of the functionally pinning layer is leftward and the polarization intensity of the functionally free layer is rightward, and output a logic state D=0.

NOR Logic (See FIG. 19B2 for the Truth Table)

1. Input logic states A=1, B=1, C=1, so that the polarization intensity of the functionally pinning layer is rightward and the polarization intensity of the functionally free layer is rightward; disconnect input C and input logic states A=0, B=0, so that the polarization intensity of the functionally pinning layer is rightward and the polarization intensity of the functionally free layer is leftward, and set the initial output logic state D=0;

2. Rules for logical operation:

1) input logic states A=0, B=0, C=0, so that the polarization intensity of the functionally pinning layer is leftward and the polarization intensity of the functionally free layer is leftward, and output a logic state D=1;

2) input logic states A=0, B=1, C=0, so that the polarization intensity of the functionally pinning layer is rightward and the polarization intensity of the functionally free layer is leftward, and output a logic state D=0;

3) input logic states A=1, B=0, C=0, so that the polarization intensity of the functionally pinning layer is rightward and the polarization intensity of the functionally free layer is leftward, and output a logic state D=0; and 4) input logic states A=1, B=1, C=0, so that the polarization intensity of the functionally pinning layer is rightward and the polarization intensity of the functionally free layer is leftward, and output a logic state D=0.

NOR Logic (See FIG. 19B3 for the Truth Table)

1. Input logic states A=1, B=1, C=1, so that the polarization intensity of the functionally pinning layer is rightward and the polarization intensity of the functionally free layer is rightward, and set the initial output logic state D=0;

2. Rules for logical operation:

1) input logic states A=0, B=0, C=0, so that the polarization intensity of the functionally pinning layer is leftward and the polarization intensity of the functionally free layer is leftward, and output a logic state D=1;

2) input logic states A=0, B=1, C=0, so that the polarization intensity of the functionally pinning layer is rightward and the polarization intensity of the functionally free layer is rightward, and output a logic state D=0;

3) input logic states A=1, B=0, C=0, so that the polarization intensity of the functionally pinning layer is rightward and the polarization intensity of the functionally free layer is rightward, and output a logic state D=0; and 4) input logic states A=1, B=1, C=0, so that the polarization intensity of the functionally pinning layer is rightward and the polarization intensity of the functionally free layer is rightward, and output a logic state D=0.

NAND Logic (See FIG. 19B4 for the Truth Table)

1. Input logic states A=0, B=0, C=0, so that the polarization intensity of the functionally pinning layer is downward and the polarization intensity of the functionally free layer is downward, and set the initial output logic state D=1;

2. Rules for logical operation:

1) input logic states A=0, B=0, C=1, so that the polarization intensity of the functionally pinning layer is leftward and the polarization intensity of the functionally free layer is leftward, and output a logic state D=1;

2) input logic states A=0, B=1, C=1, so that the polarization intensity of the functionally pinning layer is leftward and the polarization intensity of the functionally free layer is leftward, and output a logic state D=1;

3) input logic states A=1, B=0, C=1, so that the polarization intensity of the functionally pinning layer is leftward and the polarization intensity of the functionally free layer is leftward, and output a logic state D=1; and 4) input logic states A=1, B=1, C=1, so that the polarization intensity of the functionally pinning layer is rightward and the polarization intensity of the functionally free layer is rightward, and output a logic state D=0.

NAND Logic (See FIG. 19B5 for the Truth Table)

1. Input logic states A=0, B=0, C=0, so that the polarization intensity of the functionally pinning layer is leftward and the polarization intensity of the functionally free layer is leftward, and set the initial output logic state D=1;

2. Rules for logical operation:

1) input logic states A=0, B=0, C OFF, so that the polarization intensity of the functionally pinning layer is leftward and the polarization intensity of the functionally free layer is leftward, and output a logic state D=1;

2) input logic states A=0, B=1, C OFF, so that the polarization intensity of the functionally pinning layer is leftward and the polarization intensity of the functionally free layer is leftward, and output a logic state D=1;

3) input logic states A=1, B=0, C OFF, so that the polarization intensity of the functionally pinning layer is leftward and the polarization intensity of the functionally free layer is leftward, and output a logic state D=1; and 4) input logic states A=1, B=1, C OFF, so that the polarization intensity of the functionally pinning layer is leftward and the polarization intensity of the functionally free layer is rightward, and output a logic state D=0.

NOR Logic (See FIG. 19B6 for the Truth Table)

1. Input logic states A=0, B=0, C=0, so that the polarization intensity of the functionally pinning layer is leftward and the polarization intensity of the functionally free layer is leftward; disconnect input C and input logic states A=1, B=1, so that the polarization intensity of the functionally pinning layer is leftward and the polarization intensity of the functionally free layer is rightward, and set the initial output logic state D=0;

2. Rules for logical operation:

1) input logic states A=0, B=0, C OFF, so that the polarization intensity of the functionally pinning layer is leftward and the polarization intensity of the functionally free layer is leftward, and output a logic state D=1;

2) input logic states A=0, B=1, C OFF, so that the polarization intensity of the functionally pinning layer is leftward and the polarization intensity of the functionally free layer is rightward, and output a logic state D=0;

3) input logic states A=1, B=0, C OFF, so that the polarization intensity of the functionally pinning layer is leftward and the polarization intensity of the functionally free layer is rightward, and output a logic state D=0; and 4) input logic states A=1, B=1, C OFF, so that the polarization intensity of the functionally pinning layer is leftward and the polarization intensity of the functionally free layer is rightward, and output a logic state D=0.

Example 23

Figure 20A:
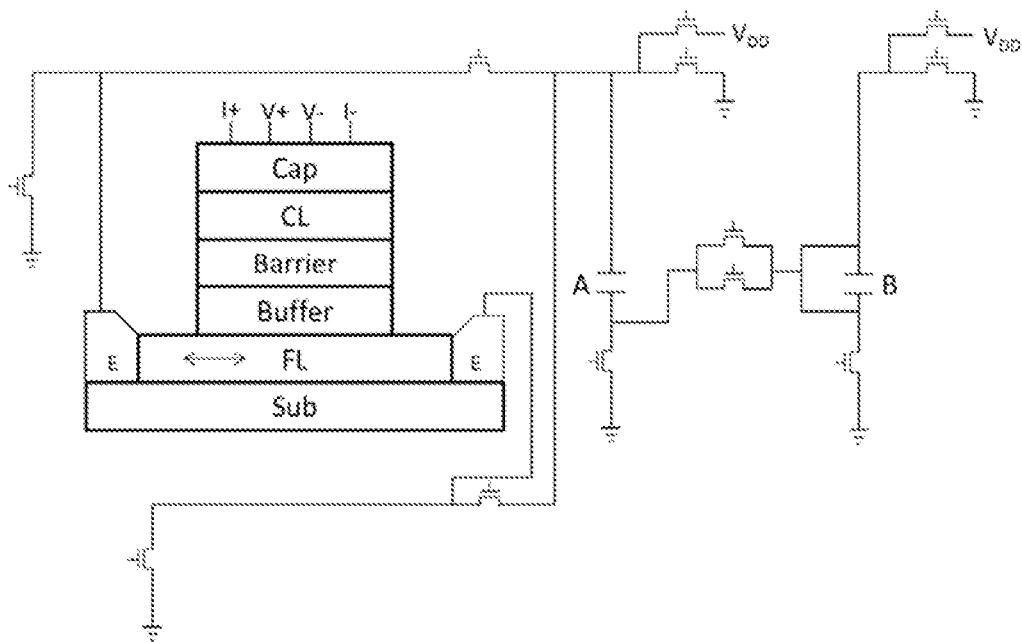
FIG. 20A is a schematic view showing a logic device based on Structure d in Scheme 4.

FIG. 20A is a schematic view showing a logic device based on Structure d in Scheme 4, and FIG. 20B is the corresponding truth table. Structure: a substrate/a functional layer/a buffer layer/a barrier layer/a conductive layer/a cap layer.

Wherein, the substrate is of an insulating material; the functional layer is of a ferroelectric or multi-ferric material, which can alter and regulate the intensity and the direction of polarization under the action of an electrical field; the buffer layer is of a conductive material for reducing the roughness of the barrier layer; the barrier layer is of an oxide; the conductive layer is of a conductive inorganic or organic material; the cap layer is a protective layer for preventing the oxidation of the magnetic layer.

Circuit Connection:

1. Four point-contact electrodes are fabricated on the cap layer by a collinearly method: the resistance in a high resistance state is denoted by a logic output "1" (the polarization intensity of the functional layer is leftward), and the resistance in a low resistance state is denoted by a logic output "0" (the polarization intensity of the functional layer is rightward).

2. Two electrodes are respectively prepared on the left and right sides of the functional layer by such methods as UV exposure, argon ion etching, and post-deposition of metals and insulating materials, and two identical in-plane input electrical field intensities $E_A$ and $E_B$ are applied to the functional layer: both $E_A$ and $E_n$ are less than the coercive field intensity of the functional layer, and $E_A+E_B$ is greater than the coercive field intensity of the functional layer. $E_A$, $E_B>0$ is denoted by a logic input "1", and $E_A$, $E_B<0$ is denoted by a logic input "0".

NAND Logic (See FIG. 20B1 for the Truth Table)

1. Input logic states A=0, B=0, so that the polarization intensity of the functional layer is leftward, and set the initial output logic state C=1;

2. Rules for logical operation:

1) input logic states A=0, B=0, so that the polarization intensity of the functional layer is leftward, and output a logic state C=1;

2) input logic states A=0, B=1, so that the polarization intensity of the functional layer is leftward, and output a logic state C=1;

3) input logic states A=1, B=0, so that the polarization intensity of the functional layer is leftward, and output a logic state C=1; and 4) input logic states A=1, B=1, so that the polarization intensity of the functional layer is rightward, and output a logic state C=0.

NOR Logic (See FIG. 20B2 for the Truth Table)

1. Input logic states A=1, B=1, so that the polarization intensity of the functional layer is rightward, and set the initial output logic state C=0;

2. Rules for logical operation:

1) input logic states A=0, B=0, so that the polarization intensity of the functional layer is leftward, and output a logic state C=1;

2) input logic states A=0, B=1, so that the polarization intensity of the functional layer is rightward, and output a logic state C=0;

3) input logic states A=1, B=0, so that the polarization intensity of the functional layer is rightward, and output a logic state C=0; and 4) input logic states A=1, B=1, so that the polarization intensity of the functional layer is rightward, and output a logic state C=0.

INDUSTRIAL APPLICABILITY

In the present invention, an electrical field is applied between the bottom layer and the buffer layer (the upper and lower electrodes) (since the changes in the intensity and the direction of electrical polarization of the substrate (a ferroelectric or multi-ferric material) influence and change the in-plane conductivity between the neighboring conductive layers, different resistance states corresponding to different electrical fields can be obtained), thereby achieving a reversible ER effect.

Of course, the present invention may have a variety of other embodiments. Those skilled in the art can make all kinds of corresponding changes and modifications according to the present invention without departing from the spirit and essence of the present invention. It is intended that all these changes and modifications be covered by the appended claims of the present invention.

The invention claimed is:

1. A nano multilayer film of electrical field modulation type, characterized by comprising in succession from bottom to top: a bottom layer; a substrate; a buffer layer; an insulating barrier layer; a conductive layer; and a cap layer, wherein the bottom layer is of a conductive material and, as a lower electrode, is used for applying an electrical field onto the substrate; the substrate is of a ferroelectric or multi-ferric material which can alter and regulate the intensity and the direction of electrical polarization under the action of an electrical field; the buffer layer, as an upper electrode, is used for applying an electrical field onto the ferroelectric material or the multi-ferric material, and is a non-magnetic metal layer; the insulating barrier layer is of an oxide; the cap layer, as a protective layer, prevents the oxidation of the conductive layer; by applying an electrical field between the bottom layer and the buffer layer, the intensity and the direction of electrical polarization of the substrate change, which influences and changes an in-plane conductivity of the conductive layer, so that different resistance states corresponding to different electrical fields can be obtained, thereby achieving a reversible ER effect.

2. The nano multilayer film of electrical field modulation type according to claim 1, characterized in that the conductive layer is a non-magnetic metal layer, a magnetic metal layer, or an antiferromagnetic layer, or is one of a conductive polymer material, a topological insulator material, and a conductive semiconductor doped material.

3. The nano multilayer film of electrical field modulation type according to claim 2, characterized in that the non-magnetic metal layer comprises a non-magnetic metal or a non-magnetic alloy, with a thickness of 2 to 100 nm, and the magnetic metal layer of the nano multilayer film is made of a magnetic metal or a magnetic alloy, with a thickness of 2 to 100 nm, or made of a diluted magnetic semiconductor material or a semi-metallic material, with a thickness of 2 to 100 nm, the magnetic metal layer comprises a directly or indirectly pinning structure, wherein the directly pinning structure comprises an antiferromagnetic/ferromagnetic layer, and wherein the indirectly pinning structure comprises an antiferromagnetic layer/a first ferromagnetic layer/a non-magnetic metal layer/a second ferromagnetic layer.

4. A nano multilayer film of electrical field modulation type, characterized by comprising in succession from bottom to top: a substrate; a bottom layer; a functional layer; a buffer layer; an insulating barrier layer; a conductive layer; and a cap layer, wherein the bottom layer is of a conductive material and, as a lower electrode, is used for applying an electrical field onto the functional layer; the functional layer is a ferroelectric thin film or a multi-ferric thin film which can alter and regulate the intensity and the direction of electrical polarization under the action of an electrical field; the buffer layer, as an upper electrode, is used for applying an electrical field onto the material of the ferroelectric thin film or the multi-ferric thin film, and is a non-magnetic metal layer; the insulating barrier layer is of an oxide; the cap layer, as a protective layer, prevents the oxidation of the conductive layer; by applying an electrical field between the bottom layer and the buffer layer, the intensity and the direction of electrical polarization of the functional layer change, which influences and changes an in-plane conductivity of the conductive layer, so that different resistance states corresponding to different electrical fields can be obtained, thereby achieving a reversible ER effect.

5. The nano multilayer film of electrical field modulation type according to claim 4, characterized in that the functional layer comprises a ferroelectric nanofilm or a multi-ferric nanofilm.

6. The nano multilayer film of electrical field modulation type according to claim 4, characterized in that the conductive layer is disposed on the insulating barrier layer, and its conductivity can be regulated by the intensity and the direction of electrical polarization of the ferroelectric or multi-ferric thin film in the bottom via electrical polarization interaction or magnetoelectric coupling.

7. A nano multilayer film of electrical field modulation type, characterized by comprising in succession from bottom to top: a substrate; a bottom layer; a functional layer; a buffer layer; an insulating barrier layer; a magnetic layer; and a cap layer, wherein the substrate is one of a non-ferroelectric material and a multi-ferric material; the bottom layer is of a conductive material and, as a lower electrode, is used for applying an electrical field onto the functional layer; the functional layer is a ferroelectric thin film or a multi-ferric thin film which can alter and regulate the intensity and the direction of electrical polarization under the action of an electrical field; the cap layer, as an upper electrode and a protective layer, prevents the oxidation of the magnetic layer; the buffer layer is a non-magnetic metal layer; the insulating barrier layer is of an oxide; by applying an electrical field between the bottom layer and the cap layer, the intensity and the direction of electrical polarization of the functional layer change, which influences and changes the in-plane conductivity of the magnetic layer, so that different resistance states corresponding to different electrical fields can be obtained, thereby achieving a reversible ER effect.

8. The nano multilayer film of electrical field modulation type according to claim 7, characterized in that the functional layer of the nano multilayer film comprises a ferroelectric or multi-ferric nanofilm.

9. The nano multilayer film of electrical field modulation type according to claim 7, characterized in that the magnetic layer is disposed on the material of the functional layer, and its conductivity can be regulated by the intensity and the direction of electrical polarization of the ferroelectric or the multi-ferric thin film in the bottom via electrical polarization interaction or magnetoelectric coupling.

10. The nano multilayer film of electrical field modulation type according to claim 7, characterized in that the magnetic layer is made of a ferromagnetic metal or a ferromagnetic alloy, with a thickness of 2 to 100 nm, or made of a diluted magnetic semiconductor material or a semi-metallic material, with a thickness of 2 to 100 nm.

11. A logic device based on a nano multilayer film having banter symmetrical double functional layers, characterized in that NAND Logic and NOR logic can be achieved by setting an initial output logic state using the nano multilayer film according to any one of claims 1, 4 and 7.

12. An electrical field sensor of switch type based on electroresistance effect, characterized by comprising the nano multilayer film of electrical field modulation type according to any one of claims 1, 4 and 7.

13. A random access memory of electrical field drive type based on electroresistance effect comprising a nanodevice of electrical field modulation type as the memory cell, characterized by comprising the nano multilayer film of electrical field modulation type according to any one of claims 1, 4 and 7.

* * * * *